(12) United States Patent
Sasaki

(10) Patent No.: US 7,554,649 B2
(45) Date of Patent: Jun. 30, 2009

(54) PROJECTION OPTICAL SYSTEM, EXPOSURE APPARATUS AND DEVICE FABRICATING METHOD

(75) Inventor: Takahiro Sasaki, Tochigi (JP)

(73) Assignee: Canon Kabushiki Kaisha (JP)

( * ) Notice: Subject to any disclaimer, the term of this patent is extended or adjusted under 35 U.S.C. 154(b) by 527 days.

(21) Appl. No.: 11/366,354

(22) Filed: Mar. 1, 2006

(65) Prior Publication Data

US 2006/0198039 A1   Sep. 7, 2006

Related U.S. Application Data

(63) Continuation-in-part of application No. 10/933,070, filed on Sep. 2, 2004, now Pat. No. 7,382,437.

(30) Foreign Application Priority Data

| Sep. 2, 2003 | (JP) | ............................. 2003-310118 |
| Mar. 1, 2005 | (JP) | ............................. 2005-056702 |
| Mar. 1, 2005 | (JP) | ............................. 2005-056703 |

(51) Int. Cl.
*G03B 27/54* (2006.01)
*G03B 27/42* (2006.01)

(52) U.S. Cl. .......................................... 355/67; 355/53

(58) Field of Classification Search ................. 355/52, 355/53, 55, 67–71; 359/857–859, 364–366
See application file for complete search history.

(56) References Cited

U.S. PATENT DOCUMENTS

| 5,686,728 | A | 11/1997 | Shafer |
| 6,033,079 | A * | 3/2000 | Hudyma ...................... 359/857 |
| 6,172,825 | B1 | 1/2001 | Takahashi .................... 359/859 |
| 6,985,210 | B2 * | 1/2006 | Hudyma et al. ............... 355/67 |
| 7,151,592 | B2 * | 12/2006 | Hudyma et al. ............... 355/67 |
| 7,232,233 | B2 * | 6/2007 | Suzuki et al. ................ 359/859 |
| 7,382,437 | B2 * | 6/2008 | Sasaki .......................... 355/67 |
| 2003/0076483 | A1 | 4/2003 | Komatsuda ................... 355/67 |
| 2003/0147131 | A1 | 8/2003 | Terasawa |

FOREIGN PATENT DOCUMENTS

| EP | 0 779 528 | 6/1997 |
| JP | 2001-185480 | 7/2001 |
| JP | 2002-006221 | 1/2002 |
| WO | WO 02/48796 | 6/2002 |
| WO | WO 03/005097 | 1/2003 |

* cited by examiner

*Primary Examiner*—Hung Henry Nguyen
(74) *Attorney, Agent, or Firm*—Rossi, Kimms & McDowell, LLP

(57) ABSTRACT

There is provided a projection optical system for projecting a pattern on an object surface onto an image surface in a reduced size. The projection optical system includes six reflective surfaces that includes, in order of reflecting light from the object surface, a first reflective surface, a second convex reflective surface, a third convex reflective surface, a fourth reflective surface, a fifth reflective surface and a sixth reflective surface, and an aperture stop along an optical path between the first and second reflective surfaces.

19 Claims, 19 Drawing Sheets

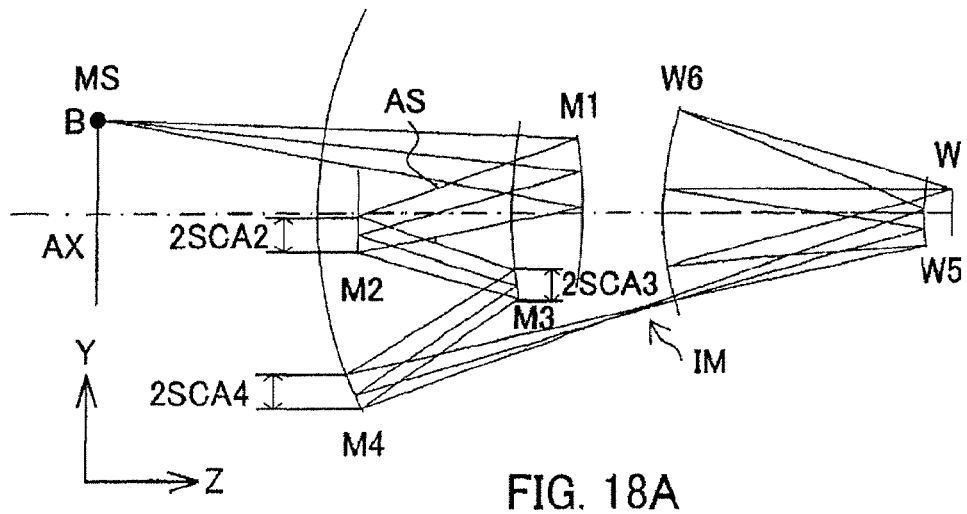
FIG. 18A
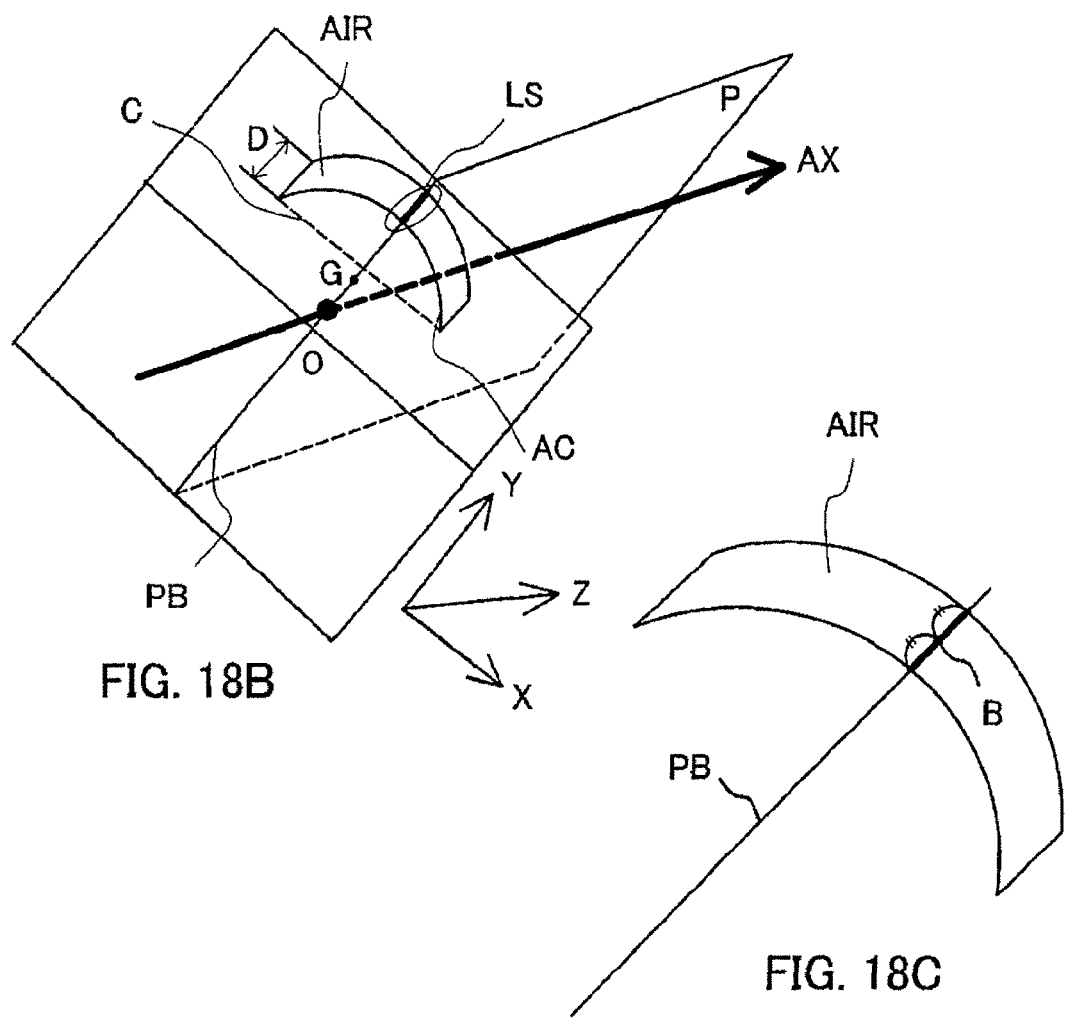
FIG. 18B
FIG. 18C

US 7,554,649 B2

PROJECTION OPTICAL SYSTEM, EXPOSURE APPARATUS AND DEVICE FABRICATING METHOD

This is a Continuation-In-Part of application Ser. No. 10/933,070, filed Sep. 2, 2004 which is now U.S. Pat. No. 7,382,437.

BACKGROUND OF THE INVENTION

The present invention relates generally to exposure apparatuses, and more particularly to a catoptric projection optical system, an exposure apparatus, and a device fabricating method using the same. The catoptric projection optical system use ultraviolet ("UV") and extreme ultraviolet ("EUV") light to project and expose an object, such as a single crystal substrate for a semiconductor wafer, and a glass plate for a liquid crystal display ("LCD").

Along with recent demands for smaller and lower profile electronic devices, finer semiconductor devices to be mounted onto these electronic devices have been increasingly demanded. For example, the design rule for mask patterns has required that an image with a size of a line and space ("L & S") of less than 0 μm be extensively formed and it is expected to require circuit patterns of less than 80 nm in the near future. The L & S denotes an image projected onto a wafer in exposure with equal line and space widths, and serves as an index of exposure resolution.

A projection exposure apparatus as a typical exposure apparatus for fabricating semiconductor devices includes a projection optical system for projecting and exposing a pattern on a mask or a reticle (these terms are used interchangeably in the present application), onto a wafer. The resolution R of the projection exposure apparatus (i.e. a minimum size for a precise image transfer) can be defined using a light-source wavelength λ and the numerical aperture ("NA") of the projection optical system as in the following Equation:

$$R = k_1 \times \frac{\lambda}{NA}$$

As the shorter the wavelength becomes and the higher the NA increases, the better the resolution becomes. The recent trend has required that the resolution be a smaller value; however it is difficult to meet this requirement using only the increased NA, and the improved resolution expects use of a shortened wavelength. Exposure light sources have currently been in transition from KrF excimer laser (with a wavelength of approximately 248 nm) and ArF excimer laser (with a wavelength of approximately 193 nm) to $F_2$ excimer laser (with a wavelength of approximately 157 nm). Practical use of the EUV light is being promoted as a light source.

As a shorter wavelength of light limits usable glass materials for transmitting the light, it is advantageous for the projection optical system to use reflection elements, i.e., mirrors instead of using many refraction elements, i.e., lenses. No applicable glass materials have been proposed for the EUV light as exposure light, and a projection optical system could not include any lenses. It has thus been proposed to form a catoptric reduction projection optical system only with mirrors.

A mirror in a catoptric reduction projection optical system forms a multilayer coating to enhance reflected light and increase reflectance, but the smaller number of mirrors is desirable to increase reflectance of the entire optical system.

In addition, the projection optical system preferably uses the even number of mirrors to avoid mechanical interference between the mask and the wafer by arranging the mask and the wafer at opposite sides with respect to a pupil. A smaller critical dimension (or resolution) for the EUV exposure apparatus than a conventional one requires a large NA (e.g., NA of 0.2 for a wavelength of 13.5 nm), while it is hard for the conventional 3 to 4 mirrors to decrease the wave aberration. For the increased degree of freedom in correcting the wave aberration, the increased number of mirrors is needed as well as making the mirrors aspheric. As a result, the projection optical system comes to require so many as six mirrors (while the instant application calls such an optical system a six-mirror system). Such six-mirror systems are disclosed, for example, in U.S. Pat. No. 6,033,079 and WO 02/48796.

U.S. Pat. No. 6,033,079 discloses two typical six-mirror catoptric, EUV projection optical systems in its embodiments. These projection optical systems receive light from an object surface, form an intermediate image via four mirrors, i.e., a concave first reflective surface, a concave or convex second reflective surface, a convex third reflective surface, and a concave fourth reflective surface, and re-form the intermediate image on an image surface via a convex fifth reflective surface and a concave sixth reflective surface. Both of these two embodiments arrange an aperture stop on the second reflective surface.

International Patent Publication No. WO 02/48796 discloses three typical six-mirror catoptric, EUV projection optical systems in its embodiments. These projection optical systems receive light from an object surface, form an intermediate image via a concave first reflective surface and a concave second reflective surface, and re-form the intermediate image on an image surface via a convex third reflective surface, a concave fourth reflective surface, a convex fifth reflective surface and a concave sixth reflective surface. Each of these three embodiments provides an aperture stop between the first and second reflective surfaces along the optical axis.

Other prior art that disclose similar optical systems include Japanese Patent Applications, Publication Nos. 2003-15040, 2001-185480, 2002-6221, U.S. Patent Application, Publication No. 2003/0076483, and U.S. Pat. No. 6,172,825.

However, the configurations disclosed in U.S. Pat. No. 6,033,079 are disadvantageous, because the aperture stop is located on the second reflective surface and causes an increased effective diameter of the fourth reflective surface. More specifically, the EUV projection optical system applies a multilayer coating on a mirror surface so as to increase the reflectance, and the reduced incident angle of a ray, i.e., an angle between the ray and a normal of the reflective surface, is suitable for characteristics of the multilayer coating. Since the EUV projection optical system increases an effective diameter of the sixth reflective surface in order to increase the NA and improve the resolution, the fourth reflective surface should be located apart from the optical axis in order to prevent light shielding. Since the embodiments in U.S. Pat. No. 6,033,079 arrange the aperture stop on the second reflective surface, only the third reflective surface introduces the light to the fourth reflective surface apart from the optical axis. In order to reduce the incident angle as discussed, a distance between the third and fourth reflective surfaces should be made large. Because of this large distance, a distance between the object and the fourth reflective surfaces becomes small, so it is hard to make a space for placing a mirror or something. And this increases the light's divergence onto the fourth reflective surface, requires the extremely large maximum effective diameter of 700 mm, and causes a system whose accuracy of finishing is hard to measure.

The configurations described in WO 02/48796 use a concave shape for both the first and second reflective surfaces, and tend to condense the light on a surface close to the object surface. Therefore, the intermediate image is formed near the third reflective surface, and the divergence on the third reflective surface. Then disadvantageously, ripples on a mirror surface, which are formed during a processing operation and air bubbles in the mirror material directly deteriorate imaging performance. In addition, the temperature rise in the reflective surface due to the energy concentration deforms the mirror shape, and dust on the mirror surface is transferred onto the wafer. Moreover, while the second and third reflective surfaces introduce the light into the fourth reflective surface apart from the optical axis from the aperture stop, the light from the second reflective surface to the third reflective surface approaches to the optical axis due to the concave shape of the second reflective surface and is hard to introduce into the fourth reflective surface apart from the optical axis. To solve the problem, the distance between the first and the second reflective surfaces should be made large, so the distance between the object surface and the second surface becomes small. Therefore it is hard to make a space for placing a mirror or something.

BRIEF SUMMARY OF THE INVENTION

A projection optical system according to one aspect of the present invention for projecting a pattern on an object surface onto an image surface in a reduced size includes six reflective surfaces that include, in order of reflecting light from the object surface, a first reflective surface, a second convex reflective surface, a third convex reflective surface, a fourth reflective surface, a fifth reflective surface and a sixth reflective surface, and an aperture stop along an optical path between the first and second reflective surfaces.

A projection optical system according to another aspect of the present invention for projecting a pattern on an object surface onto an image surface in a reduced size, said projection optical system includes six reflective surfaces that include, in order of reflecting light from the object surface, a first reflective surface, a second reflective surface, a third reflective surface, a fourth reflective surface, a fifth reflective surface and a sixth reflective surface, wherein intersecting points formed between a principal ray from an object point in a center of an arc illuminated area on the object surface and the first to the fourth reflective surface are respectively defined as a first intersecting point to a fourth intersecting point, in a predetermined plane, wherein said predetermined plane is a plane that includes the center of the air illuminated area and an optical axis, wherein a value of maximum value/minimum value is 2.2 or less among La1 to La4, where La1 is a distance between a projected image of the object point to the predetermined plane and a projected image of the first intersecting point to the predetermined plane, La2 is a distance between the projected image of the first intersecting point to the predetermined plane and a projected image of the second intersecting point to the predetermined plane, La3 is a distance between the projected image of the second intersecting point to the predetermined plane and a projected image of the third intersecting point to the predetermined plane and La4 is a distance between the projected image of the third intersecting point to the predetermined plan and a projected image of the fourth intersecting point to the predetermined plane, and wherein a surface apex is defined as one of intersecting points formed between the optical axis and an approximately spherical surface, which one is closest to a reflection point of the light, the approximately spherical surface having a center that is defined as a center of curvature of the first to the fourth reflective surface, and a radius that is defined as a radius of curvature of the first to the first to the fourth reflective surface, a value of maximum value/minimum value is 2.0 or less among Lb1 to Lb3, where Lb1 is an interval between the surface apex of the first reflective surface and the surface apex of the second reflective surface, Lb2 is an interval between the surface apex of the second reflective surface and the surface apex of the third reflective surface and Lb3 is an interval between the surface apex of the third reflective surface and the surface apex of the fourth reflective surface.

A projection optical system according to another aspect of the present invention for projecting a pattern on an object surface onto an image surface in a reduced size, said projection optical system includes six reflective surfaces that include, in order of reflecting light from the object surface, a first reflective surface, a second reflective surface, a third reflective surface, a fourth reflective surface, a fifth reflective surface and a sixth reflective surface, and an aperture stop along an optical path between the first reflective surface and the second reflective surface, wherein $0.52 < |r2/TT|$ and $0.25 < |r3/TT| < 0.35$, where TT is an object-image distance, r2 is a paraxial radius of curvature of the second reflective surface and r3 is a paraxial radius of curvature of the third reflective surface.

A projection optical system according to another aspect of the present invention having a numerical aperture NA of 0.23 or more at an image side, said projection optical system for projecting a pattern on an object surface onto an image surface in reduced size, said projection optical system includes six reflective surface that includes, in order of reflecting light from the object surface, a first reflective surface, a second reflective surface, a third reflective surface, a fourth reflective surface, a fifth reflective surface and a sixth reflective surface, and an aperture stop along an optical path between the first reflective surface and the second reflective surface, wherein Rsto/NA<135 mm, where Rsto is a radius of the aperture stop.

A projection optical system according to another aspect of the present invention for projecting a pattern on an object surface onto an image surface in a reduced size, said projection optical system includes six reflective surfaces that include, in order of reflecting light from the object surface, a first reflective surface, a second reflective surface, a third reflective surface, a fourth reflective surface, a fifth reflective surface and a sixth reflective surface, and an aperture stop along an optical path between the first reflective surface and the second reflective surface, wherein a spread radius SCA/NA is equal to or larger than 70 mm and is equal to or smaller than 105 mm, where SCA is a half of a length in a direction along a perpendicular bisector of an area, which a light from a center object point of the arc illuminated area on the object surface illuminates the second, third and fourth reflective surface, and NA is a numerical aperture at an image side, wherein said predetermined plane is a plane that includes the center of the arc illuminated area and an optical axis.

An exposure apparatus according to another aspect of the present invention includes an illumination optical system for illuminating a pattern on an object surface using light from a light source, and the above projection optical system for projecting the pattern on the object surface onto an image surface in a reduced size.

A device fabricating method according to still another aspect of the present invention includes the steps of exposing an object to be exposed using the above exposure apparatus, and developing the exposed object.

BRIEF DESCRIPTION OF THE DRAWINGS

FIG. 18A is an optical-path diagram of an inventive projection optical system, FIG. 18B is a schematic perspective view for explaining an arc illuminated area on an object surface, and FIG. 18C is an enlarged plane view of an arc illuminated area.

DETAILED DESCRIPTION OF THE PREFERRED EMBODIMENTS

Figure 1:
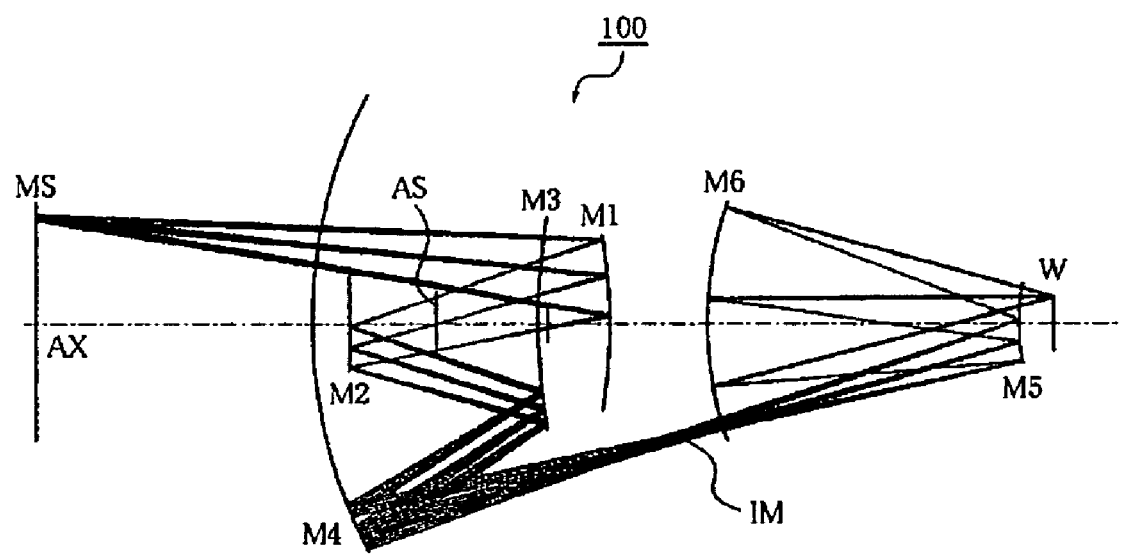
FIG. 1 is a view according to a first embodiment of the present invention.

A projection optical system of for projecting a pattern on an object surface onto an image surface in a reduced size includes six reflective surfaces that includes, in order of reflecting light from the object surface, a first reflective surface, a second convex reflective surface, a third convex reflective surface, a fourth surface, a fifth reflective surface and a sixth reflective surface, and arranges an aperture stop along an optical path between the first and second reflective surfaces. It is preferable that the first reflective surface has a concave shape. It is also preferable that the fourth reflective surface has a concave shape. It is also preferable that an intermediate image is formed along the optical path from the fourth reflective surface to the fifth reflective surfaces.

Preferably, $25°<\theta_{max}+\Delta\theta<35°$ is met, where $\theta_{max}$ is a maximum incident angle on one of the six reflective surfaces, which one has the largest maximum value of a light incident angle, and $\Delta\theta$ is an incident angle distribution width on one of the six reflective surfaces, which one has the largest maximum value of a light incident angle. More preferably, $28°<\theta_{max}+\Delta\theta$ and/or $\theta_{max}+\Delta\theta<32°$ or $\theta_{max}+\Delta\theta<30°$ are met.

Moreover, the six reflective surfaces are arranged so that radii of curvature of these six reflective surfaces are substantially aligned with a certain optical axis. Suppose that a surface apex is defined, with respect to each of the six reflective surfaces, as one of intersecting points between an optical axis and an approximately spherical surface, which one is closest to a reflection point of the light on each of the six reflective surfaces. The approximately spherical surface has a center that is defined as a center of curvature of each of the six reflective surfaces, and a radius that is defined as a radius of curvature of each of the six reflective surfaces. It is preferable that the following condition is met, where L1 is an interval between the object surface (which, as used herein, means a surface on which the object is located) and the surface apex that is the closest to the object surface (although L1 is more specifically is a distance between a intersecting point between the object surface and the optical axis and the surface apex that is the closest to the object surface), and L2 is an interval between the surface apex of the first reflective surface and the surface apex that is the closest to the object surface:

$$0.87 < \frac{L1}{L2} < 0.97$$

It is also preferable that none of the six reflective surfaces have an area that allows the light to pass through, absorbs the light or transmits the light, in their light incident areas. Preferably, an optical path from the second reflective surface to the third reflective surface does not intersect with an optical path from the fourth reflective surface to the fifth reflective surface. Preferably, the six reflective surfaces are arranged so that radii of curvature of these six reflective surfaces are substantially aligned with a certain optical axis.

Preferably, there is an extreme of a maximum incident angle at each point on a nodal line in a region between Lmin+0.3×(Lmax−Lmin) and Lmax on the nodal line, the nodal line being formed between a light incident area upon which the light from an arc illuminated area on the object surface is incident, and a plane that includes a center point of a chord of the arc illuminated area shape on the object surface and an optical axis, the light incident area being located on one of the six reflective surfaces, which one has the largest maximum value of a light incident angle, where Lmin is a minimum distance from the optical axis to each point on the nodal line, and Lmax is a maximum distance from the optical axis to each point on the nodal line. It is preferable that the maximum incident angle at each point has an extreme value on the nodal line in a region between (Lmin+Lmin)/2±0.2×(Lmax−Lmin) on the nodal line.

It is preferable that the third reflective surface is one of the six reflective surfaces, which one has the maximum light incident angle.

It is preferable that one of the six reflective surfaces, which one has the largest maximum value of a light incident angle, has a convex shape for receiving convergent light and reflects divergent light.

Preferably, a difference is 30 mm or longer, more preferably 40 mm or longer, between a maximum distance and a minimum distance between an optical axis and a light incident area on the fourth reflective surface, upon which light emitted from a center of a nodal line is incident. The nodal line is formed between a plane that includes a center of an arc-shaped illuminated area (i.e., a center of gravity) on the object surface and the optical axis, and the illuminated area.

If it is assumed that a surface apex is defined, with respect to each of the six reflective surfaces, as one of intersecting points between an optical axis and an approximately spherical surface, which one is closest to a reflection point of the light on each of the six reflective surfaces. In addition, the approximately spherical surface has a center that is defined as a center of curvature of each of the six reflective surfaces (which means a center of curvature of the reflective surface when the reflective surface is a spherical surface and a center of curvature of a spherical surface after the aspheric component is removed from the reflective surface if the reflective surface is an aspheric surface), and as a radius that is defined as a radius of curvature of each of the six reflective surfaces (which means a radius of curvature of a spherical surface after the aspheric component is removed from each reflective surface if each reflective surface is an aspheric surface). Then preferably, the surface apexes of the six reflective surfaces are arranged in order of the fourth reflective surface, the second reflective surface, the third reflective surface, the first reflective surface, the sixth reflective surface and the fifth reflective surface in order from the object surface to the image surface along an optical axis.

Preferably, a surface apex is defined, with respect to each of the six reflective surfaces, as one of intersecting points between an optical axis and an approximately spherical surface, which one is closest to a reflection point of the light on each of the six reflective surfaces, the approximately spherical surface having a center that is defined a center of curvature of each of the six reflective surfaces, and a radius that is defined as a radius of curvature of each of the six reflective surfaces, wherein a distance is 250 mm or longer, more preferably 310 mm or longer, between the object surface and one of the surface apexes of the six reflective surfaces, which one is the closest to the object surface.

Preferably, a surface apex is defined, with respect to each of the six reflective surfaces, as one of intersecting points between an optical axis and an approximately spherical surface, which one is closest to a reflection point of the light on each of the six reflective surfaces, a distance along the optical axis between the surface apex of the second reflective surface and the surface apex of the fourth reflective surface is 5 mm or longer, preferably 10 mm or longer, more preferably 15 mm or longer.

Preferably, a surface apex is defined, with respect to each of the six reflective surfaces, as one of intersecting points between an optical axis and an approximately spherical surface, which one is closest to a reflection point of the light on each of the six reflective surfaces, the approximately spherical surface having a center that is defined as a center of curvature of each of the six reflective surfaces, and a radius that is defined as a radius of curvature of each of the six reflective surfaces, wherein $La11/200<L24<La11/10$, more preferably, $La11/100<L24$ and/or $L24<La11/18$, are met, where $L24$ is an interval between the surface apex of the second reflective surface and the surface apex of the fourth reflective surface, and $La11$ is a distance between the object surface and the image surface along the optical axis.

Preferably, a surface apex is defined, with respect to each of the six reflective surfaces, as one of intersecting points between an optical axis and an approximately spherical surface, which one is closest to a reflection point of the light on each of the six reflective surfaces, the approximately spherical surface having a center that is defined as a center of curvature of each of the six reflective surfaces, and a radius that is defined as a radius of curvature of each of the six reflective surfaces, wherein an interval between the surface apex of the sixth reflective surface and the closest surface apex of the sixth reflective surface along the optical axis is 100 mm or longer. Preferably, the interval between the surface apex of the six reflective surface and the closest surface apex of the reflective surface along the optical axis is 110 mm or longer, more preferably, 115 mm or longer.

Preferably, a surface apex is defined, with respect to each of the six reflective surfaces, as one of intersecting points between an optical axis and an approximately spherical surface, which one is closest to a reflection point of the light on each of the six reflective surfaces, the approximately spherical surface having a center that is defined as a center of curvature of each of the six reflective surfaces, and a radius that is defined as a radius of curvature of each of the six reflective surfaces, wherein $La11/20<L6<La11/6$, more preferably, $La11/12<L6$ and/or $L6<La11/9$, are met, where $L6$ is an interval between the surface apex of the sixth reflective surface and the surface apex of the reflective surface that is closest to the sixth reflective surface, and $La11$ is a distance between the object surface and the image surface along the optical axis.

Preferably, a surface apex is defined, with respect to each of the six reflective surfaces, as one of intersecting points between an optical axis and an approximately spherical surface, which one is closest to a reflection point of the light on each of the six reflective surfaces, the approximately spherical surface having a center a center of curvature of each of the six reflective surfaces, and a radius that is defined as a radius of curvature of each of the six reflective surfaces, wherein the surface apex of the third reflective surface is located closer to the object surface than the surface apex of the sixth reflective surface.

Preferably, the third reflective surface is located closer to the object surface along the optical path than the sixth reflective surface.

Preferably, an absolute value of a radius of curvature of the second reflective surface is 1800 mm or smaller, more preferably 1600 mm or smaller.

Preferably, an intermediate image of the pattern is formed at a position that accords with none of the six reflective surfaces.

Preferably, an intermediate image of the pattern on the object surface is formed between two adjacent reflective surfaces along the optical path of the light among the six reflective surfaces, and located apart from each of the two adjacent reflective surfaces by Lim×0.35 or greater, more preferably, Lim×0.4 or greater, where Lim is an optical path length between the two adjacent reflective surfaces.

Preferably, a position of the aperture stop is the closest to the second reflective surface among the six reflective surfaces with respect to a distance along the optical path.

Preferably, the aperture stop is located between the first and second reflective surfaces, and located apart from each of the first and second reflective surfaces by Lst/10 or greater, more preferably, by Lst/5 or greater, where Lst is an optical path length between the first and second reflective surfaces.

Preferably, the aperture stop is located on the optical path between the first and second reflective surfaces.

Preferably, the six reflective surfaces are located between the object surface and the image surface (or the six reflective surfaces are located between the object surface or the object-side plane including this object surface and the image surface of the image-side plane including this image surface).

Preferably, all the optical elements having optical powers are located between the object surface and the image surface in the catoptric projection optical system.

Preferably, at least one of the six reflective surfaces is an aspheric mirror having a multilayer coating for reflecting the EUV light.

Preferably, all of the six reflective surfaces are aspheric mirrors each having a multilayer coating for reflecting the EUV light.

Preferably, the light used for the projection optical system is EUV light with a wavelength between the 10 nm and 20 nm, more preferably 13 nm and 14 nm.

Preferably, the optical system at the object surface side is non-telecentric. More preferably, the optical system at the image surface side is substantially telecentric.

An exposure apparatus of the instant embodiments includes an illumination optical system for illuminating a pattern on an object surface using light from a light source, and the above one of projection optical systems for projecting the pattern on the object surface onto an image surface in a reduced size. A reflection mask is preferably located on the object surface. In addition, it preferably further includes means for synchronously scanning a mask stage for supporting the object surface and a wafer stage for supporting the image surface, while the object surface is illuminated by the EUV light.

A device fabricating method of one embodiment according to the present invention includes the steps of exposing an object using the above exposure apparatus, and developing the object that has been exposed.

With the forgoing in mind, a description will now be given of a catoptric reduction projection optical system according to one aspect of the present invention, with reference to the accompanying drawings. However, the present invention is not limited to these embodiments, and each element is replaceable with another element within a scope that achieves an object of the present invention.

Here, FIGS. 1 to 6, 10 and 12 to 17 are sectional views of the inventive catoptric reduction projection optical system and its optical path. The inventive catoptric reduction projection optical system is a catoptric reduction projection optical system for projects a pattern on an object surface MS (for example, a mask surface) onto an image surface W (for example, a surface of an object to be exposed, such as a substrate) in a reduced size, and is suitable for the EUV light (with a wavelength between 10 nm and 15 nm, more preferably between 13.4 nm and 13.5 nm).

The catoptric reduction projection optical system includes six mirrors, which basically includes, in order of reflecting light from the object plane MS side, a first (concave) mirror M1, a second (convex) mirror M2, a third (convex) mirror M3, a fourth (concave) mirror M4, and a fifth (convex) mirror M5, and a sixth (concave) mirror M6, and arranges an aperture stop between the first and second reflective surfaces. Thereby, the inventive projection optical system maintains a predetermined reflectance as the whole optical system, prevents a mechanical interference between the mask and the wafer, and increases a degree of freedom of wave front aberration correction.

The present invention has a numerical aperture NA at the image side of 0.23 or more. In general, when the NA is 0.22 or less, the 32 nm node is difficult to achieve in wave optical. On the other hand Japanese Patent Application, Publication No. 2003-15040 discloses the NA of 0.22, and indicated that a person with an ordinary skill in the art can increase the NA. However, if the NA is increased to 0.23 or more with the design value of Japanese Patent Application, Publication No. 2003-15040, the interference occurs actually. Therefore, Japanese Patent Application, Publication No. 2003-15040 cannot achieve the 32 nm node.

A line that connects each center of curvature in these six reflective surfaces of these six mirrors is referred to as an optical axis. However, the centers of curvatures in the six mirrors do not always align with a line, and it is conceivable that the center of curvature of a certain mirror offsets from the optical axis slightly (or within 1% or smaller of the mirror's radius of curvature) for purposes of aberrational corrections, etc. The mirror's center of curvature means a center of curvature of a spherical surface as a base of an aspheric surface if the mirror is not spherical but aspheric. Similarly, the mirror's radius of curvature means a radius of curvature of a spherical surface as a base of an aspheric surface if the mirror is not spherical but aspheric. In other words, the mirror's center of curvature means a center of curvature based on curvature near an axis of the reflective surface's rotation center (When the reflective surface is a spherical surface, all straight lines passed through the center of this spherical surface are the axis of the rotation center, and the axis of the reflective surface's rotation center may mean one of these axes. On the other hand, when the reflective surface is an aspheric surface, the axis of the reflective surface's rotation center means an axis of rotation center of an aspheric surface including the reflective surface, with rotational symmetry).

The aperture stop is located between the first reflective surface and the second reflective surface in the projection optical system. In general, the sixth reflective surface has an extremely large effective diameter for the higher NA, and the fourth reflective surface should be located apart from the optical axis to introduce to the fifth reflective surface without shielding of the light in the sixth reflective surface. Two reflective surfaces (the second reflective surface and the third reflective surface) can introduce the light to the fourth reflective surface by arranging the aperture stop to the optical path between the first reflective surface and the second reflective surface, and the design degree of freedom increases.

In the projection optical system, an upper limit of a ratio (Rsto/NA) between a radius Rsto of the aperture stop and the numerical aperture NA at the image side is preferably 135 or less, and is more preferably 125.3 or less. If Rsto/NA is extremely large, the aperture stop shields the light from the object surface to the first reflective surface, the light from the first reflective surface to the second reflective surface and the light from the second reflective surface to the third reflective surface, or causes the mechanical interference with a surrounding component. In other hand, if Rsto/NA is extremely small, the first reflective surface should have a large power. If the first reflective surface has the large power, the aberration correction is difficult, and Rsto/NA has a lower limit. Although the lower limit is 120 or more until the NA is almost 0.32, the lower limit is 100 or more according to the further higher NA.

The instant embodiment sets the effective part of the second to the fourth reflective surfaces to an appropriate range. If the second and the third reflective surfaces are extremely large, a thickness becomes thin, and the problem of arrangement such as the shielding of the light and the interference is caused. If the fourth reflective surface is extremely large, the maximum effective diameter of the whole projection optical system becomes large, and processing and measurement are difficult. On the other hand, if he effective part of the second to the fourth reflective surfaces are extremely small, the intermediate image is formed near the mirror, and the imaging performance easily deteriorates by the dust of the mirror surface transfers and mirror's deformations.

The instant embodiment introduces a ratio SCA/NA between a radius SCA of an irradiation area that a light from an object point in a center of the arc illuminated area on the object surface spreads to each of the second to the fourth reflective surface in a predetermined plane and the numerical aperture NA at the image side to evaluate the effective parts of the second to the fourth reflective surfaces. Referring to FIGS. 18A to 18C, a description will be given of the evaluation of the effective parts of the second to the fourth reflective surface. Here, FIG. 18A is an optical-path diagram of the inventive projection optical system, FIG. 18B is a schematic perspective view for explaining the arc illuminated area on the object surface, and FIG. 18C is an enlarged plane view of the arc illuminated area.

Referring to FIGS. 18A to 18C, the arc illuminated area AIR on the object surface MS is an area that an arc AC passed, when the arc AC moves only a predetermined distance D in parallel among a perpendicular bisector PB of a chord C shown in FIG. 18B by a dotted line. Moreover, a center B of the arc illuminated area AIR is an intersecting point formed between an area that the arc AC passed, when the arc AC moves only a predetermined distance D/2 along the perpendicular bisector PB of the chord C and the perpendicular bisector PB (in other words, the intersecting point formed between the principal ray and the reflective surface (an incident point of the principal ray to the reflective surface)). XYZ coordinates are set as shown in FIG. 18B, the perpendicular bisector PB is set to correspond to Y axis, the center of curvature of the arc AC is set an origin O, and a coordinate crossed Y axis of the bottom side arc AC of the illuminated area AIR. In this case, a coordinate of the center B is (0, R+D/2, 0). In other words, the center B is a midpoint of line segment crossed between a predetermined plane P and the illuminated area AIR in the predetermined plane P that includes a center of gravity G or the origin O and the optical axis AX (a plane that includes the perpendicular bisector PB and the optical axis AX shown in FIG. 18A by paper plane or YZ plane shown in FIG. 18B).

A spread radius on each of reflective surface is defined as the irradiation area formed on each reflective surface by the light from the center B. More specifically, the spread radius is a half of difference between a distance between a most distant position from the optical axis AX on the plane shown in FIG. 18A among the irradiation area and the optical axis AX and a distance between a most close position from the optical axis AX on the plane shown in FIG. 18A among the irradiation area and the optical axis AX. In other words, in FIG. 18A, half of lengths SCA2, SCA3 and SCA4 orthogonal-projected each irradiation area to Y axis are respectively spread radiuses on the second reflective surface to the fourth reflective surface. FIG. 18A shows diameters 2SCA2, 2SCA3 and 2SCA4. In the instant embodiment, all of SCA2, SCA3 and SCA4 are larger than 70 and smaller than 105. Especially, SCA2/NA is preferably value that is larger than 94 mm and smaller than 105 mm and is more preferably a value that is larger than 100 mm and smaller than 105 mm. SCA3/NA is preferably value that is larger than 72 mm and smaller than 84 mm and is more preferably a value that is larger than 78.5 mm and smaller than 84 mm. SCA4/NA is preferably value that is larger than 75 mm and smaller than 98 mm and is more preferably a value that is larger than 89 mm and smaller than 98.5 mm.

As above-mentioned, when the light is introduced from the object surface to the fourth reflective surface apart from the optical path to increase the NA, the light should not be deflected at a rapidly angle (deflection means that the light changes a traveling direction by the reflective surface) to reduce the aberration and prevents the reductions of the reflectance due to the multilayer coating. Therefore, it is important that a distance between the object point and the effective area of first reflective surface in a direction perpendicular to the optical axis, a distance between the first reflective surface and the effective area of second reflective surface in the direction perpendicular to the optical axis and a distance between the second reflective surface and the effective area of the third reflective surface in the direction perpendicular to the optical axis and a distance between the third reflective surface and the effective area of the fourth reflective surface in the direction perpendicular to the optical axis are not extremely different value, and a surface apex interval between the first reflective surface and the second reflective surface, a surface apex interval between the second reflective surface and the third reflective surface and a surface apex interval between the third reflective surface and the fourth reflective surface are not extremely short.

Figure 19A:
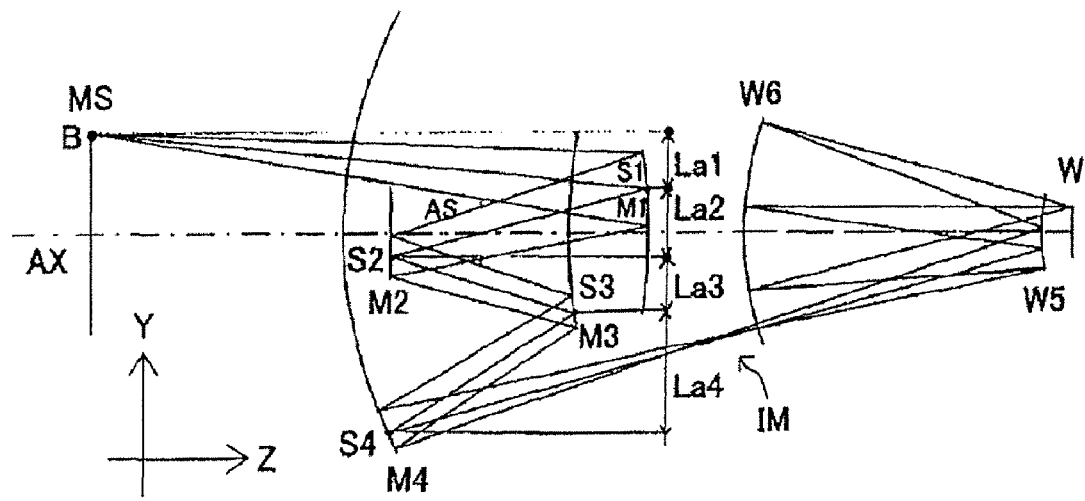
FIGS. 19A and 19B are optical-path diagrams of an inventive projection optical system.
Figure 19B:
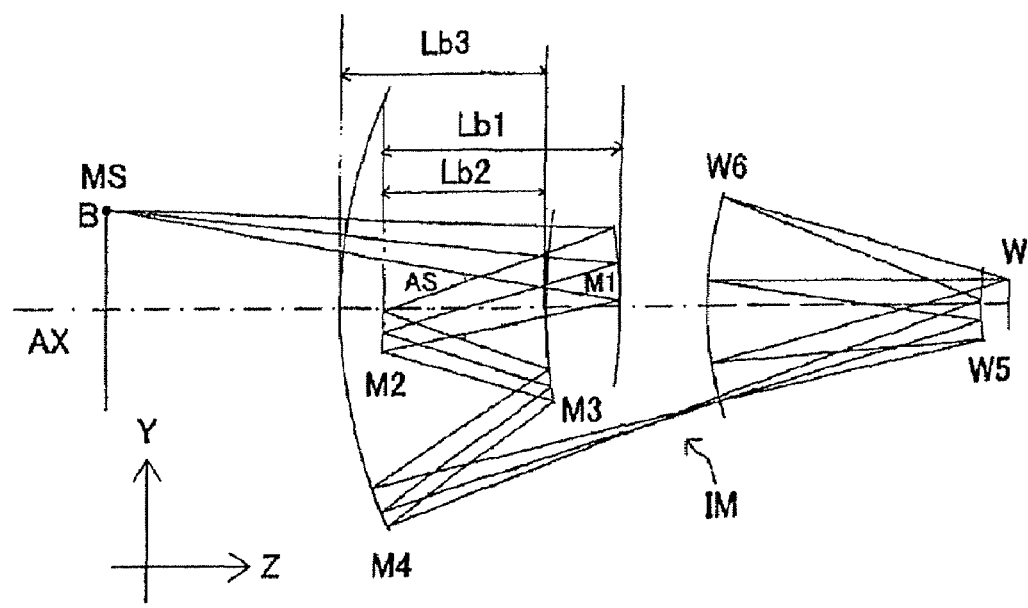

Referring to FIG. 19, a description will be given of the light from the object point to the fourth reflective surface. Here, FIGS. 19A and 19B are optical-path diagrams of the inventive projection optical system. Intersecting points formed between a principal ray from the object point on the center B of the illuminated area AIR (a center line shown in FIG. 19A) and the first to the fourth reflective surface are respectively denoted by first to fourth intersecting points S1 to S4. A distance projected the object point and the first nodal point S1 in Y axis direction perpendicular to the optical axis (Z axis direction) is denoted by La1. A distance projected the first intersecting point S1 and the second intersecting point S2 in Y axis direction is denoted by La2. A distance projected the second intersecting point S2 and the third intersecting point S3 in Y axis direction is denoted by La3. A distance projected the third intersecting point S3 and the fourth intersecting point S4 in Y axis direction is denoted by La4. Then, in the inventive projection optical system, a value of maximum value/minimum value among La1 to La4 is 2.2 or less. Moreover, in the inventive projection optical system, the value of maximum value/minimum value is preferably 2.0 or more, and is more preferably 2.06 or more. Thereby, the inventive projection optical system can effectively prevent the mechanical interference and shielding of the light.

Next, referring to FIG. 19B, a surface apex is defined as one of intersecting points formed between the optical axis and an approximately spherical surface, which one is closest to a reflection point of the light, the approximately spherical surface having a center that is defined as a center of curvature of the first to the fourth reflective surface, and a radius that is defined as a radius of curvature of the first to the fourth reflective surface, an interval between the surface apex of the first reflective surface and the surface apex of the second surface is denoted by Lb1, an interval between the surface apex of the second reflective surface and the surface apex of the third reflective surface is denoted by Lb2, and an interval between the surface apex of the third reflective surface and the surface apex of the fourth reflective surface is denoted by Lb3. In the inventive projection optical system, a value of maximum value/minimum value is 2.0 or less among Lb1 to Lb3.

Especially, the inventive projection optical system has a ratio between a paraxial radius of curvature r2 of the second reflective surface and an object-image distance TT and a ratio between a paraxial radius of curvature r3 of the third reflective surface and the object-image distance TT so that the second reflective surface and the third reflective surface do not rapidly deflect the light as shown below.

$$0.52 < |r2/TT| < 0.63$$

$$0.26 < |r3/TT| < 0.35$$

More specifically, if $|r2/TT|$ is 0.52 or more, the light can be deflected in a fourth reflective surface direction without rapidly deflecting the light. If |r2/TT| is not 0.63 or less, the second reflective surface extremely approaches the plane, and a processing accuracy cannot maintain. If |r3/TT| is 0.26 or more, the light can be deflected in a fourth reflective surface direction without rapidly deflecting the light. If |r3/TT| is 0.35 or less, the fourth reflective surface is further separated from the optical axis, and the high NA can be maintained.

Moreover, the inventive projection optical system has a ratio between a paraxial radius of curvature r1 of the first reflective surface and the object-image distance TT, a ratio between a paraxial radius of curvature r4 of the fourth reflective surface and the object-image distance TT, and a ratio between a paraxial radius of curvature r2 of the second reflective surface and the object-image distance TT as shown below.

$0.26 < |r1/TT| < 0.29$ $0.23 < |r4/TT| < 0.27$ $0.11 < |r5/TT| < 0.14$ $0.17 < |r6/TT| < 0.2$

A lower limit of above ratios prevents the rapidly deflection of the light. An upper limit of |r1/TT| introduces the light to the fourth reflective surface. An upper limit of |r4/TT| separates maintains the high NA by further separating the fourth reflective surface from the optical path and decrease the maximum effective diameter of the projection optical system. Upper limit of |r5/TT| and |r6/TT| prevent the shielding of the light and the mechanical interference.

The incident angle is preferably smaller than 28° to obtain high reflectance of a multilayer coating, and the incident angle is preferably gradually large in order of M2, M3 from M1 to reduce the aberration without rapidly deflecting the light.

Preferably, 1.5<A1<1.6 and 2.3<B1<2.5 are met, where θ11 is an incident angle to a surface normal of the first reflective surface, θ21 is an incident angle to a surface normal of the second reflective surface, and θ31 is an incident angle to a surface normal of the third reflective surface, in the principal ray of the light from the center B, and A1 is θ21/θ11 and B1 is θ31/θ11. If less than a lower limit of this condition, the incident angle becomes extremely small, the light cannot be introduced to a position apart from the optical axis, and the effective parts of each mirror and the aperture stop overlap. On the other hand, if this condition exceeds an upper limit, the reflectance cannot be obtained due to a property of the multilayer coating. Preferably, 2.4<A2<2.7 and 2.8<B2<3.2 are met from the same reason, where θ12 is an incident angle to the optical axis of the first reflective surface, θ22 is an incident angle to an optical axis of the second reflective surface, and θ32 is an incident angle to an optical axis of the third reflective surface, in the principal ray of the light from the center B, and A2 is θ22/θ12 and B2 is θ32/θ12.

In the principal ray of the light from the center B, the incident angle θ11 to the surface normal of the first reflective surface, the incident angle θ21 to the surface normal of the second reflective surface and the incident angle θ31 to the surface normal of the third reflective surface are preferably conditions as shown below.

$9° < θ11 < 12°$ $14.5° < θ21 < 18.5°$ $23.5° < θ31 < 28°$ $θ11 < θ21 < θ31$

In the principal ray of the light from the center B, an incident angle θ41 to a surface normal of the fourth reflective surface, an incident angle θ51 to a surface normal of the fifth reflective surface and an incident angle θ61 to a surface normal of the sixth reflective surface are preferably conditions as shown below.

$7.5° < θ41 < 10°$ $10.5° < θ51 < 13.5°$ $3° < θ61 < 5.5°$

In the principal ray of the light from the center B, the incident angle θ12 to the optical axis of the first reflective surface, the incident angle θ22 to the optical axis of the second reflective surface and the incident angle θ32 to the optical axis of the third reflective surface are preferably conditions as shown below.

$4.5° < θ12 < 7°$ $13.5° < θ22 < 17°$ $15.5° < θ32 < 20°$

In the principal ray of the light from the center B, an incident angle θ42 to an optical axis of the fourth reflective surface, an incident angle θ52 to an optical axis of the fifth reflective surface and an incident angle θ62 to an optical axis of the sixth reflective surface are preferably conditions as shown below.

$31.5° < θ42 < 35°$ $14.5° < θ52 < 18.5°$ $6.5° < θ62 < 9.5°$

In addition, if surface intervals are condition as shown bellow, the reflection of light and the arrangement of components can be facilitated. An absolute value Le1 of the surface apex interval between the first reflective surface and the second reflective surface on the optical axis is preferably larger than an absolute value Le2 of the surface apex interval between the second reflective surface and the third reflective surface on the optical axis, an absolute value Le3 of the surface apex interval between the third reflective surface and the fourth reflective surface on the optical axis. When Le1 is larger than Le2, the arrangement position of the third reflective surface closes the sixth reflective surface, and the arrangement of the components are difficult. Moreover, when Le2 is smaller than Le1, Le3 is preferably smaller than Le1. If Le3 is larger than Le1, the arrangement position of the fourth reflective surface is near the object surface, and arrangement of the mask stage and a raising mirror illumination system etc. becomes difficult. Therefore, Le1, Le2 and Le3 are preferably conditions as shown bellow.

$0.25 < Le1/TT < 0.285$ $0.175 < Le2/TT < 0.21$ $0.21 < Le1/TT < 0.235$

An absolute value TT of the surface apex interval between the object surface and the image surface on the optical axis, an absolute value Le0 of the surface apex interval between the object surface and the first reflective surface on the optical axis, an absolute value Le4 of the surface apex interval between the fourth reflective surface and the fifth reflective surface on the optical axis, an absolute value Le5 of the surface apex interval between the fifth reflective surface and the six the reflective surface on the optical axis and an absolute value Le6 of the surface apex interval between the sixth reflective surface and the image surface on the optical axis are preferably conditions as shown bellow.

$$0.555 < Le0/TT < 0.575$$

$$0.685 < Le4/TT < 0.72$$

$$0.295 < Le5/TT < 0.315$$

$$0.33 < Le6/TT < 0.35$$

An optical path of the light from a reticle's pattern surface (object surface) to the image surface is configured so that an optical path from the second reflective surface to the third reflective surface does not intersect with an optical path from the fourth reflective surface to the fifth reflective surface. Therefore, a complex arrangement of optical elements and two or more surfaces with large effective diameter can be avoided. This prevents an optical path from being so complex that it is difficult to arrange members, or two surface surfaces or more each having a large effective diameter from existing.

For easy processing and measurements, an absolute value of a radius of curvature of the second reflective surface is made 1800 mm or smaller, more preferably 1600 mm or smaller.

An intermediate image is formed between the fourth and fifth reflective surfaces. This configuration narrows the light near the sixth reflective surface having a large effective diameter, and effectively prevents light shielding. An intermediate image of the pattern is formed at a position that accords with none of the six reflective surfaces. An intermediate image of the pattern on the object surface is formed between two adjacent reflective surfaces along the optical path of the light among the six reflective surfaces, and the intermediate image is located apart from each of the two adjacent reflective surfaces by Lim×0.35 or greater, more preferably, Lim×0.4 or greater, where Lim is an optical path length between the two adjacent reflective surfaces. This configuration can maintain an appropriate divergence of the light on the reflective surface, and reduce deteriorations of imaging performance on the reflective surface, caused by dust and ripples, bubbles in the mirror material, etc.

The six reflective surfaces, such as the first reflective surface, the second reflective surface, the third reflective surface, the fourth reflective surface, the fifth reflective surface and the sixth reflective surface, are arranged so that radii of curvature of these six reflective surfaces are substantially aligned with a certain optical axis. A center of curvature, as used herein, means a center of curvature of the reflective surface when the reflective surface is substantially a spherical surface, and a center of curvature of a spherical surface after an aspheric component is removed from the reflective surface if the reflective surface is the aspheric surface. In other words, the center of curvature means one based on the curvature near a rotationally center axis of the reflective surface (which means any one of lines that pass through a center of a spherical surface when the reflective surface is the spherical surface, or a rotationally center axis of a rotationally symmetrical aspheric surface that includes the reflective surface when the reflective surface is an aspheric surface).

Characteristically, the light from the object surface MS to the first mirror M1 is non-telecentric, and the exit light at the image surface side is telecentric. Since an additionally provided illumination optical system illuminates the reflection mask on the object surface MS, a certain incident angle is vital at the object side. On the other hand, the image surface side is preferably telecentric to reduce magnification variance even when the wafer W arranged on the image surface moves along the optical axis direction.

The inventive catoptric reduction projection optical system is arranged substantially as a coaxial optical system that is axially symmetrical around one optical axis, has an advantage in that an aberration is corrected for only an arc-shape image field around the optical axis. However, the six mirrors in the catoptric reduction projection optical system do not have to be arranged perfectly coaxial for aberrational corrections or adjustments. For example, they may slightly decenter for aberrational improvements or improve the degree of freedom in arrangement.

Preferably, the fifth and sixth mirrors (M5) and (M6) are convex and concave mirrors, respectively, for imaging with high NA and maintained back focus. Here, the "back focus" means an interval between the surface closest to the image surface and the image surface (W). It is preferable that the first reflective surface has a concave shape for convergence of the divergent light from the mask, therefore it is easy to guide the light from the mask to the wafer. It is also preferable that the fourth reflective surface has a concave shape, so as to introduce the light into the fifth reflective surface close to the optical axis and avoid the sixth reflective surface having a large effective diameter. All of the optical elements having a power is located between the object surface and the image surface.

In addition, all the reflective surfaces are arranged between the object surface and the image surface, and the reticle stage and wafer stage can be arranged easily.

In general, the fourth reflective surface should be arranged at a position apart from the optical axis so as to avoid light shielding at the sixth reflective surface having a great diameter. In the instant embodiment, the aperture stop is located between the first and second reflective surfaces, and the second reflective surface and the third reflective surface have a convex shape. This configuration can introduce the light to the fourth reflective surface via two reflective surfaces, i.e., the second and third reflective surfaces, when attempting to introduce the light from the aperture stop to the fourth reflective surface, preventing an extremely great distance between the third and fourth reflective surfaces. This provides a system that has a relatively small maximum effective diameter, and can reduce the enlargement of the fourth reflective surface while keeping the incident angle small. Moreover, the properly enlarged front focus (that is a distance from the object surface to the fourth reflective surface in the instant embodiment) facilitates an arrangement of optical elements.

In order to form a system having a comparatively small incident angle, a comparatively small maximum effective diameter, and a sufficient front focus, it is preferable that $0.75 < L1/L2 < 1.25$, more preferably $0.87 < L1/L2 < 0.97$, are met, where L1 is an interval between the object surface and the reflective surface closest to the object surface (which is, but not limited to, a distance between the object surface and the fourth reflective surface in the instant embodiment, and may be a distance between the object surface and the second reflective surface or a distance between the object surface and the reflective surface other than the second and fourth reflective surfaces), and L2 is an interval between the reflective surface closest to the object surface and the first reflective surface.

A small telecentricity at the object side is needed to eliminate a problem of deteriorations of imaging performance caused by influence of the oblique incidence upon the reticle. In this case, when the second reflective surface accords with the aperture stop surface, the light incident upon the first reflective surface from the object surface is shielded on the second reflective surface. The instant system arranges the stop between the first and second reflective surfaces, and prevents the above problem.

Disadvantageously, when the divergence of the light on the reflective surface is small, the ripples on the mirror surface that occur at the time of processing and the air bubbles in the mirror materials directly affect the deteriorations of the imaging performance. In addition, the energy concentration deforms a mirror and transfers dust. As one solution for this problem, it is preferable that a difference is 30 mm or longer, more preferably, 40 mm or above (although an extremely great value makes a processing measurement impossible), between a maximum distance and a minimum distance between an optical axis and a light incident area on the fourth reflective surface, upon which light emitted from a center of a nodal line is incident, the nodal line being formed between a plane that includes a center of an arc illuminated area (i.e., a center of gravity or a center point on the center line in a circumference direction of the arc shape) on the object surface and the optical axis, and the illuminated area. While the instant system relatively reduces a distance between the third and fourth reflective surfaces as discussed above and narrows the divergent light on the fourth reflective surface, the convex shapes of the second and third reflective surfaces enable properly spread light to be incident upon each reflective surface and maintains an appropriate divergence of the light on the fourth reflective surface.

Where r1 to r6 are radii of curvature of respective mirrors, the sum of Petzval terms should be zero or nearly zero as in Equations below:

$$\frac{1}{r_1} - \frac{1}{r_2} + \frac{1}{r_3} - \frac{1}{r_4} + \frac{1}{r_5} - \frac{1}{r_6} \approx 0$$

$$\frac{1}{r_1} - \frac{1}{r_2} + \frac{1}{r_3} - \frac{1}{r_4} + \frac{1}{r_5} - \frac{1}{r_6} = 0$$

While the inventive catoptric reduction projection optical system includes six mirrors, at least one or more mirrors may have an aspheric surface. Equation below defines a general aspheric shape. As a mirror having an aspheric surface advantageously facilitates a correction of aberration, the aspheric surface is preferably applied to many possible (desirably, six) mirrors.

$$Z = \frac{ch^2}{1+\sqrt{1-(1+k)c^2h^2}} + Ah^4 + Bh^6 + Ch^8 + Dh^{10} + Eh^{12} + Fh^{14} + Gh^{16} + Hh^{18} + Jh^{20} + \ldots$$

where "Z" is a coordinate in an optical-axis direction, "c" is a curvature (i.e., a reciprocal number of the radius r of curvature), "h" is a height from the optical axis, "k" a conic constant, "A" to "J" are aspheric coefficients of $4^{th}$ order, $6^{th}$ order, $8^{th}$ order, $10^{th}$ order, $12^{th}$ order, $14^{th}$ order, $16^{th}$ order, $18^{th}$ order, $20^{th}$ order, respectively.

A multilayer coating for reflecting the EUV light is applied to the respective mirrors, and intensifies the light. An applicable multilayer for reflecting the EUV light below 20 nm is, for example, a Mo/Si multilayer coating created by reciprocally laminating a molybdenum (Mo) layer and a silicon (Si) layer or a Mo/Be multilayer coating created by reciprocally laminating a molybdenum (Mo) layer and a beryllium (Be) layer. An optimal material is selected according to wavelengths to be used. Of course, the present invention does not limit the multilayer coating to the above materials, and may use any multilayer coating that has an operation or effect similar to that of the above.

In general, in view of the characteristics of the multilayer coating, a relatively small distribution width of an incident angle is needed to increase the reflectance when the maximum value of the incident angle is large, although a relatively large distribution width of an incident angle is permissible when the maximum value of the incident angle is small. It is the third surface that has the largest incident angle among the six reflective surfaces in the instant system. This third reflective surface is likely to reduce the reflectance irrespective of a relatively small incident angle. Considering the characteristics of the multilayer coating, the instant system prevents the deterioration of the performance by requiring the incident angle characteristic upon the third reflective surface to satisfy the following the following equations:

$$25° < \theta_{max} + \Delta\theta < 35°$$

where $\theta_{max}$ is a maximum incident angle upon the third reflective surface, and $\Delta\theta$ is a difference between the maximum incident angle and the minimum incident angle on the third reflective surface, or an incident angle distribution width. More preferably, $28° < \theta_{max} + \Delta\theta$ and/or $\theta_{max} + \Delta\theta < 32°$ or $\theta_{max} + \Delta\theta < 30°$ are met.

None of the six reflective surfaces have an area that allows the light to pass through, absorbs the light or transmits the light, in their light incident areas. In one embodiment, the light incident area on each reflective surface does not have an opening, etc. With respect to the light to the object to be exposed (i.e., a wafer), or the light from the sixth reflective surface to the object (image surface), an area that does not include the light is eliminated from an outer circumference on a section orthogonal to the optical axis. In general, when a pupil is shielded, the imaging performance is remarkably affected. This configuration overcomes this problem.

The convergent light enters the convex third reflective surface from the second reflective surface, and the divergent light enters the fourth reflective surface from the convex third reflective surface. The instant embodiment provides such characteristics that the maximum incident angle in a light incident effective area at respective points in a radial direction (orthogonal to the optical axis) on the third reflective surface has a maximum value at the effective region, thereby making the incident angle distribution width relatively small and preventing deteriorations of the performance of the multilayer coating. More specifically, on the third reflective surface, there is an extreme of a maximum incident angle at each point on a nodal line in a region between Lmin+0.3×(Lmax−Lmin) and Lmax on the nodal line, the nodal line being formed between a light incident area upon which the light from an arc illuminated area on the object surface is incident, and a plane that includes a center point of a chord of the arc illuminated area shape on the object surface and an optical axis, the light incident area being located on one of the six reflective surfaces, which one has the largest maximum value of a light incident angle, where Lmin is a minimum distance from the optical axis to each point on the nodal line, and Lmax is a maximum distance from the optical axis to each point on the nodal line. It is more preferable that the maximum incident angle at each point has an extreme value on the nodal line in a region between (Lmin+Lmin)/2±0.2×(Lmax−Lmin) on the nodal line.

Preferably, a surface apex is defined, with respect to each of the six reflective surfaces, as one of intersecting points between an optical axis and an approximately spherical surface, which one is closest to a reflection point of the light on each of the six reflective surfaces, the approximately spherical surface having a center that is defined as a center of curvature of each of the six reflective surfaces (which means a center of curvature of the reflective surface when the reflective surface is a spherical surface, and a center of curvature of a spherical surface after the aspheric component is removed from the reflective surface if the reflective surface is an aspheric surface or a center of curvature based on the curvature near the rotationally symmetrical axis of the rotationally symmetrical aspheric surface that includes the aspheric surface), and a radius that is defined as a radius of curvature of each of the six reflective surfaces (which means a radius of curvature of the reflective surface when the reflective surface is a spherical surface, and a radius of curvature of a spherical surface after the aspheric component is removed from the reflective surface if the reflective surface is an aspheric surface or a radius of curvature based on the curvature near the rotationally symmetrical axis of the rotationally symmetrical aspheric surface that includes the aspheric surface), wherein the surface apexes of the six reflective surfaces are arranged in order of the fourth reflective surface, the second reflective surface, the third reflective surface, the first reflective surface, the sixth reflective surface and the fifth reflective surface in order from the object surface to the image surface along an optical axis.

When the surface interval becomes small, it is difficult to thicken the mirror and to arrange members, such as a holding mechanism and a cooling mechanism. Considering this fact, a distance is 250 mm or longer, more preferably 310 mm or longer, between the object surface and one of the surface apexes of the six reflective surfaces, which one is the closest to the object surface.

A distance along the optical axis between the surface apex of the second reflective surface and the surface apex of the fourth reflective surface is 5 mm or longer, preferably 10 mm or longer, more preferably 15 mm or longer.

Preferably, with respect to an overall length of the projection optical system or each of the six reflective surfaces, a surface apex is defined, with respect to each of the six reflective surfaces, as one of intersecting points between an optical axis and an approximately spherical surface, which one is closest to a reflection point of the light on each of the six reflective surfaces, the approximately spherical surface having a center that is defined as a center of curvature of each of the six reflective surfaces, and a radius that is defined as a radius of curvature of each of the six reflective surfaces, wherein La11/200<L24<La11/10, more preferably, La11/100<L24 and/or L24<La11/18, is met, where L24 is an interval between the surface apex of the second reflective surface and the surface apex of the fourth reflective surface, and La11 is a distance between the object surface and the image surface along the optical axis.

In general, the sixth reflective surface having a large effective diameter has a large thickness. Therefore, an interval between the surface apex of the sixth reflective surface and the surface apex of the reflective surface closest to the sixth reflective surface along the optical axis is 100 mm or longer, preferably 110 mm or longer, 115 mm or longer. The instant system satisfies the above conditions and provides an easily configured system.

Preferably, La11/20<L6<La11/6, more preferably, La11/12<L6 and/or L6<La11/9, are met, where L6 is an interval between the surface apex of the sixth reflective surface and the surface apex of the reflective surface that is closest to the sixth reflective surface, and La11 is an overall length of the projection optical system, as discussed.

Preferably, a surface apex is defined, with respect to each of the six reflective surfaces, as one of intersecting points between an optical axis and an approximately spherical surface, which one is closest to a reflection point of the light on each of the six reflective surfaces, the approximately spherical surface having a center that is defined as a center of curvature of each of the six reflective surfaces, and a radius that is defined as a radius of curvature of each of the six reflective surfaces, wherein the surface apex of the third reflective surface is located closer to the object surface than the surface apex of the sixth reflective surface.

Preferably, the third reflective surface is located closer to the object surface along the optical path than the sixth reflective surface.

Preferably, the aperture stop is located between the first and second reflective surfaces, and located apart from each of the first and second reflective surfaces by Lst/10 or greater, more preferably, by Lst/5 or greater, where Lst is an optical path length between the first and second reflective surfaces. This configuration can take advantage of the second reflective surface as means for introducing the light into the fourth reflective surface that is located apart from the optical axis.

The throughput improves to extend a width of the arc illuminated area. In present light source required specification, when the NA of projection optical system is 0.2 to 0.4, the arc illuminated area needs the width W of 3.5 mm or more to effectively use the light from the light source. However, if the width is extremely large, the aberration correction of the projection optical system becomes difficult. Therefore, the width is preferably 8 mm or less, and is more preferably 4 mm or more and 6 mm or less. In addition, NA and the width W of the arc illuminated area are preferably condition as shown bellow.

$$NA > 0.36/(W+1.5)+0.165$$

Preferably, the six reflective surfaces are located between the object surface and the image surface (or the six reflective surfaces are located between the object surface or the object-side plane including this object surface and the image surface of the image-side plane including this image surface). In addition, all the optical elements having optical powers are located between the object surface and the image surface in the catoptric projection optical system.

At least one of the six reflective surfaces is an aspheric mirror having a multilayer coating for reflecting the EUV light. Preferably, all of the six reflective surfaces are aspheric mirrors each having a multilayer coating for reflecting the EUV light.

Preferably, the light used for the projection optical system is EUV light with a wavelength between the 10 nm and 20 nm, more preferably 13 nm and 14 nm.

Preferably, the optical system at the object surface side is non-telecentric. More preferably, the optical system at the image surface side is substantially telecentric.

An inventive exposure apparatus is a scanning exposure apparatus that includes an illumination optical system for illuminating a pattern on an object surface using light from a light source, the above projection optical systems for projecting the pattern on the object surface onto an image surface in a reduced size, and a reflection mask located on the object surface, and synchronously scans a mask stage and a wafer stage.

A description will be given of embodiments of the inventive catoptric projection optical system with reference to FIGS. 1 to 17:

First Embodiment

A description will be given of a first embodiment of the present invention with reference to FIG. 1 and Table 1.

A catoptric projection optical system of the first embodiment includes six mirrors that includes, in order of reflecting the light from the object surface MS, a first concave reflective surface M1, a second convex reflective surface M2, a third convex reflective surface M3, a fourth concave surface M4, a fifth convex reflective surface M5 and a sixth concave reflective surface M6. The projection optical system forms an intermediate image IM between M4 and M5 along the optical path, and re-forms the intermediate image IM on the image surface W using the remaining surfaces.

In FIG. 1, an alternate long and short dash line denotes an optical axis, which can also defined as a line that connects centers of curvature of the first to sixth reflective surfaces. Since each reflective surface can be decentered and inclined for purposes of aberrational corrections, the centers of curvature of the reflective surfaces do not always align with but can slightly offset from the optical axis.

A distance between the object surface and the image surface along the optical axis is referred to as an overall length, which is about 1230.428 mm in the first embodiment.

MS is a reflection mask located at an object surface position, and W is a wafer located at an image surface position. The inventive catoptric reduction projection optical system projects a reflection mask illuminated by the illumination optical system onto the wafer as the image surface.

Table 1 shows details of the optical system shown in FIG. 1. A numerical aperture NA at the image side is 0.26, a magnification is ¼, and an object point is 126 to 134 mm (while the image side has an arc field with a width of 2 mm). The wave front aberration has a RMS of 7.2 m$\lambda$, and a static distortion range of 2.2 nm.

As discussed, an arrangement of the aperture stop between M1 and M2 prevents shielding of the light from the object surface to M1, although the object-side telecentricity is as small as 103 mrad. Since M2 and M3 introduce the light from the aperture stop to M4 apart from the optical axis, a distance between M3 and M4 can be relatively short although the maximum incident angle is maintained to be 26.5°. This distance and second reflective surface having a convex shape provide an appropriate divergence of the light on the fourth reflective surface M4. More specifically, the divergence of the light on the fourth surface introduced from the object point of 130 mm, or a difference of the maximum value and the minimum value of distances from the optical axis on the light incident area on the fourth reflective surface, is 40.8 mm. This configuration reduces influences of the mirror surface's ripples, air bubbles in the mirror material, mirror's deformations, dust transfers, etc., and prevent deteriorations of the imaging performance. Therefore, the divergence of the light on M4 becomes appropriate, while the maximum effective diameter is maintained to be 560 mm.

Preferably, the aperture stop is located apart from the first and second reflective surfaces M1 and M2 by a proper distance. In the instant embodiment, the aperture stop is located apart from the first reflective surface M1 by 0.668 Lst, and apart from the second reflective surface M1 by 0.332 Lst, where Lst is an optical path length between the first and second reflective surfaces.

The third reflective surface is a surface that has the largest light incident angle among the six reflective surfaces, which is 26.5°. The incident angle distribution width is 2.5°. In particular, the small incident angle distribution prevents reductions of the reflectance due to the multilayer coating.

A distance is 333.7 mm between the object surface and the surface apex of the fourth reflective surface as a reflective surface closest to the object surface, providing a sufficient front focus.

An interval is 46.1 mm between the surface apex of the second reflective surface and the surface apex of the fourth reflective surface, and an interval is 120 mm between the surface apex of the sixth reflective surface and the surface apex of the first reflective surface as a reflective surface that is closest to the sixth reflective surface. This configuration maintains the space, and facilitates arrangements of various mechanisms, such as a driving mechanism and a cooling mechanism. L1/L2 is 0.92, which is sufficient to provide a reduced incident angle, and a sufficient front focus, where L1 is an interval between the object surface and the surface apex of M4 that is the reflective surface closest to the object surface, and L2 is an interval between the surface apex of M4 that is the reflective surface closest to the object surface and the surface apex of the first reflective surface.

The convex surfaces of M2 and M3 enable the intermediate image to form at a position apart from the mirror, and provide an appropriate divergence of the light on the mirror surface. Thereby, this configuration reduces influences of the mirror surface's ripples, air bubbles in the mirror material, mirror's deformations, dust transfers, etc., and prevent deteriorations of the imaging performance. This intermediate image is formed between 0.4×Lim and 0.6×Lim where Lim is an optical path length between the fourth and fifth reflective surfaces.

TABLE 1

| MIRROR NO. | RADIUS OF CURVATURE. | SURFACE INTERVAL |
|---|---|---|
| M(MASK) | ∞ | 689.36560 |
| M1 | −686.96140 | −212.64860 |
| APERTURE STOP | ∞ | −105.89250 |
| M2 | −1445.63800 | 232.34530 |
| M3 | 741.90100 | −278.44160 |
| M4 | 611.25530 | 863.31560 |
| M5 | 308.44490 | −378.74050 |
| M6 | 455.92490 | 421.06450 |
| W(WAFER) | ∞ | 0 |

| ASPHERIC COEFFICIENT | K | A | B | C | D | E | F | G |
|---|---|---|---|---|---|---|---|---|
| M1 | −1.94563E+00 | 9.01813E−10 | −2.12560E−14 | 4.33484E−19 | −8.21908E−24 | 1.53956E−29 | 7.43682E−33 | −1.71216E−37 |
| M2 | 1.70220E+01 | −1.73522E−09 | 9.43707E−14 | −1.58260E−17 | 7.43820E−21 | −2.00780E−24 | 2.87488E−28 | −1.64770E−32 |
| M3 | 9.70635E−01 | −2.08916E−09 | −6.16309E−14 | 9.35423E−18 | −7.25525E−22 | 3.66802E−26 | −9.77561E−31 | 1.10779E−35 |
| M4 | −2.62842E−02 | 3.96504E−11 | −1.62737E−15 | 1.96140E−20 | −3.14125E−26 | −1.93664E−30 | 2.01437E−35 | −6.39960E−41 |

TABLE 1-continued

| | | | | | | | | |
|---|---|---|---|---|---|---|---|---|
| M5 | 1.64409E−01 | −1.00959E−09 | 1.23204E−12 | −4.31799E−17 | 1.11326E−21 | 2.46707E−24 | −9.17157E−28 | 1.14419E−31 |
| M6 | 3.26806E−02 | 3.66724E−11 | 2.36144E−16 | 8.37613E−22 | 3.80831E−26 | −7.00742E−31 | −6.44088E−36 | 3.83037E−40 |

Second Embodiment

Figure 2:
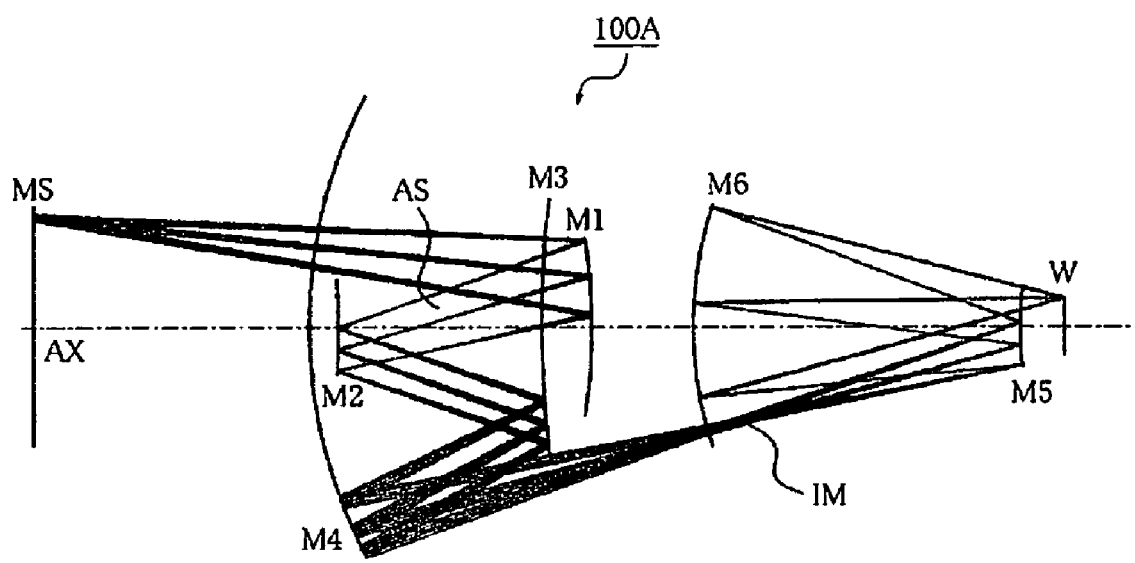
FIG. 2 is a view according to a second embodiment of the present invention.

A description will be given of a second embodiment of the present invention with reference to FIG. 2 and Table 2. Unless otherwise specified, this embodiment is similar to the first embodiment.

The overall length of the second embodiment is about 1211.432 mm. A numerical aperture NA at the image side is 0.26, a magnification is ¼, and an object point is 126 to 134 mm (while the image side has an arc field with a width of 2 mm). The wave front aberration has a RMS of 13 mλ, and a static distortion range of 2.7 nm.

An arrangement of the aperture stop between M1 and M2 prevents shielding of the light from the object surface to M1, although the object-side telecentricity is as small as 106.5 mrad. Since M2 and M3 introduce the light from the aperture stop to M4 apart from the optical axis, a distance between M3 and M4 can be relatively short although the maximum incident angle is maintained to be 25.4°. This distance and second reflective surface having a convex shape provide an appropriate divergence of the light on the fourth reflective surface M4.

More specifically, the divergence of the light on the fourth surface introduced from the object point of 130 mm is 60.3 mm. This configuration reduces influences of the mirror surface's ripples, air bubbles in the mirror material, mirror's deformations, dust transfers, etc., and prevent deteriorations of the imaging performance. Therefore, the divergence of the light on M4 becomes appropriate, while the maximum effective diameter is maintained to be 560 mm.

Preferably, the aperture stop is located apart from the first and second reflective surfaces M1 and M2 by a proper distance. In the instant embodiment, the aperture stop is located apart from the first reflective surface M1 by 0.685 Lst, and apart from the second reflective surface M1 by 0.315 Lst, where Lst is an optical path length between the first and second reflective surfaces.

The third reflective surface is a surface that has the largest light incident angle among the six reflective surfaces, which is 25.4°. The incident angle distribution width is 3.3°. In particular, the small incident angle distribution prevents reductions of the reflectance due to the multilayer coating.

A distance is 329.2 mm between the object surface and the surface apex of the fourth reflective surface as a reflective surface closest to the object surface, providing a sufficient front focus.

An interval is 30.5 mm between the surface apex of the second reflective surface and the surface apex of the fourth reflective surface, and an interval is 120 mm between the surface apex of the sixth reflective surface and the surface apex of the first reflective surface as a reflective surface that is closest to the sixth reflective surface. This configuration maintains the space, and facilitates arrangements of various mechanisms, such as a driving mechanism and a cooling mechanism. L1/L2 is 0.92, which is sufficient to provide a reduced incident angle, and a sufficient front focus, where L1 is an interval between the object surface and the surface apex of M4 that is the reflective surface closest to the object surface, and L2 is an interval between the surface apex of M4 that is the reflective surface closest to the object surface and the surface apex of the first reflective surface.

The convex surfaces of M2 and M3 enable the intermediate image to form at a position apart from the mirror, and provide an appropriate divergence of the light on the mirror surface. Thereby, this configuration reduces influences of the mirror surface's ripples, air bubbles in the mirror material, mirror's deformations, dust transfers, etc., and prevent deteriorations of the imaging performance. This intermediate image is formed between 0.4×Lim and 0.6×Lim where Lim is an optical path length between the fourth and fifth reflective surfaces.

TABLE 2

| MIRROR NO. | RADIUS OF CURVATURE. | SURFACE INTERVAL |
|---|---|---|
| M(MASK) | ∞ | 664.18850 |
| M1 | −666.11180 | −207.90840 |
| APERTURE STOP | ∞ | −95.59360 |
| M2 | −828.86400 | 244.07190 |
| M3 | 1381.89490 | −275.54020 |
| M4 | 644.72050 | 839.61750 |
| M5 | 307.71430 | −384.64710 |
| M6 | 464.62120 | 437.24330 |
| W(WAFER) | ∞ | 0 |

| ASPHERIC COEFFICIENT | K | A | B | C | D | E | F | G |
|---|---|---|---|---|---|---|---|---|
| M1 | −2.35596E+00 | 7.84893E−10 | −2.72820E−14 | 6.48140E−19 | −1.35529E−23 | −3.31779E−28 | 6.02190E−32 | −2.04791E−36 |
| M2 | 2.35964E+01 | 5.65519E−09 | 1.59335E−13 | −3.76810E−19 | 5.20128E−21 | −2.40912E−24 | 5.28021E−28 | −4.60368E−32 |
| M3 | −2.68273E+00 | −7.50969E−10 | 1.14233E−14 | −2.73120E−19 | −4.49599E−24 | 7.50420E−28 | −2.40526E−32 | 2.62659E−31 |
| M4 | 1.90138E−02 | −1.71190E−11 | −3.09570E−16 | 3.72314E−21 | 1.91792E−26 | −1.09103E−30 | 1.12604E−35 | −3.85577E−41 |
| M5 | −5.12215E−01 | 4.33837E−10 | 1.44464E−12 | −6.30460E−17 | 9.20270E−21 | −1.50781E−24 | −2.03544E−28 | 9.70776E−32 |
| M6 | 2.23465E−02 | 3.21944E−11 | 2.11841E−16 | 1.00378E−21 | 3.48085E−26 | 2.88806E−30 | 1.19494E−34 | −1.77676E−39 |

Third Embodiment

Figure 3:
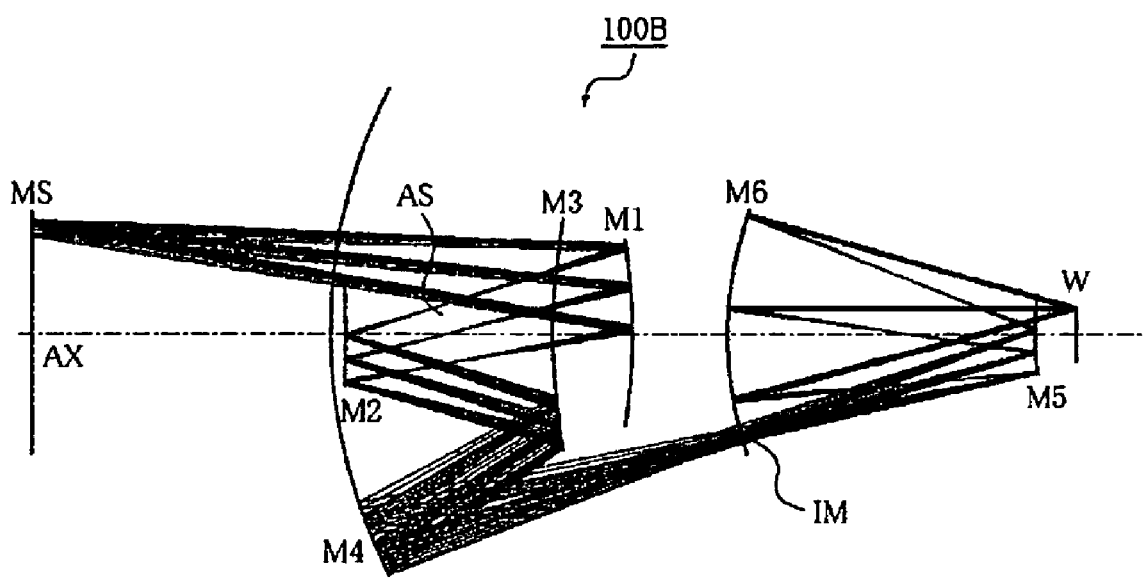
FIG. 3 is a view according to a third embodiment of the present invention.

A description will be given of a third embodiment of the present invention with reference to FIG. 3 and Table 3. Unless otherwise specified, this embodiment is similar to the first and second embodiments.

The overall length of the third embodiment is about 1206.092 mm. A numerical aperture NA at the image side is 0.27, a magnification is ¼, and an object point is 126 to 134 mm (while the image side has an arc field with a width of 2 mm). The wave front aberration has a RMS of 14.4 mλ, and a static distortion range of 2.3 nm.

An arrangement of the aperture stop between M1 and M2 prevents shielding of the light from the object surface to M1, although the object-side telecentricity is as small as 103 mrad. Since M2 and M3 introduce the light from the aperture stop to M4 apart from the optical axis, a distance between M3 and M4 can be relatively short although the maximum incident angle is maintained to be 26.50. This distance and second reflective surface having a convex shape provide an appropriate divergence of the light on the fourth reflective surface M4.

More specifically, the divergence of the light on the fourth surface introduced from the object point of 130 mm is 60.3 mm. This configuration reduces influences of the mirror surface's ripples, air bubbles in the mirror material, mirror's deformations, dust transfers, etc., and prevent deteriorations of the imaging performance. Therefore, the divergence of the A distance is 341.5 mm between the object surface and the surface apex of the fourth reflective surface as a reflective surface closest to the object surface, providing a sufficient front focus. An interval is 20 mm between the surface apex of the second reflective surface and the surface apex of the fourth reflective surface, and an interval is 120 mm between the surface apex of the sixth reflective surface and the surface apex of the first reflective surface as a reflective surface that is closest to the sixth reflective surface. This configuration maintains the space, and facilitates arrangements of various mechanisms, such as a driving mechanism and a cooling mechanism. L1/L2 is 0.97, which is sufficient to provide a reduced incident angle, and a sufficient front focus, where L1 is an interval between the object surface and the surface apex of M4 that is the reflective surface closest to the object surface, and L2 is an interval between the surface apex of M4 that is the reflective surface closest to the object surface and the surface apex of the first reflective surface.

The convex surfaces of M2 and M3 enable the intermediate image to form at a position apart from the mirror, and provide an appropriate divergence of the light on the mirror surface. Thereby, this configuration reduces influences of the mirror surface's ripples, air bubbles in the mirror material, mirror's deformations, dust transfers, etc., and prevent deteriorations of the imaging performance. This intermediate image is formed between 0.4×Lim and 0.6×Lim where Lim is an optical path length between the fourth and fifth reflective surfaces.

TABLE 3

| MIRROR NO. | RADIUS OF CURVATURE. | SURFACE INTERVAL |
|---|---|---|
| M(MASK) | ∞ | 694.84276 |
| M1 | −716.24160 | −219.13081 |
| APERTURE STOP | ∞ | −114.33524 |
| M2 | −1550.00000 | 241.59945 |
| M3 | 721.61644 | −261.49378 |
| M4 | 586.31403 | 817.09236 |
| M5 | 296.69119 | −353.73198 |
| M6 | 430.15510 | 401.24950 |
| W(WAFER) | ∞ | 0 |

| ASPHERIC COEFFICIENT | K | A | B | C | D | E | F | G |
|---|---|---|---|---|---|---|---|---|
| M1 | −1.92463E+00 | 8.59913E−10 | −2.03466E−14 | 4.62151E−19 | −8.54869E−24 | −2.76473E−28 | 3.16917E−32 | −7.82844E−37 |
| M2 | −2.88259E−01 | −2.29465E−09 | 8.45007E−14 | −1.61951E−11 | 7.60003E−21 | −1.92909E−24 | 2.47481E−28 | −1.19995E−32 |
| M3 | 1.17791E+00 | −1.85904E−09 | −8.39806E−14 | 1.11840E−17 | −8.47167E−22 | 3.85393E−31 | −9.68293E−31 | 1.03379E−35 |
| M4 | −3.00880E−02 | 2.80737E−11 | −1.37915E−15 | 2.11145E−20 | −9.66767E−26 | −3.7500E−30 | 1.93512E−35 | −6.99842E−41 |
| M5 | 3.12023E−01 | −1.03445E−09 | 1.58463E−12 | −8.00021E−17 | 2.19921E−21 | 8.72805E−24 | −3.83620E−27 | 5.39287E−31 |
| M6 | 3.02209E−02 | 4.87630E−11 | 3.48587E−16 | 5.93966E−22 | 1.37823E−25 | −5.78066E−30 | 1.46588E−34 | −1.55821E−39 | light on M4 becomes appropriate, while the maximum effective diameter is maintained to be 560 mm.

Preferably, the aperture stop is located apart from the first and second reflective surfaces M1 and M2 by a proper distance. In the instant embodiment, the aperture stop is located apart from the first reflective surface M1 by 0.657 Lst, and apart from the second reflective surface M1 by 0.343 Lst, where Lst is an optical path length between the first and second reflective surfaces.

The third reflective surface is a surface that has the largest light incident angle among the six reflective surfaces, which is 26.5°. The incident angle distribution width is 2.2°. In particular, the small incident angle distribution prevents reductions of the reflectance due to the multilayer coating.

Fourth Embodiment

Figure 4:
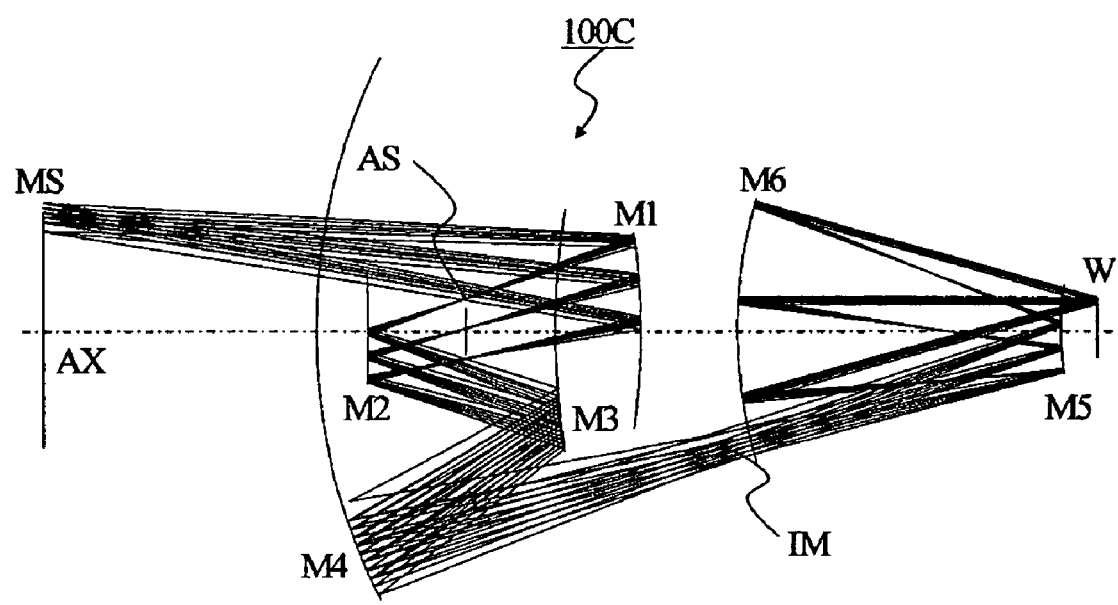
FIG. 4 is a view according to a fourth embodiment of the present invention.

A description will be given of a fourth embodiment of the present invention with reference to FIG. 4 and Table 4. Unless otherwise specified, this embodiment is similar to the first, second and third embodiments.

The overall length of the third embodiment is about 1252.384 mm. A numerical aperture NA at the image side is 0.25, a magnification is ¼, and an object point is 119 to 139 mm (while the image side has an arc field with a width of 5 mm). The wave front aberration has a RMS of 17.4 mλ, and a static distortion range of 2.7 nm.

An arrangement of the aperture stop between M1 and M2 prevents shielding of the light from the object surface to M1, although the object-side telecentricity is as small as 103 mrad.

Since M2 and M3 introduce the light from the aperture stop to M4 apart from the optical axis, a distance between M3 and M4 can be relatively short although the maximum incident angle is maintained to be 27°. This distance and second reflective surface having a convex shape provide an appropriate divergence of the light on the fourth reflective surface M4.

More specifically, the divergence of the light on the fourth surface introduced from the object point of 129 mm is 45.2 mm. This configuration reduces influences of the mirror surface's ripples, air bubbles in the mirror material, mirror's deformations, dust transfers, etc., and prevent deteriorations The convex surfaces of M2 and M3 enable the intermediate image to form at a position apart from the mirror, and provide an appropriate divergence of the light on the mirror surface. Thereby, this configuration reduces influences of the mirror surface's ripples, air bubbles in the mirror material, mirror's deformations, dust transfers, etc., and prevent deteriorations of the imaging performance. This intermediate image is formed between $0.4 \times Lim$ and $0.6 \times Lim$ where Lim is an optical path length between the fourth and fifth reflective surfaces.

TABLE 4

| MIRROR NO. | RADIUS OF CURVATURE. | SURFACE INTERVAL |
|---|---|---|
| M(MASK) | ∞ | 709.84800 |
| M1 | −706.52400 | −213.48700 |
| APERTURE STOP | ∞ | −112.96900 |
| M2 | −1500.0000 | 224.72300 |
| M3 | 700.00000 | −286.16900 |
| M4 | 620.33200 | 888.54800 |
| M5 | 323.10900 | −384.64500 |
| M6 | 462.76200 | 426.53500 |
| W(WAFER) | ∞ | 0 |

| ASPHERIC COEFFICIENT | K | A | B | C | D | E | F | G |
|---|---|---|---|---|---|---|---|---|
| M1 | −1.74858E+00 | 9.23055E−10 | −2.11112E−14 | 6.26883E−19 | −5.13981E−23 | 4.93156E−27 | −2.75614E−31 | 6.38279E−36 |
| M2 | 1.34777E+01 | −2.39736E−09 | 5.46835E−14 | 1.12216E−17 | −9.34360E−21 | 3.73946E−24 | −7.55884E−28 | 6.15488E−32 |
| M3 | 1.03737E+00 | −2.27691E−09 | −8.91005E−14 | 1.17202E−17 | −8.81984E−22 | 4.05103E−26 | −1.04350E−30 | 1.15546E−35 |
| M4 | −2.54829E−02 | 8.94333E−11 | −2.34462E−15 | 2.18505E−20 | 1.61745E−26 | −2.39650E−30 | 2.05917E−35 | −5.87149E−41 |
| M5 | 3.42381E−01 | −7.90071E−10 | 1.15783E−12 | −8.04750E−17 | 5.00002E−20 | −2.80048E−23 | 8.24008E−27 | −9.64674E−31 |
| M6 | 3.48259E−02 | 3.52475E−11 | 2.12796E−16 | 1.57268E−21 | −5.50112E−27 | 1.06617E−31 | 8.17667E−36 | −1.98359E−40 | of the imaging performance. Therefore, the divergence of the light on M4 becomes appropriate, while the maximum effective diameter is maintained to be 585 mm.

Preferably, the aperture stop is located apart from the first and second reflective surfaces M1 and M2 by a proper distance. In the instant embodiment, the aperture stop is located apart from the first reflective surface M1 by 0.654 Lst, and apart from the second reflective surface M1 by 0.346 Lst, where Lst is an optical path length between the first and second reflective surfaces.

The third reflective surface is a surface that has the largest light incident angle among the six reflective surfaces, which is 27°. The incident angle distribution width is 4.4°. In particular, the small incident angle distribution prevents reductions of the reflectance due to the multilayer coating.

A distance is 321.9 mm between the object surface and the surface apex of the fourth reflective surface as a reflective surface closest to the object surface, providing a sufficient front focus. An interval is 61.4 mm between the surface apex of the second reflective surface and the surface apex of the fourth reflective surface, and an interval is 116 mm between the surface apex of the sixth reflective surface and the surface apex of the first reflective surface as a reflective surface that is closest to the sixth reflective surface. This configuration maintains the space, and facilitates arrangements of various mechanisms, such as a driving mechanism and a cooling mechanism. L1/L2 is 0.830, which is sufficient to provide a reduced incident angle, and a sufficient front focus, where L1 is an interval between the object surface and the surface apex of M4 that is the reflective surface closest to the object surface, and L2 is an interval between the surface apex of M4 that is the reflective surface closest to the object surface and the surface apex of the first reflective surface.

Fifth Embodiment

Figure 5:
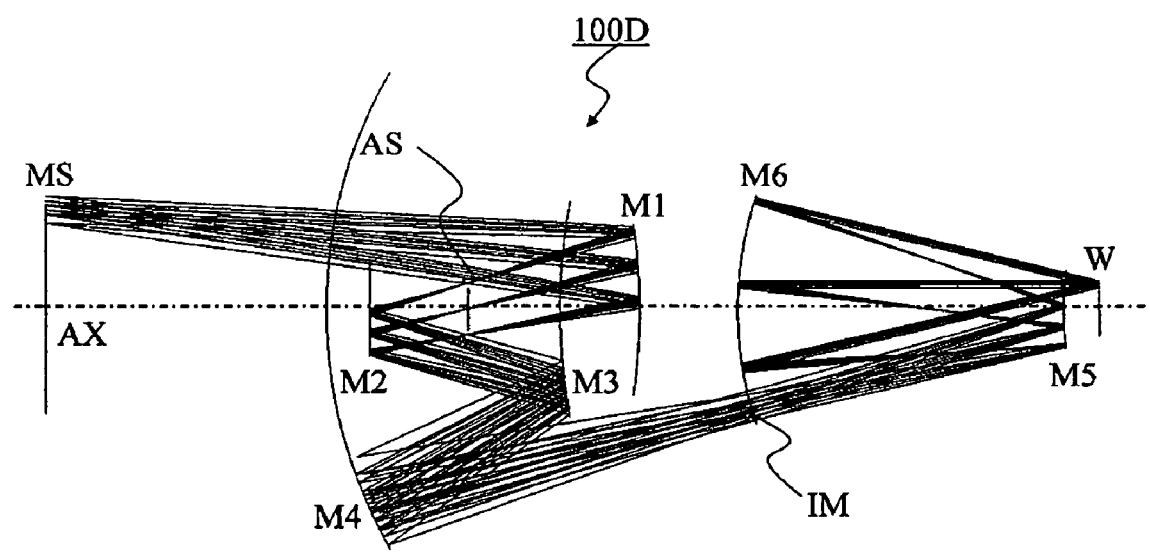
FIG. 5 is a view according to a fifth embodiment of the present invention.

A description will be given of a fifth embodiment of the present invention with reference to FIG. 5 and Table 5. Unless otherwise specified, this embodiment is similar to the first to fourth embodiments.

The overall length of the third embodiment is about 1267.046 mm. A numerical aperture NA at the image side is 0.237, amagnificationis ¼, and an object point is 117.5 to 140.5 mm (while the image side has an arc field with a width of 5.75 mm). The wave front aberration has a RMS of 17.6 mλ, and a static distortion range of 1.5 nm.

An arrangement of the aperture stop between M1 and M2 prevents shielding of the light from the object surface to M1, although the object-side telecentricity is as small as 103 mrad. Since M2 and M3 introduce the light from the aperture stop to M4 apart from the optical axis, a distance between M3 and M4 can be relatively short although the maximum incident angle is maintained to be 27°. This distance and second reflective surface having a convex shape provide an appropriate divergence of the light on the fourth reflective surface M4.

More specifically, the divergence of the light on the fourth surface introduced from the object point of 129 mm is 45.5 mm. This configuration reduces influences of the mirror surface's ripples, air bubbles in the mirror material, mirror's deformations, dust transfers, etc., and prevent deteriorations of the imaging performance. Therefore, the divergence of the light on M4 becomes appropriate, while the maximum effective diameter is maintained to be 585 mm.

Preferably, the aperture stop is located apart from the first and second reflective surfaces M1 and M2 by a proper distance. In the instant embodiment, the aperture stop is located apart from the first reflective surface M1 by 0.656 Lst, and apart from the second reflective surface M1 by 0.344 Lst, where Lst is an optical path length between the first and second reflective surfaces.

The third reflective surface is a surface that has the largest light incident angle among the six reflective surfaces, which is 27°. The incident angle distribution width is 4.8°. In particular, the small incident angle distribution prevents reductions of the reflectance due to the multilayer coating.

A distance is 336.6 mm between the object surface and the surface apex of the fourth reflective surface as a reflective surface closest to the object surface, providing a sufficient front focus. An interval is 52.6 mm between the surface apex of the second reflective surface and the surface apex of the fourth reflective surface, and an interval is 116 mm between the surface apex of the sixth reflective surface and the surface apex of the first reflective surface as a reflective surface that is closest to the sixth reflective surface. This configuration maintains the space, and facilitates arrangements of various mechanisms, such as a driving mechanism and a cooling mechanism. L1/L2 is 0.888, which is sufficient to provide a reduced incident angle, and a sufficient front focus, where L1 is an interval between the object surface and the surface apex of M4 that is the reflective surface closest to the object surface, and L2 is an interval between the surface apex of M4 that is the reflective surface closest to the object surface and the surface apex of the first reflective surface.

The convex surfaces of M2 and M3 enable the intermediate image to form at a position apart from the mirror, and provide an appropriate divergence of the light on the mirror surface. Thereby, this configuration reduces influences of the mirror surface's ripples, air bubbles in the mirror material, mirror's deformations, dust transfers, etc., and prevent deteriorations of the imaging performance. This intermediate image is formed between 0.4×Lim and 0.6×Lim where Lim is an optical path length between the fourth and fifth reflective surfaces.

Sixth Embodiment

Figure 6:
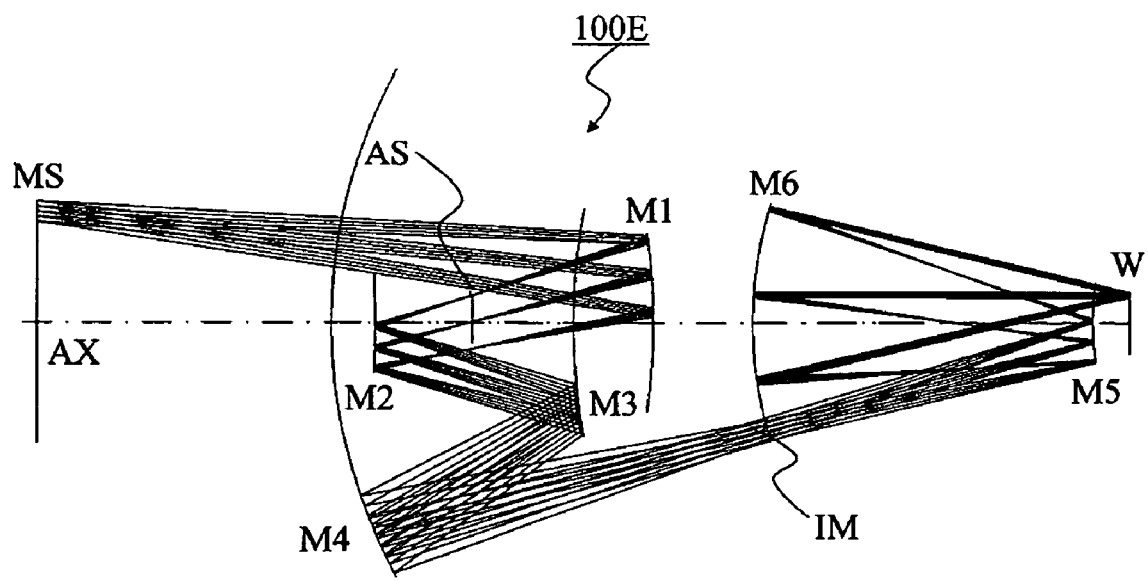
FIG. 6 is a view according to a sixth embodiment of the present invention.

A description will be given of a sixth embodiment of the present invention with reference to FIG. 6 and Table 6. Unless otherwise specified, this embodiment is similar to the first to fifth embodiments.

The overall length of the third embodiment is about 1268.513 mm. A numerical aperture NA at the image side is 0.23, a magnification is ¼, and an object point is 117 to 141 mm (while the image side has an arc field with a width of 6 mm). The wave front aberration has a RMS of 17.0 m$\lambda$, and a static distortion range of 3.0 nm.

An arrangement of the aperture stop between M1 and M2 prevents shielding of the light from the object surface to M1, although the object-side telecentricity is as small as 103 mrad. Since M2 and M3 introduce the light from the aperture stop to M4 apart from the optical axis, a distance between M3 and M4 can be relatively short although the maximum incident angle is maintained to be 27°. This distance and second reflective surface having a convex shape provide an appropriate divergence of the light on the fourth reflective surface M4.

More specifically, the divergence of the light on the fourth surface introduced from the object point of 129 mm is 45.0 mm. This configuration reduces influences of the mirror surface's ripples, air bubbles in the mirror material, mirror's deformations, dust transfers, etc., and prevent deteriorations of the imaging performance. Therefore, the divergence of the light on M4 becomes appropriate, while the maximum effective diameter is maintained to be 585 mm.

Preferably, the aperture stop is located apart from the first and second reflective surfaces M1 and M2 by a proper distance. In the instant embodiment, the aperture stop is located apart from the first reflective surface M1 by 0.659 Lst, and apart from the second reflective surface M1 by 0.341 Lst, where Lst is an optical path length between the first and second reflective surfaces.

The third reflective surface is a surface that has the largest light incident angle among the six reflective surfaces, which is 27°. The incident angle distribution width is 4.9°. In particular, the small incident angle distribution prevents reductions of the reflectance due to the multilayer coating.

TABLE 5

| MIRROR NO. | RADIUS OF CURVATURE. | SURFACE INTERVAL |
|---|---|---|
| M(MASK) | ∞ | 715.81900 |
| M1 | −716.12100 | −214.26900 |
| APERTURE STOP | ∞ | −112.38900 |
| M2 | −1500.0000 | 230.03000 |
| M3 | 700.00000 | −286.61400 |
| M4 | 618.19100 | 888.36900 |
| M5 | 328.80000 | −393.12700 |
| M6 | 471.62300 | 435.12700 |
| W(WAFER) | ∞ | 0 |

| ASPHERIC COEFFICIENT | K | A | B | C | D | E | F | G |
|---|---|---|---|---|---|---|---|---|
| M1 | −1.71111E+00 | 9.12114E−10 | −2.08677E−14 | 5.53638E−19 | −3.84470E−23 | 3.63512E−27 | −1.99427E−31 | 4.40002E−36 |
| M2 | 1.89149E+01 | −2.33866E−09 | 5.14450E−14 | 1.55157E−17 | −1.21994E−20 | 4.85447E−24 | −9.95274E−28 | 8.27121E−32 |
| M3 | 1.14144E+00 | −2.26421E−09 | −9.14399E−14 | 1.17075E−17 | −8.65006E−22 | 3.90349E−26 | −9.88059E−31 | 1.07477E−35 |
| M4 | −2.53894E−02 | 7.08547E−11 | −2.04123E−15 | 1.92894E−20 | 1.31597E−26 | −2.17749E−30 | 1.91061E−35 | −5.55658E−41 |
| M5 | 4.85584E−01 | −1.05702E−09 | 1.10386E−12 | −3.98425E−17 | 1.35295E−20 | −8.97234E−24 | 2.59639E−27 | −2.44935E−31 |
| M6 | 1.86590E−02 | 5.28168E−11 | 2.79824E−16 | 1.75250E−21 | 9.21551E−27 | −1.04462E−30 | 5.23515E−35 | −8.18886E−40 |

A distance is 340.8 mm between the object surface and the surface apex of the fourth reflective surface as a reflective surface closest to the object surface, providing a sufficient front focus. An interval is 50.7 mm between the surface apex of the second reflective surface and the surface apex of the fourth reflective surface, and an interval is 116 mm between the surface apex of the sixth reflective surface and the surface apex of the first reflective surface as a reflective surface that is closest to the sixth reflective surface. This configuration maintains the space, and facilitates arrangements of various mechanisms, such as a driving mechanism and a cooling mechanism. L1/L2 is 0.907, which is sufficient to provide a reduced incident angle, and a sufficient front focus, where L1 is an interval between the object surface and the surface apex of M4 that is the reflective surface closest to the object surface, and L2 is an interval between the surface apex of M4 that is the reflective surface closest to the object surface and the surface apex of the first reflective surface.

Figure 10:
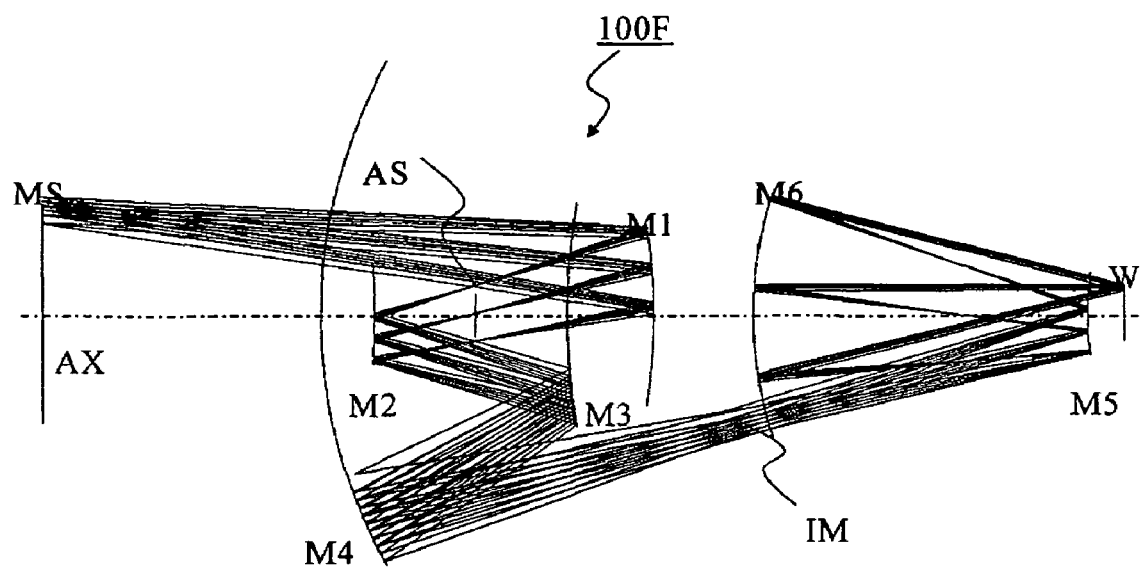
FIG. 10 is a view according to a seventh embodiment of the present invention.

The convex surfaces of M2 and M3 enable the intermediate image to form at a position apart from the mirror, and provide an appropriate divergence of the light on the mirror surface. Thereby, this configuration reduces influences of the mirror surface's ripples, air bubbles in the mirror material, mirror's deformations, dust transfers, etc., and prevent deteriorations of the imaging performance. This intermediate image is formed between 0.4×Lim and 0.6×Lim where Lim is an optical path length between the fourth and fifth reflective surfaces.

face interval shown in Table 7 are [mm]. In FIG. 10, an alternate long and short dash line is an optical axis, and is a line that connects each center of curvature of the first to the sixth reflective surface.

A distance between the object surface and the image surface along the optical axis (overall length) is about 1252.384 in the seventh embodiment. MS is a reflection mask located at an object surface position, and W is a wafer located at an image surface position. The inventive catoptric reduction projection optical system projects the reflection mask illuminated by the illumination optical system onto the wafer as the image surface. A numerical aperture NA at the image side is 0.25, a magnification is ¼, and an object point is 119 to 139 mm (while the image side has an arc field with a width of 5 mm). The wave front aberration has a RMS of 7.2 m$\lambda$, and a static distortion range of 2.7 nm.

An arrangement of the aperture stop between M1 and M2 prevents shielding of the light from the object surface to M1, although the object-side telecentricity is as small as 103 mrad. Since M2 and M3 introduce the light from the aperture stop to M4 apart from the optical axis, a distance between M3 and M4 can be relatively short although the maximum incident angle is maintained to be 27°. This distance and second reflective surface M2 having a convex shape provide an appropriate divergence of the light on the fourth reflective surface M4.

More specifically, the divergence of the light on the fourth reflective surface introduced from the object point of 129 mm

TABLE 6

| MIRROR NO. | RADIUS OF CURVATURE. | SURFACE INTERVAL |
|---|---|---|
| M(MASK) | ∞ | 716.58300 |
| M1 | −717.61400 | −214.40900 |
| APERTURE STOP | ∞ | −110.70300 |
| M2 | −1500.0000 | 231.7600 |
| M3 | 700.00000 | −282.46700 |
| M4 | 617.60500 | 885.74300 |
| M5 | 329.40000 | −393.92900 |
| M6 | 472.31400 | 435.92900 |
| W(WAFER) | ∞ | 0 |

| ASPHERIC COEFFICIENT | K | A | B | C | D | E | F | G |
|---|---|---|---|---|---|---|---|---|
| M1 | −1.74713E+00 | 8.94795B8609E−14 | | 5.70246E−19 | −4.28929E−23 | 4.19048B9871E−31 | | 5.03221E−36 |
| M2 | 2.23191E−01 | −2.26707E−09 | 5.76002E−14 | 1.44486E−17 | −1.25019E−20 | 5.24338E−24 | −1.11928E−27 | 9.61434E−32 |
| M3 | 1.15153E+00 | −2.24785E−09 | −9.21410E−14 | 1.17375E−17 | −8.63698E−22 | 3.88096E−26 | −9.77901E−31 | 1.05773E−35 |
| M4 | −2.50634E−02 | 6.85004E−11 | −1.99900E−15 | 1.90670E−20 | 1.20330E−26 | −2.14854E−30 | 1.89674E−35 | −5.54395E−41 |
| M5 | 4.77515E−01 | −1.01282E−09 | 1.10973E−12 | −4.38480E−17 | 2.22619E−20 | −1.55145E−23 | 4.68958E−27 | −4.86211E−31 |
| M6 | 1.88278E−02 | 5.25050E−11 | 2.76702E−16 | 1.46126E−21 | 4.71248E−26 | −3.74731E−30 | 1.49207E−34 | −2.17320E−39 |

Seventh Embodiment

A description will be given of a seventh embodiment of the present invention with reference to FIG. 10 and Table 7. A catoptric projection optical system 100F of the seventh embodiment includes six mirrors that includes, in order of reflecting the light from the object surface MS, a first reflective surface (concave) M1, a second reflective surface (convex) M2, a third reflective surface (convex) M3, a fourth reflective surface (concave), a fifth reflective surface (convex) MS and a sixth reflective surface (concave) M6. The catoptric projection optical system 100F forms an intermediate image IM between M4 and MS along the optical path, and re-forms the intermediate image IM on the image surface W using the remaining surfaces. Units of a radius of curvature and a suris 45.2 mm. This configuration reduces influences of the mirror surface's ripples, air bubbles in the mirror material, mirror's deformations, dust transfers, etc., and prevent deteriorations of the imaging performance. Moreover, the maximum effective diameter is maintained to be 585 mm.

Preferably, the aperture stop is located apart from the first reflective surface M1 and second reflective surface M2 by a proper distance. In the instant embodiment, the aperture stop is located apart from the first reflective surface M1 by 0.654 Lst, and apart from the second reflective surface M2 by 0.346 Lst, where Lst is the optical axis length between the first reflective surface M1 and second reflective surface M2.

The third reflective surface M3 is a surface that has the largest light incident angle among the six reflective surfaces, which is 27°. The incident angle distribution width is 4.4°.

The small incident angle distribution prevents reductions of the reflectance due to the multilayer coating.

A distance is 321.9 mm between the object surface and the fourth reflective surface M4 as a reflective surface closest to the object surface, providing a sufficient front focus. An interval is 61.4 mm between the surface apex of the second reflective surface M2 and the surface apex of the fourth reflective surface M4, and an interval is 116 mm between the surface apex of the sixth reflective surface M6 and the surface apex of the first reflective surface M1 as a reflective surface that is closest to the sixth reflective surface M6. This configuration secures a sufficient thickness of the mirror and maintains the space, and facilitates arrangements of various mechanisms, such as a driving mechanism and a cooling mechanism. L1/L2 is 0.830, which is sufficient to provide a reduced incident angle, and a sufficient front focus, where L1 is an interval between the object surface and the surface apex of the fourth reflective surface M4 that is the reflective surface closest to the object surface, and L2 is an interval between the surface apex of the fourth reflective surface M4 that is the reflective surface closest to the object surface and the surface apex of the first reflective surface M1.

The convex surfaces of the second reflective surface M2 and the third reflective surface M3 enable the intermediate image IM to form at a position apart from the mirror, and provide an appropriate divergence of the light on the mirror surface. Thereby, this configuration reduces influences of the mirror surface's ripples, air bubbles in the mirror material, mirror's deformations, dust transfers, etc., and prevent deteriorations of the imaging performance. This intermediate image IM is formed between 0.4×Lim and 0.6×Lim where Lim is an optical path length between the fourth reflective surface M4 and fifth reflective surface M5.

Figure 11:
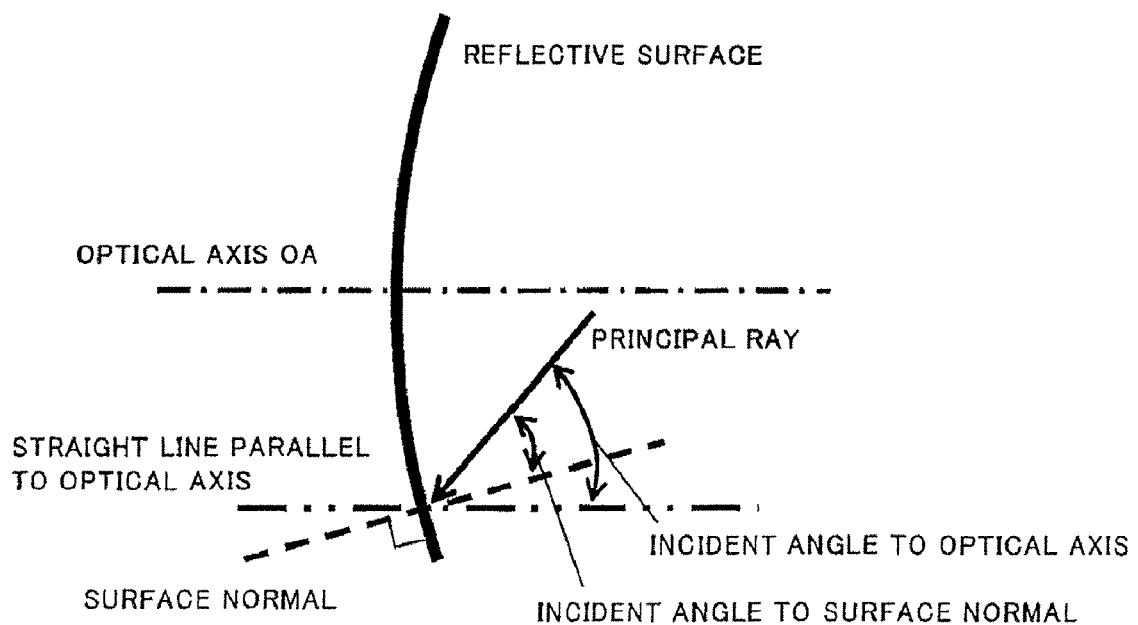
FIG. 11 is a view for explaining an incident angle of light.

An incident angle on each surface of a principal ray from an object point in a center of an arc illuminated area on the object surface is as follows. The incident angle to a surface normal is the maximum in the third reflective surface M3 and the value is as small as 25.1°. Therefore, the aberration decreases and the reductions of the reflectance due to the multilayer coating is prevented. Moreover, since the incident angle gradually increases in order of the first reflective surface M1, the second reflective surface M2 and the third reflective surface M3, the light from the object surface can be introduced to the fourth reflective surface M4 without shielding of the light. FIG. 11 is a view for explaining the incident angle to the surface normal of the fourth reflective surface M4 and the incident angle to the optical axis. The incident angles of other surfaces are similarly defined. The incident angles on each surface to the surface normal are $\theta 11=10.4°$, $\theta 21=16.0°$, $\theta 31=25.1$, $\theta 41=8.6°$, $\theta 51=11.9°$ and $\theta 61=4.0°$. The incident angles on each surface to the optical axis are $\theta 12=5.9°$, $\theta 22=14.9°$, $\theta 32=17.2°$, $\theta 42=32.9°$, $\theta 52=15.7°$ and $\theta 62=8.0°$.

A ratio between absolute values of each surface apex intervals Lb1 to Lb6 and an overall length TT is as follows. The absolute value Lb1 of the surface apex interval between the first reflective surface M1 and the second reflective surface M2 is the maximum of Lb1 and Lb2 and Lb3, and the absolute value Lb2 of the surface apex interval between the second reflective surface M2 and the third reflective surface M3 and the absolute value Lb3 of the surface apex interval between the third reflective surface M3 and the fourth reflective surface M4 are almost same. Thereby, the space for arranging the components can be maintained, the light can be easily reflected without shielding of the light, and the aberration and the property of multilayer coating become advantageous. The ratio between the surface interval and the overall length are Lb1/TT=0.261, Lb2/TT=0.179, Lb3/TT=0.229, Lb0/TT=0.567, Lb4/TT=0.709, Lb5/TT=0.307 and Lb6/TT=0.341.

The radius Rsto of the aperture stop is 32.5 mm and Rsto/NA is 130. The shielding of the light from the object surface to the first reflective surface M1 and the shielding of the light from the second reflective surface M2 to the third reflective surface M3 are prevented by being the radius of the aperture stop to small. Thereby, the large slit width of 5 mm can be realized while maintaining the higher NA of 0.25.

A spread radius SCA2 of light on the second reflective surface M2 is 50.46 mm, a spread radius SCA3 of light on the third reflective surface M3 is 39.60 mm and a spread radius SCA4 of light on the fourth reflective surface M4 is 45.14 mm. Values divided each spread radiuses by the NA of 0.25 at the image side are distributed over a range of 70 to 105, and the optical system that has proper small effective areas of the second to the fourth reflective surface, facilitates the arrangement of components, decreases the maximum effective diameter and reduces the deteriorations of the imaging performance by dust transfers etc., can be realized.

The values of these conditions (values of each conditions of the seventh to thirteenth embodiment) are shown in Table 14 in detail.

In a principal ray from a center object point of 129 mm, a distance La1 between the object point and an intersecting point on the first reflective surface M1 in a direction perpendicular to the optical axis is 72.89 mm, a distance La2 between the intersecting point on the first reflective surface M1 and an intersecting point on the second reflective surface M2 in the direction perpendicular to the optical axis is 86.20 mm, a distance La3 between the intersecting point on the second reflective surface M2 and an intersecting point on the third reflective surface M3 in the direction perpendicular to the optical axis is 71.93 mm, a distance La4 between the intersecting point on the third reflective surface M3 and an intersecting point on the fourth reflective surface M4 in the direction perpendicular to the optical axis is 154.18 mm, and maximum value/minimum value among values divided them by the overall length is 2.14. Maximum value/minimum value among the surface apex interval between the first reflective surface M1 and the second reflective surface M2, the surface apex interval between the second reflective surface M2 and the third reflective surface M3 and the surface apex interval between the third reflective surface M3 and the fourth reflective surface M4 is 2.0 or less.

TABLE 7

| MIRROR NO. | RADIUS OF CURVATURE | SURFACE INTERVAL |
|---|---|---|
| M(MASK) | 0 | 709.84800 |
| M1 | −706.52400 | −213.48700 |
| APERTURE STOP | 0 | −112.96900 |

TABLE 7-continued

|  |  |  |  |
|---|---|---|---|
| M2 | | −1500.0000 | 224.72300 |
| M3 | | 700.00000 | −286.16900 |
| M4 | | 620.33200 | 888.54800 |
| M5 | | 323.10900 | −384.64500 |
| M6 | | 462.76200 | 426.53500 |
| W(WAFER) | | 0 | 0 |

| ASPHERIC COEFFICIENT | K | A | B | C | D | E | F | G |
|---|---|---|---|---|---|---|---|---|
| M1 | −1.74858E+00 | 9.23055E−10 | −2.11112E−14 | 6.26883E−19 | −5.13981E−23 | 4.93156E−27 | −2.75614E−31 | 6.38279E−36 |
| M2 | 1.34777E+01 | −2.39736E−09 | 5.46835E−14 | 1.12216E−17 | −9.34360E−21 | 3.73946E−24 | −7.55884E−28 | 6.15488E−32 |
| M3 | 1.03737E+00 | −2.27691E−09 | −8.91005E−14 | 1.17202E−17 | −8.81984E−22 | 4.05103E−26 | −1.04350E−30 | 1.15546E−35 |
| M4 | −2.54829E−02 | 8.94333E−11 | −2.34462E−15 | 2.18505E−20 | 1.61742526E−30 | | 2.05917E−35 | −5.87149E−41 |
| M5 | 3.42381E−01 | −7.90071E−10 | 1.15783E−12 | −8.04750E−17 | 5.00002BH048E−23 | | 8.24008E−27 | −9.64674E−31 |
| M6 | 3.48259E−02 | 3.52475E−11 | 2.12796E−16 | 1.57268E−21 | −5.50112E−27 | 1.06617E−31 | 8.17667E−36 | −1.98359E−40 |

Eighth Embodiment

Figure 12:
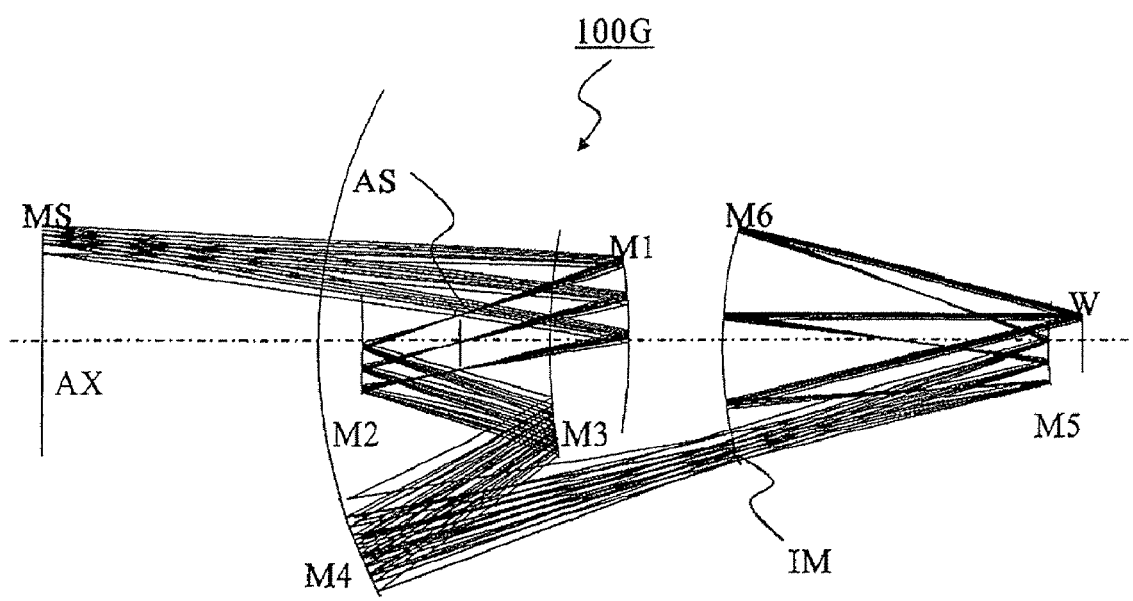
FIG. 12 is a view according to an eighth embodiment of the present invention.

A description will be given of an eighth embodiment of the present invention with reference to FIG. 12 and Table 8. Unless otherwise specified, this embodiment is similar to the seventh embodiment. The overall length of the eighth embodiment is about 1267.046 mm. A numerical aperture NA at the image side is 0.237, a magnification is ¼, and an object point is 117.5 to 140.5 mm (while the image side has an arc field with a width of 5.75 mm). The wave front aberration has a RMS of 17.6 mλ, and a static distortion range of 1.5 nm.

An arrangement of the aperture stop between M1 and M2 prevents shielding of the light from the object surface to M1, although the object-side telecentricity is as small as 103 mrad. Since M2 and M3 introduce the light from the aperture stop to M4 apart from the optical axis, a distance between M3 and M4 can be relatively short although the maximum incident angle is maintained to be 27°. This distance and second reflective surface M2 having a convex shape provide an appropriate divergence of the light on the fourth reflective surface M4.

More specifically, the divergence of the light on the fourth reflective surface introduced from the object point of 129 mm is 45.5 mm. This configuration reduces influences of the mirror surface's ripples, air bubbles in the mirror material, mirror's deformations, dust transfers, etc., and prevent deteriorations of the imaging performance. Moreover, the maximum effective diameter is maintained to be 585 mm.

Preferably, the aperture stop is located apart from the first reflective surface M1 and second reflective surface M2 by a proper distance. In the instant embodiment, the aperture stop is located apart from the first reflective surface M1 by 0.656 Lst, and apart from the second reflective surface M2 by 0.344 Lst, where Lst is the optical axis length between the first reflective surface M1 and second reflective surface M2.

The third reflective surface M3 is a surface that has the largest light incident angle among the six reflective surfaces, which is 27°. The incident angle distribution width is 4.8°. The small incident angle distribution prevents reductions of the reflectance due to the multilayer coating.

A distance is 336.6 mm between the object surface and the fourth reflective surface M4 as a reflective surface closest to the object surface, providing a sufficient front focus. An interval is 52.6 mm between the surface apex of the second reflective surface M2 and the surface apex of the fourth reflective surface M4, and an interval is 116 mm between the surface apex of the sixth reflective surface M6 and the surface apex of the first reflective surface M1 as a reflective surface that is closest to the sixth reflective surface M6. This configuration secures a sufficient thickness of the mirror and maintains the space, and facilitates arrangements of various mechanisms, such as a driving mechanism and a cooling mechanism. L1/L2 is 0.888, which is sufficient to provide a reduced incident angle, and a sufficient front focus, where L1 is an interval between the object surface and the surface apex of the fourth reflective surface M4 that is the reflective surface closest to the object surface, and L2 is an interval between the surface apex of the fourth reflective surface M4 that is the reflective surface closest to the object surface and the surface apex of the first reflective surface M1.

The convex surfaces of the second reflective surface M2 and the third reflective surface M3 enable the intermediate image IM to form at a position apart from the mirror, and provide an appropriate divergence of the light on the mirror surface. Thereby, this configuration reduces influences of the mirror surface's ripples, air bubbles in the mirror material, mirror's deformations, dust transfers, etc., and prevent deteriorations of the imaging performance. This intermediate image IM is formed between 0.4×Lim and 0.6×Lim where Lim is an optical path length between the fourth reflective surface M4 and fifth reflective surface M5.

An incident angle on each surface of a principal ray from an object point in a center of an arc illuminated area on the object surface is as follows. The incident angle to a surface normal is the maximum in the third reflective surface M3 and the value is as small as 24.8°. Therefore, the aberration decreases and the reductions of the reflectance due to the multilayer coating is prevented. Moreover, since the incident angle gradually increases in order of the first reflective surface M1, the second reflective surface M2 and the third reflective surface M3, the light from the object surface can be introduced to the fourth reflective surface M4 without shielding of the light. The incident angles on each surface to the surface normal are θ11=10.3°, θ21=15.8°, θ31=24.8°, θ41=8.6°, θ51=11.7° and θ61=3.9°. The incident angles on each surface to the optical axis are θ12=5.9°, θ22=14.7°, θ32=16.9°, θ42=32.7°, θ52=15.5° and θ62=7.8°.

A ratio between absolute values of each surface apex intervals Lb1 to Lb6 and an overall length TT is as follows. The absolute value Lb1 of the surface apex interval between the first reflective surface M1 and the second reflective surface M2 is the maximum of Lb1 and Lb2 and Lb3, and the absolute value Lb2 of the surface apex interval between the second reflective surface M2 and the third reflective surface M3 and the absolute value Lb3 of the surface apex interval between the third reflective surface M3 and the fourth reflective surface M4 are almost same. Thereby, the space for arranging the components can be maintained, the light can be easily reflected without shielding of the light, and the aberration and the property of multilayer coating become advantageous. The ratio between the surface interval and the overall length are Lb1/TT=0.258, Lb2/TT=0.182, Lb3/TT=0.223, Lb0/TT=0.564, Lb4/TT=0.701, Lb5/TT=0.310 and Lb6/TT=0.343.

The radius Rsto of the aperture stop is 31.23 mm and Rsto/NA is 131.8. The shielding of the light from the object surface to the first reflective surface M1 and the shielding of the light from the second reflective surface M2 to the third reflective surface M3 are prevented by being the radius of the aperture stop to small. Thereby, the large slit width of 5.75 mm can be realized.

A spread radius SCA2 of light on the second reflective surface M2 is 48.91 mm, a spread radius SCA3 of light on the third reflective surface M3 is 38.98 mm and a spread radius SCA4 of light on the fourth reflective surface M4 is 45.51 mm. Values divided each spread radiuses by the NA at the image side of 0.237 are distributed over a range of 70 to 105, and the optical system that has proper small effective areas of the second to the fourth reflective surface, facilitates the arrangement of components, decreases the maximum effective diameter and reduces the deteriorations of the imaging performance by dust transfers etc., can be realized.

In a principal ray from a center object point, a distance La1 between the object point and an intersecting point on the first reflective surface M1 in a direction perpendicular to the optical axis is 73.51 mm, a distance La2 between the intersecting point on the first reflective surface M1 and an intersecting point on the second reflective surface M2 in the direction perpendicular to the optical axis is 84.97 mm, a distance La3 between the intersecting point on the second reflective surface M2 and an intersecting point on the third reflective surface M3 in the direction perpendicular to the optical axis is 72.38 mm, a distance La4 between the intersecting point on the third reflective surface M3 and an intersecting point on the fourth reflective surface M4 in the direction perpendicular to the optical axis is 151.12 mm, and maximum value/minimum value among values divided them by the overall length is 2.09. Maximum value/minimum value among the surface apex interval between the first reflective surface M1 and the second reflective surface M2, the surface apex interval between the second reflective surface M2 and the third reflective surface M3 and the surface apex interval between the third reflective surface M3 and the fourth reflective surface M4 is 2.0 or less.

Ninth Embodiment

Figure 13:
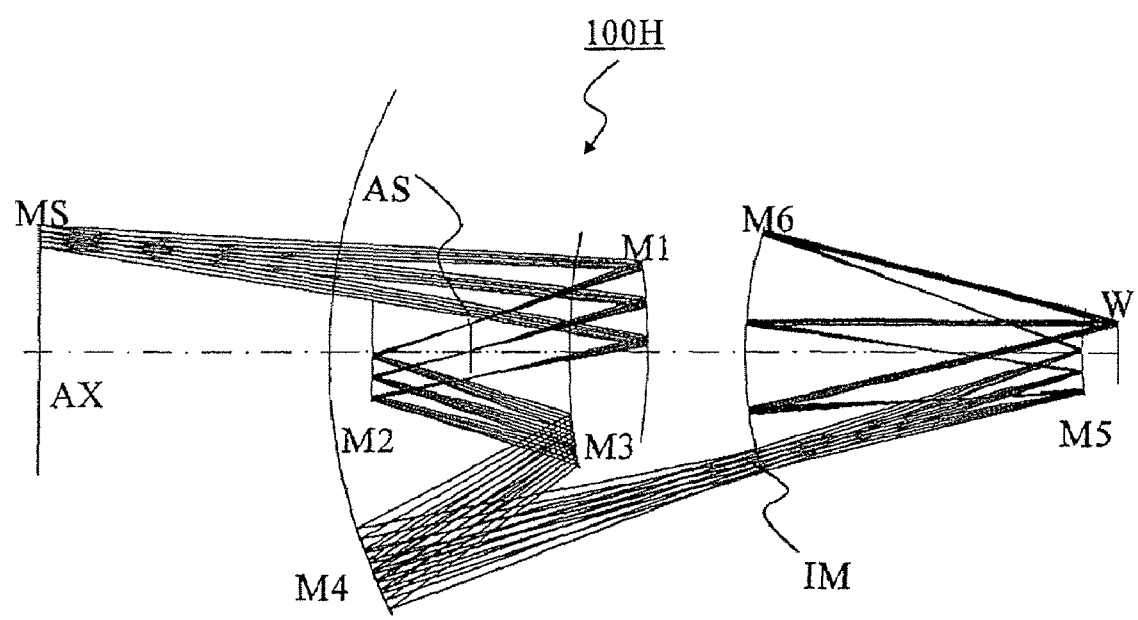
FIG. 13 is a view according to a ninth embodiment of the present invention.

A description will be given of a ninth embodiment of the present invention with reference to FIG. 13 and Table 9. Unless otherwise specified, this embodiment is similar to the seventh and eighth embodiments. The overall length of the ninth embodiment is about 1268.513 mm. A numerical aperture NA at the image side is 0.23, a magnification is ¼, and an object point is 117 to 141 mm (while the image side has an arc field with a width of 6 mm). The wave front aberration has a RMS of 17.0 m$\lambda$, and a static distortion range of 3.0 nm.

An arrangement of the aperture stop between M1 and M2 prevents shielding of the light from the object surface to M1, although the object-side telecentricity is as small as 103 mrad. Since M2 and M3 introduce the light from the aperture stop to M4 apart from the optical axis, a distance between M3 and M4 can be relatively short although the maximum incident angle is maintained to be 27°. This distance and second reflective surface M2 having a convex shape provide an appropriate divergence of the light on the fourth reflective surface M4.

More specifically, the divergence of the light on the fourth reflective surface introduced from the object point of 129 mm is 45.0 mm. This configuration reduces influences of the mirror surface's ripples, air bubbles in the mirror material, mirror's deformations, dust transfers, etc., and prevent deteriorations of the imaging performance. Moreover, the maximum effective diameter is maintained to be 585 mm.

Preferably, the aperture stop is located apart from the first reflective surface M1 and second reflective surface M2 by a proper distance. In the instant embodiment, the aperture stop is located apart from the first reflective surface M1 by 0.659 Lst, and apart from the second reflective surface M2 by 0.341 Lst, where Lst is the optical axis length between the first reflective surface M1 and second reflective surface M2.

The third reflective surface M3 is a surface that has the largest light incident angle among the six reflective surfaces, which is 27°. The incident angle distribution width is 4.9°. The small incident angle distribution prevents reductions of the reflectance due to the multilayer coating.

A distance is 340.8 mm between the object surface and the fourth reflective surface M4 as a reflective surface closest to

TABLE 8

| MIRROR NO. | RADIUS OF CURVATURE | SURFACE INTERVAL |
|---|---|---|
| M(MASK) | 0 | 715.81900 |
| M1 | −716.12100 | −214.26900 |
| APERTURE STOP | 0 | −112.38900 |
| M2 | −1500.0000 | 230.03000 |
| M3 | 700.00000 | −286.61400 |
| M4 | 618.19100 | 888.36900 |
| M5 | 328.80000 | −393.12700 |
| M6 | 471.62300 | 435.12700 |
| W(WAFER) | 0 | 0 |

| ASPHERIC COEFFICIENT | K | A | B | C | D | E | F | G |
|---|---|---|---|---|---|---|---|---|
| M1 | −1.71111E+00 | 9.12114E−10 | −2.08677E−14 | 5.53638E−19 | −3.84470E−23 | 3.63512E−27 | −1.99427E−31 | 4.40002E−36 |
| M2 | 1.89149E+01 | −2.33866E−09 | 5.14450E−14 | 1.55157E−17 | −1.21994E−20 | 4.85447E−24 | −9.95274E−28 | 8.27121E−32 |
| M3 | 1.14144E+00 | −2.26421E−09 | −9.14399E−14 | 1.17075E−17 | −8.65006E−22 | 3.90349E−26 | −9.88059E−31 | 1.07477E−35 |
| M4 | −2.53894E−02 | 7.08547E−11 | −2.04123E−15 | 1.92894E−20 | 1.31597E−26 | −2.17749E−30 | 1.91061E−35 | −5.55658E−41 |
| M5 | 4.85584E−01 | −1.05702E−09 | 1.10386E−12 | −3.98425E−17 | 1.35295E−20 | −8.97234E−24 | 2.59639E−27 | −2.44935E−31 |
| M6 | 1.85590E−02 | 5.28168E−11 | 2.79824E−16 | 1.75250E−21 | 9.21551E−27 | −1.04462E−30 | 5.23515E−35 | −8.18886E−40 | the object surface, providing a sufficient front focus. An interval is 50.7 mm between the surface apex of the second reflective surface M2 and the surface apex of the fourth reflective surface M4, and an interval is 116 mm between the surface apex of the sixth reflective surface M6 and the surface apex of the first reflective surface M1 as a reflective surface that is closest to the sixth reflective surface M6. This configuration secures a sufficient thickness of the mirror and maintains the space, and facilitates arrangements of various mechanisms, such as a driving mechanism and a cooling mechanism. L1/L2 is 0.907, which is sufficient to provide a reduced incident angle, and a sufficient front focus, where L1 is an interval between the object surface and the surface apex of the fourth reflective surface M4 that is the reflective surface closest to the object surface, and L2 is an interval between the surface apex of the fourth reflective surface M4 that is the reflective surface closest to the object surface and the surface apex of the first reflective surface M1.

The convex surfaces of the second reflective surface M2 and the third reflective surface M3 enable the intermediate image IM to form at a position apart from the mirror, and provide an appropriate divergence of the light on the mirror surface. Thereby, this configuration reduces influences of the mirror surface's ripples, air bubbles in the mirror material, mirror's deformations, dust transfers, etc., and prevent deteriorations of the imaging performance. This intermediate image IM is formed between 0.4×Lim and 0.6×Lim where Lim is an optical path length between the fourth reflective surface M4 and fifth reflective surface M5.

An incident angle on each surface of a principal ray from an object point in a center of an arc illuminated area on the object surface is as follows. The incident angle to a surface normal is the maximum in the third reflective surface M3 and the value is as small as 24.7°. Therefore, the aberration decreases and the reductions of the reflectance due to the multilayer coating is prevented. Moreover, since the incident angle gradually increases in order of the first reflective surface M1, the second reflective surface M2 and the third reflective surface M3, the light from the object surface can be introduced to the fourth reflective surface M4 without shielding of the light. The incident angles on each surface to the surface normal are $\theta11=10.3°$, $\theta21=15.8°$, $\theta31=24.7°$, $\theta41=8.5°$, $\theta51=11.6°$ and $\theta61=3.9°$. The incident angles on each surface to the optical axis are $\theta12=5.9°$, $\theta22=14.6°$, $\theta32=16.9°$, $\theta42=32.6°$, $\theta52=15.5°$ and $\theta62=7.8°$.

A ratio between absolute values of each surface apex intervals Lb1 to Lb6 and an overall length TT is as follows. The absolute value Lb1 of the surface apex interval between the first reflective surface M1 and the second reflective surface M2 is the maximum of Lb1 and Lb2 and Lb3, and the absolute value Lb2 of the surface apex interval between the second reflective surface M2 and the third reflective surface M3 and the absolute value Lb3 of the surface apex interval between the third reflective surface M3 and the fourth reflective surface M4 are almost same. Thereby, the space for arranging the components can be maintained, the light can be easily reflected without shielding of the light, and the aberration and the property of multilayer coating become advantageous. The ratio between the surface interval and the overall length are Lb1/TT=0.256, Lb2/TT=0.183, Lb3/TT=0.223, Lb0/TT=0.565, Lb4/TT=0.698, Lb5/TT=0.311 and Lb6/TT=0.344.

The radius Rsto of the aperture stop is 30.4 mm and Rsto/NA is 132. The shielding of the light from the object surface to the first reflective surface M1 and the shielding of the light from the second reflective surface M2 to the third-reflective surface M3 are prevented by being the radius of the aperture stop to small. Thereby, the large slit width of 6 mm can be realized.

A spread radius SCA2 of light on the second reflective surface M2 is 47.86 mm, a spread radius SCA3 of light on the third reflective surface M3 is 38.27 mm and a spread radius SCA4 of light on the fourth reflective surface M4 is 45.0 mm. Values divided each spread radiuses by the NA at the image side of 0.23 are distributed over a range of 70 to 105, and the optical system that has proper small effective areas of the second to the fourth reflective surface, facilitates the arrangement of components, decreases the maximum effective diameter and reduces the deteriorations of the imaging performance by dust transfers etc., can be realized.

In a principal ray from a center object point, a distance La1 between the object point and an intersecting point on the first reflective surface M1 in a direction perpendicular to the optical axis is 73.59 mm, a distance La2 between the intersecting point on the first reflective surface M1 and an intersecting point on the second reflective surface M2 in the direction perpendicular to the optical axis is 84.38 mm, a distance La3 between the intersecting point on the second reflective surface M2 and an intersecting point on the third reflective surface M3 in the direction perpendicular to the optical axis is 72.57 mm, a distance La4 between the intersecting point on the third reflective surface M3 and an intersecting point on the fourth reflective surface M4 in the direction perpendicular to the optical axis is 150.59 mm, and maximum value/minimum value among values divided them by the overall length is 2.07. Maximum value/minimum value among the surface apex interval between the first reflective surface M1 and the second reflective surface M2, the surface apex interval between the second reflective surface M2 and the third reflective surface M3 and the surface apex interval between the third reflective surface M3 and the fourth reflective surface M4 is 2.0 or less.

TABLE 9

| MIRROR NO. | RADIUS OF CURVATURE | SURFACE INTERVAL |
|---|---|---|
| M(MASK) | 0 | 716.58300 |
| M1 | −717.61400 | −214.40800 |
| APERTURE STOP | 0 | −110.70300 |

TABLE 9-continued

|   | | | |
|---|---|---|---|
| M2 | | −1500.0000 | 231.76600 |
| M3 | | 700.00000 | −282.46700 |
| M4 | | 617.60500 | 885.74300 |
| M5 | | 329.40000 | −383.92900 |
| M6 | | 472.31400 | 435.92900 |
| W(WAFER) | | 0 | 0 |

| ASPHERIC COEFFICIENT | K | A | B | C | D | E | F | G |
|---|---|---|---|---|---|---|---|---|
| M1 | −1.74713E+00 | 8.94785E−10 | −2.08679E−14 | 5.70246E−19 | −4.28929E−23 | 4.19048E−27 | −2.90821E−31 | 5.08221E−36 |
| M2 | 2.23191E+01 | −2.26707E−09 | 5.76002E−14 | 1.44486E−17 | −1.25019E−20 | 5.24338E−24 | −1.11928E−27 | 9.61434E−32 |
| M3 | 1.15153E+00 | −2.24785E−09 | −9.21410E−14 | 1.17375E−17 | −8.63698E−22 | 3.88096E−26 | −9.77901E−31 | 1.05773E−35 |
| M4 | −2.50634E−02 | 6.85004E−11 | −1.89900E−15 | 1.90076E−20 | 1.20330E−26 | −2.14654E−30 | 1.89674E−35 | −5.54395E−41 |
| M5 | 4.77515E−01 | −1.01282E−09 | 1.10973E−12 | −4.38480E−17 | 2.22619E−20 | −1.55145E−23 | 4.69858E−27 | −4.86211E−31 |
| M6 | 1.88278E−02 | 5.25050E−11 | 2.76702E−16 | 1.46126E−21 | 4.71248E−26 | −3.74731E−30 | 1.49207E−34 | −2.17320E−39 |

Tenth Embodiment

Figure 14:
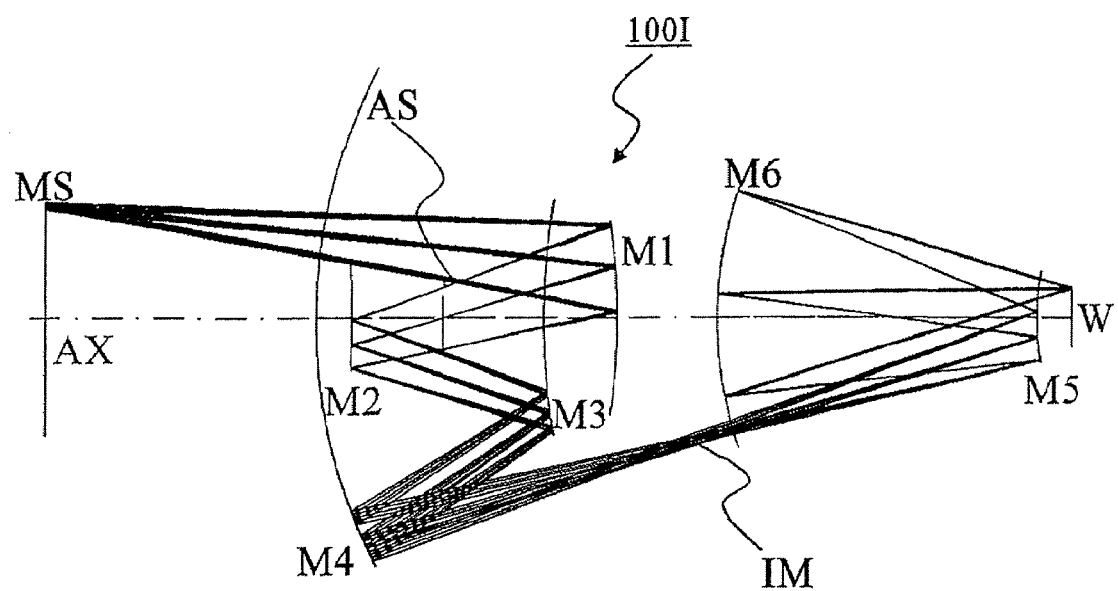
FIG. 14 is a view according to a tenth embodiment of the present invention.

A description will be given of a tenth embodiment of the present invention with reference to FIG. 14 and Table 10. Unless otherwise specified, this embodiment is similar to the seventh to ninth embodiments. The overall length of the tenth embodiment is about 1197.8 mm. A numerical aperture NA at the image side is 0.28, a magnification is ¼, and an object point is 122.75 to 130.75 mm (while the image side has an arc field with a width of 2 mm). The wave front aberration has a RMS of 14.3 mλ, and a static distortion range of 3.0 nm.

An arrangement of the aperture stop between M1 and M2 prevents shielding of the light from the object surface to M1, although the object-side telecentricity is as small as 103 mrad. Since M2 and M3 introduce the light from the aperture stop to M4 apart from the optical axis, a distance between M3 and M4 can be relatively short although the maximum incident angle is maintained to be 27°. This distance and second reflective surface M2 having a convex shape provide an appropriate divergence of the light on the fourth reflective surface M4.

More specifically, the divergence of the light on the fourth reflective surface introduced from the object point of 126.75 mm is 42.4 mm. This configuration reduces influences of the mirror surface's ripples, air bubbles in the mirror material, mirror's deformations, dust transfers, etc., and prevent deteriorations of the imaging performance. Moreover, the maximum effective diameter is maintained to be 550 mm.

Preferably, the aperture stop is located apart from the first reflective surface M1 and second reflective surface M2 by a proper distance. In the instant embodiment, the aperture stop is located apart from the first reflective surface M1 by 0.660 Lst, and apart from the second reflective surface M2 by 0.340 Lst, where Lst is the optical axis length between the first reflective surface M1 and second reflective surface M2.

The third reflective surface M3 is a surface that has the largest light incident angle among the six reflective surfaces, which is 26.9°. The incident angle distribution width is 2.59°. The small incident angle distribution prevents reductions of the reflectance due to the multilayer coating.

A distance is 317.5 mm between the object surface and the fourth reflective surface M4 as a reflective surface closest to the object surface, providing a sufficient front focus. An interval is 42.0 mm between the surface apex of the second reflective surface M2 and the surface apex of the fourth reflective surface M4, and an interval is 118 mm between the surface apex of the sixth reflective surface M6 and the surface apex of the first reflective surface M1 as a reflective surface that is closest to the sixth reflective surface M6. This configuration secures a sufficient thickness of the mirror and maintains the space, and facilitates arrangements of various mechanisms, such as a driving mechanism and a cooling mechanism. L1/L2 is 0.899, which is sufficient to provide a reduced incident angle, and a sufficient front focus, where L1 is an interval between the object surface and the surface apex of the fourth reflective surface M4 that is the reflective surface closest to the object surface, and L2 is an interval between the surface apex of the fourth reflective surface M4 that is the reflective surface closest to the object surface and the surface apex of the first reflective surface M1.

The convex surfaces of the second reflective surface M2 and the third reflective surface M3 enable the intermediate image IM to form at a position apart from the mirror, and provide an appropriate divergence of the light on the mirror surface. Thereby, this configuration reduces influences of the mirror surface's ripples, air bubbles in the mirror material, mirror's deformations, dust transfers, etc., and prevent deteriorations of the imaging performance. This intermediate image IM is formed between 0.4×Lim and 0.6×Lim where Lim is an optical path length between the fourth reflective surface M4 and fifth reflective surface M5.

An incident angle on each surface of a principal ray from an object point in a center of an arc illuminated area on the object surface is as follows. The incident angle to a surface normal is the maximum in the third reflective surface M3 and the value is as small as 26.1°. Therefore, the aberration decreases and the reductions of the reflectance due to the multilayer coating is prevented. Moreover, since the incident angle gradually increases in order of the first reflective surface M1, the second reflective surface M2 and the third reflective surface M3, the light from the object surface can be introduced to the fourth reflective surface M4 without shielding of the light. The incident angles of other surfaces are similarly defined. The incident angles on each surface to the surface normal are θ11=10.8°, θ21=17.0°, θ31=26.1°, θ41=8.8°, θ51=11.9° and θ61=4.2°. The incident angles on each surface to the optical axis are θ12=5.9°, θ22=15.7°, θ32=18.3°, θ42=33.9°, θ52=16.3° and θ62=7.5°.

A ratio between absolute values of each surface apex intervals Lb1 to Lb6 and an overall length TT is as follows. The absolute value Lb1 of the surface apex interval between the first reflective surface M1 and the second reflective surface M2 is the maximum of Lb1 and Lb2 and Lb3, and the absolute value Lb2 of the surface apex interval between the second reflective surface M2 and the third reflective surface M3 and the absolute value Lb3 of the surface apex interval between the third reflective surface M3 and the fourth reflective surface M4 are almost same. Thereby, the space for arranging the components can be maintained, the light can be easily reflected without shielding of the light, and the aberration and the property of multilayer coating become advantageous. The second reflective surface M2 and the third reflective surface M3 and the surface apex interval between the third reflective surface M3 and the fourth reflective surface M4 is 2.0 or less.

TABLE 10

| MIRROR NO. | RADIUS OF CURVATURE | SURFACE INTERVAL |
|---|---|---|
| M(MASK) | 0 | 670.591 |
| M1 | −659.497 | −205.272 |
| APERTURE STOP | 0 | −105.9 |
| M2 | −1352.71 | 224.219 |
| M3 | 735.115 | −268.188 |
| M4 | 592.799 | 841.344 |
| M5 | 298.557 | −370.205 |
| M6 | 443.971 | 409.205 |
| W(WAFER) | 0 | 0 |

| ASPHERIC COEFFICIENT | K | A | B | C | D | E | F | G |
|---|---|---|---|---|---|---|---|---|
| M1 | −1.90456 | 1.14998E−09 | −3.19290E−14 | 9.24465E−19 | −4.64961E−23 | 3.11869E−27 | −1.51805E−31 | 3.40228E−36 |
| M2 | 3.80306 | −2.58172E−09 | 8.59253E−14 | −9.08083E−18 | 2.26366E−21 | 1.71212E−26 | −1.12695E−28 | 1.52308E−32 |
| M3 | 1.03203 | −2.24027E−09 | −7.30454E−14 | 1.13603E−17 | −9.39592E−22 | 4.59950E−26 | −1.23588E−30 | 1.40753E−35 |
| M4 | −0.03503 | 4.40265E−11 | −1.93230E−15 | 2.51443E−20 | −2.81580E−26 | −3.13819E−30 | −3.37014E−35 | −1.12233E−40 |
| M5 | −0.21853 | 3.15240E−10 | 1.68411E−12 | −1.26167E−16 | 5.19924E−23 | −2.12913E−23 | 5.31435E−27 | −5.68060E−31 |
| M6 | 0.00357 | 8.17612E−11 | 4.90594E−16 | 2.08139E−21 | 6.15332E−26 | −1.96376E−30 | 4.65098E−35 | −4.71272E−40 | ratio between the surface interval and the overall length are Lb1/TT=0.260, Lb2/TT=0.187, Lb3/TT=0.222, Lb0/TT=0.560, Lb4/TT=0.702, Lb5/TT=0.309 and Lb6/TT=0.342.

The radius Rsto of the aperture stop is 34.16 mm and Rsto/NA is 122. The shielding of the light from the object surface to the first reflective surface M1 and the shielding of the light from the second reflective surface M2 to the third reflective surface M3 are prevented by being the radius of the aperture stop to small. Thereby, the higher NA of 0.28 can be realized.

A spread radius SCA2 of light on the second reflective surface M2 is 52.89 mm, a spread radius SCA3 of light on the third reflective surface M3 is 40.56 mm and a spread radius SCA4 of light on the fourth reflective surface M4 is 42.43 mm. Values divided each spread radiuses by the NA at the image side of 0.28 are distributed over a range of 70 to 105, and the optical system that has proper small effective areas of the second to the fourth reflective surface, facilitates the arrangement of components, decreases the maximum effective diameter and reduces the deteriorations of the imaging performance by dust transfers etc., can be realized.

In a principal ray from a center object point, a distance La1 between the object point and an intersecting point on the first reflective surface M1 in a direction perpendicular to the optical axis is 69.62 mm, a distance La2 between the intersecting point on the first reflective surface M1 and an intersecting point on the second reflective surface M2 in the direction perpendicular to the optical axis is 87.05 mm, a distance La3 between the intersecting point on the second reflective surface M2 and an intersecting point on the third reflective surface M3 in the direction perpendicular to the optical axis is 76.75 mm, a distance La4 between the intersecting point on the third reflective surface M3 and an intersecting point on the fourth reflective surface M4 in the direction perpendicular to the optical axis is 145.86 mm, and maximum value/minimum value among values divided them by the overall length is 2.10. Maximum value/minimum value among the surface apex interval between the first reflective surface M1 and the second reflective surface M2, the surface apex interval between the second reflective surface M2 and the third reflective surface M3 and the surface apex interval between the third reflective surface M3 and the fourth reflective surface M4 is 2.0 or less.

Eleventh Embodiment

Figure 15:
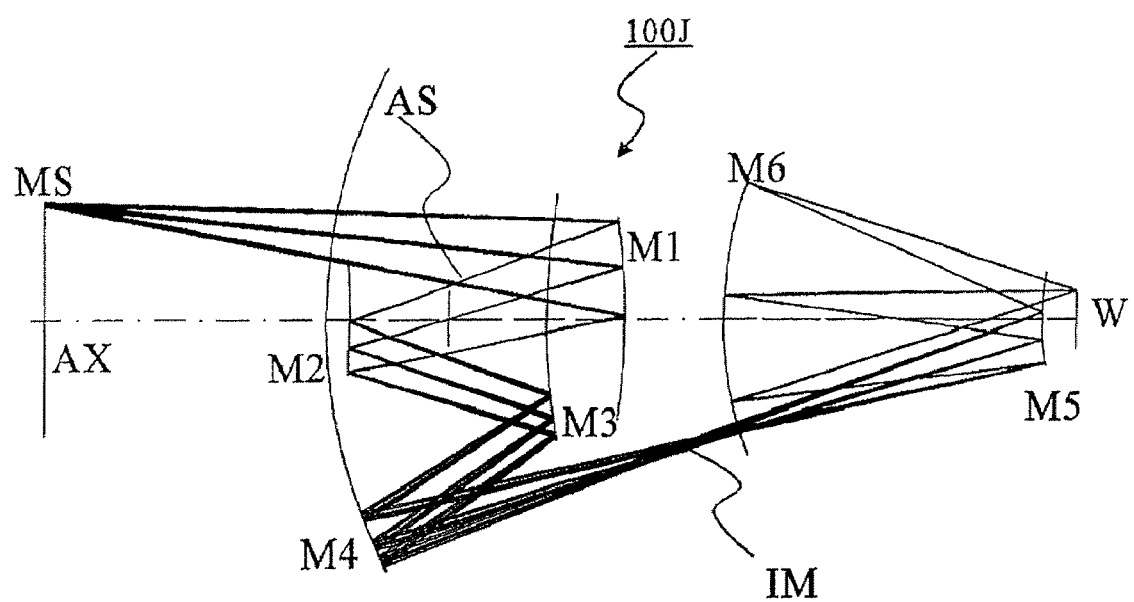
FIG. 15 is a view according to an eleventh embodiment of the present invention.

A description will be given of an eleventh embodiment of the present invention with reference to FIG. 15 and Table 11. Unless otherwise specified, this embodiment is similar to the seventh to tenth embodiments. The overall length of the eleventh embodiment is about 1217.03 mm. A numerical aperture NA at the image side is 0.3, a magnification is ¼, and an object point is 126.8 to 132.8 mm (while the image side has an arc field with a width of 1.5 mm). The wave front aberration has a RMS of 13.6 mλ, and a static distortion range of 3.0 nm.

An arrangement of the aperture stop between M1 and M2 prevents shielding of the light from the object surface to M1, although the object-side telecentricity is as small as 103 mrad. Since M2 and M3 introduce the light from the aperture stop to M4 apart from the optical axis, a distance between M3 and M4 can be relatively short although the maximum incident angle is maintained to be 27°. This distance and second reflective surface M2 having a convex shape provide an appropriate divergence of the light on the fourth reflective surface M4.

More specifically, the divergence of the light on the fourth reflective surface introduced from the object point of 129.8 mm is 49.0 mm. This configuration reduces influences of the mirror surface's ripples, air bubbles in the mirror material, mirror's deformations, dust transfers, etc., and prevent deteriorations of the imaging performance. Moreover, the maximum effective diameter is maintained to be 560 mm.

Preferably, the aperture stop is located apart from the first reflective surface M1 and second reflective surface M2 by a proper distance. In the instant embodiment, the aperture stop is located apart from the first reflective surface M1 by 0.653 Lst, and apart from the second reflective surface M2 by 0.347 Lst, where Lst is the optical axis length between the first reflective surface M1 and second reflective surface M2.

The third reflective surface M3 is a surface that has the largest light incident angle among the six reflective surfaces, which is 27.0°. The incident angle distribution width is 2.06°. The small incident angle distribution prevents reductions of the reflectance due to the multilayer coating.

A distance is 333.3 mm between the object surface and the fourth reflective surface M4 as a reflective surface closest to the object surface, providing a sufficient front focus. An interval is 27.4 mm between the surface apex of the second reflective surface M2 and the surface apex of the fourth reflective surface M4, and an interval is 117 mm between the surface apex of the sixth reflective surface M6 and the surface apex of the first reflective surface M1 as a reflective surface that is closest to the sixth reflective surface M6. This configuration secures a sufficient thickness of the mirror and maintains the space, and facilitates arrangements of various mechanisms, such as a driving mechanism and a cooling mechanism. L1/L2 is 0.941, which is sufficient to provide a reduced incident angle, and a sufficient front focus, where L1 is an interval between the object surface and the surface apex of the fourth reflective surface M4 that is the reflective surface closest to the object surface, and L2 is an interval between the surface apex of the fourth reflective surface M4 that is the reflective surface closest to the object surface and the surface apex of the first reflective surface M1.

The convex surfaces of the second reflective surface M2 and the third reflective surface M3 enable the intermediate image IM to form at a position apart from the mirror, and provide an appropriate divergence of the light on the mirror surface. Thereby, this configuration reduces influences of the mirror surface's ripples, air bubbles in the mirror material, mirror's deformations, dust transfers, etc., and prevent deteriorations of the imaging performance. This intermediate image IM is formed between 0.4×Lim and 0.6×Lim where Lim is an optical path length between the fourth reflective surface M4 and fifth reflective surface M5.

An incident angle on each surface of a principal ray from an object point in a center of an arc illuminated area on the object surface is as follows. The incident angle to a surface normal is the maximum in the third reflective surface M3 and the value is as small as 23°. Therefore, the aberration decreases and the reductions of the reflectance due to the multilayer coating is prevented. Moreover, since the incident angle gradually increases in order of the first reflective surface M1, the second reflective surface M2 and the third reflective surface M3, the light from the object surface can be introduced to the fourth reflective surface M4 without shielding of the light. The incident angles on each surface to the surface normal are $\theta11$=10.8°, $\theta21$=17.1°, $\theta31$=26.4°, $\theta41$=8.8°, $\theta51$=12.1° and $\theta61$=4.2. The incident angles on each surface to the optical axis are $\theta12$=5.9°, $\theta22$=15.7°, $\theta32$=18.6°, $\theta42$=34.2°, $\theta52$=16.6° and $\theta62$=7.7°.

A ratio between absolute values of each surface apex intervals Lb1 to Lb6 and an overall length TT is as follows. The absolute value Le1 of the surface apex interval between the first reflective surface M1 and the second reflective surface M2 is the maximum of Lb1 and Lb2 and Lb3, and the absolute value Lb2 of the surface apex interval between the second reflective surface M2 and the third reflective surface M3 and the absolute value Lb3 of the surface apex interval between the third reflective surface M3 and the fourth reflective surface M4 are almost same. Thereby, the space for arranging the components can be maintained, the light can be easily reflected without shielding of the light, and the aberration and the property of multilayer coating become advantageous. The ratio between the surface interval and the overall length are Lb1/TT=0.268, Lb2/TT=0.192, Lb3/TT=0.215, Lb0/TT=0.565, Lb4/TT=0.694, Lb5/TT=0.307 and Lb6/TT=0.339.

The radius Rsto of the aperture stop is 37.53 mm and Rsto/NA is 125. The shielding of the light from the object surface to the first reflective surface M1 and the shielding of the light from the second reflective surface M2 to the third reflective surface M3 are prevented by being the radius of the aperture stop to small. Thereby, the higher NA of 0.3 can be realized.

A spread radius SCA2 of light on the second reflective surface M2 is 57.69 mm, a spread radius SCA3 of light on the third reflective surface M3 is 45.98 mm and a spread radius SCA4 of light on the fourth reflective surface M4 is 49.04 mm. Values divided each spread radiuses by the NA at the image side of 0.3 are distributed over a range of 70 to 105, and the optical system that has proper small effective areas of the second to the fourth reflective surface, facilitates the arrangement of components, decreases the maximum effective diameter and reduces the deteriorations of the imaging performance by dust transfers etc., can be realized.

In a principal ray from a center object point, a distance La1 between the object point and an intersecting point on the first reflective surface M1 in a direction perpendicular to the optical axis is 70.63 mm, a distance La2 between the intersecting point on the first reflective surface M1 and an intersecting point on the second reflective surface M2 in the direction perpendicular to the optical axis is 90.63 mm, a distance La3 between the intersecting point on the second reflective surface M2 and an intersecting point on the third reflective surface M3 in the direction perpendicular to the optical axis is 80.89 mm, a distance La4 between the intersecting point on the third reflective surface M3 and an intersecting point on the fourth reflective surface M4 in the direction perpendicular to the optical axis is 143.01 mm, and maximum value/minimum value among values divided them by the overall length is 2.03. Maximum value/minimum value among the surface apex interval between the first reflective surface M1 and the second reflective surface M2, the surface apex interval between the second reflective surface M2 and the third reflective surface M3 and the surface apex interval between the third reflective surface M3 and the fourth reflective surface M4 is 2.0 or less.

TABLE 11

| MIRROR NO. | RADIUS OF CURVATURE | SURFACE INTERVAL |
| --- | --- | --- |
| M(MASK) | 0 | 687.366 |
| M1 | −681.249 | −213.179 |
| APERTURE STOP | 0 | −113.491 |
| M2 | −128.27 | 234.023 |
| M3 | 779.994 | −261.46 |
| M4 | 597.538 | 844.271 |

TABLE 11-continued

|   | M5 | 301.975 | −373.163 |
|---|---|---|---|
|   | M6 | 447.301 | 412.663 |
|   | W(WAFER) | 0 | 0 |

| ASPHERIC COEFFICIENT | K | A | B | C | D | E | F | G |
|---|---|---|---|---|---|---|---|---|
| M1 | −2.02386 | 1.00748E−09 | −2.82721E−14 | 6.72320E−19 | −1.62257E−23 | 2.52910E−28 | 2.36658E−33 | −1.05321E−37 |
| M2 | −102.576 | −7.93468E−09 | 2.57476E−13 | −1.76631E−17 | 5.16720E−21 | −1.17785E−24 | 1.45201E−28 | −7.14830E−33 |
| M3 | 2.029 | −1.75137E−09 | −1.19223E−13 | 1.39221E−17 | −9.58400E−22 | 3.99838E−26 | −9.26698E−31 | 9.18349E−38 |
| M4 | −0.019234 | 4.64214E−11 | −1.93545E−15 | 2.30505E−20 | −2.49297E−26 | −2.55693E−30 | 2.62026E−35 | −8.30837E−41 |
| M5 | 1.3855 | −7.42065E−09 | 1.53204E−12 | −7.41294E−17 | 3.69137E−21 | 2.39456E−24 | −8.42619E−28 | 8.92952E−32 |
| M6 | 0.0201243 | 5.37511E−11 | 3.39841E−18 | 1.95344E−21 | −1.45311E−26 | 1.79966E−30 | −5.51264E−35 | 6.61191E−40 |

Twelfth Embodiment

Figure 16:
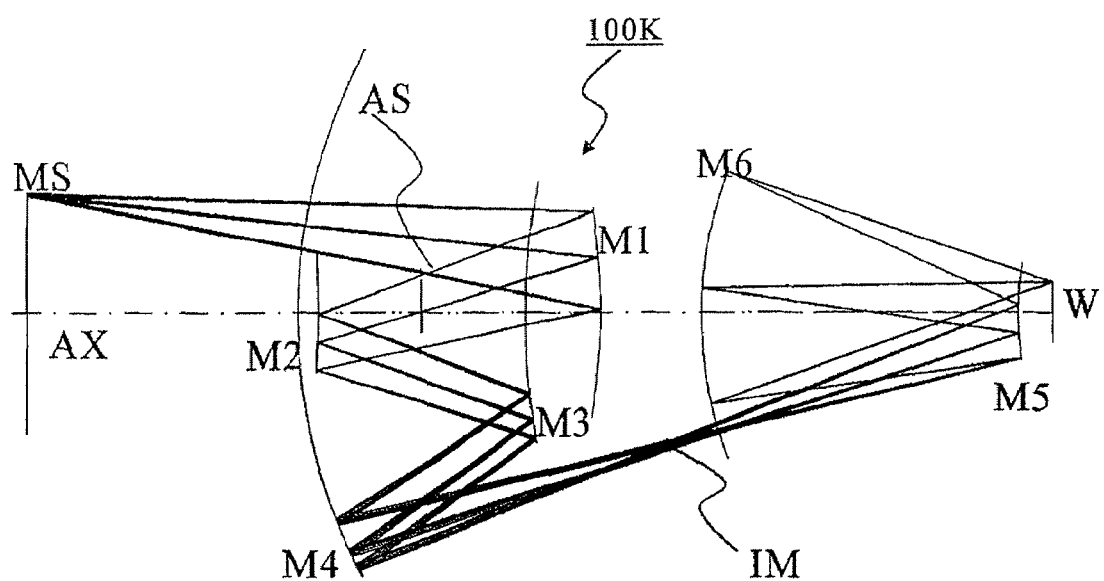
FIG. 16 is a view according to a twelfth embodiment of the present invention.

A description will be given of a twelfth embodiment of the present invention with reference to FIG. 16 and Table 12. Unless otherwise specified, this embodiment is similar to the seventh to eleventh embodiment. The overall length of the twelfth embodiment is about 1177.13 mm. A numerical aperture NA at the image side is 0.32, a magnification is ¼, and an object point is 128.5 to 132.5 mm (while the image side has an arc field with a width of 1 mm). The wave front aberration has a RMS of 14.2 mλ, and a static distortion range of 1.7 nm.

An arrangement of the aperture stop between M1 and M2 prevents shielding of the light from the object surface to M1, although the object-side telecentricity is as small as 107 mrad. Since M2 and M3 introduce the light from the aperture stop to M4 apart from the optical axis, a distance between M3 and M4 can be relatively short although the maximum incident angle is maintained to be 27°. This distance and second reflective surface M2 having a convex shape provide an appropriate divergence of the light on the fourth reflective surface M4.

More specifically, the divergence of the light on the fourth reflective surface introduced from the object point of 130.5 mm is 50.2 mm. This configuration reduces influences of the mirror surface's ripples, air bubbles in the mirror material, mirror's deformations, dust transfers, etc., and prevent deteriorations of the imaging performance. Moreover, the maximum effective diameter is maintained to be 568 mm.

Preferably, the aperture stop is located apart from the first reflective surface M1 and second reflective surface M2 by a proper distance. In the instant embodiment, the aperture stop is located apart from the first reflective surface M1 by 0.645 Lst, and apart from the second reflective surface M2 by 0.355 Lst, where Lst is the optical axis length between the first reflective surface M1 and second reflective surface M2.

The third reflective surface M3 is a surface that has the largest light incident angle among the six reflective surfaces, which is 27.1°. The incident angle distribution width is 1.80°. The small incident angle distribution prevents reductions of the reflectance due to the multilayer coating.

A distance is 311.2 mm between the object surface and the fourth reflective surface M4 as a reflective surface closest to the object surface, providing a sufficient front focus. An interval is 22.8 mm between the surface apex of the second reflective surface M2 and the surface apex of the fourth reflective surface M4, and an interval is 116 mm between the surface apex of the sixth reflective surface M6 and the surface apex of the first reflective surface M1 as a reflective surface that is closest to the sixth reflective surface M6. This configuration secures a sufficient thickness of the mirror and maintains the space, and facilitates arrangements of various mechanisms, such as a driving mechanism and a cooling mechanism. L1/L2 is 0.892, which is sufficient to provide a reduced incident angle, and a sufficient front focus, where L1 is an interval between the object surface and the surface apex of the fourth reflective surface M4 that is the reflective surface closest to the object surface, and L2 is an interval between the surface apex of the fourth reflective surface M4 that is the reflective surface closest to the object surface and the surface apex of the first reflective surface M1.

The convex surfaces of the second reflective surface M2 and the third reflective surface M3 enable the intermediate image IM to form at a position apart from the mirror, and provide an appropriate divergence of the light on the mirror surface. Thereby, this configuration reduces influences of the mirror surface's ripples, air bubbles in the mirror material, mirror's deformations, dust transfers, etc., and prevent deteriorations of the imaging performance. This intermediate image IM is formed between 0.4×Lim and 0.6×Lim where Lim is an optical path length between the fourth reflective surface M4 and fifth reflective surface M5.

An incident angle on each surface of a principal ray from an object point in a center of an arc illuminated area on the object surface is as follows. The incident angle to a surface normal is the maximum in the third reflective surface M3 and the value is as small as 26.7°. Therefore, the aberration decreases and the reductions of the reflectance due to the multilayer coating is prevented. Moreover, since the incident angle gradually increases in order of the first reflective surface M1, the second reflective surface M2 and the third reflective surface M3, the light from the object surface can be introduced to the fourth reflective surface M4 without shielding of the light. The incident angles of other surfaces are similarly defined. The incident angles on each surface to the surface normal are θ11=11.1°, θ21=17.4°, θ31=26.7°, θ41=8.6°, θ51=12.7° and θ61=4.4°. The incident angles on each surface to the optical axis are θ12=6.1°, θ22=16.1°, θ32=18.7°, θ42=34.7°, θ52=17.4° and θ62=7.9°.

A ratio between absolute values of each surface apex intervals Lb1 to Lb6 and an overall length TT is as follows. The absolute value Lb1 of the surface apex interval between the first reflective surface M1 and the second reflective surface M2 is the maximum of Lb1 and Lb2 and Lb3, and the absolute value Lb2 of the surface apex interval between the second reflective surface M2 and the third reflective surface M3 and the absolute value Lb3 of the surface apex interval between the third reflective surface M3 and the fourth reflective surface M4 are almost same. Thereby, the space for arranging the components can be maintained, the light can be easily reflected without shielding of the light, and the aberration and the property of multilayer coating become advantageous. The ratio between the surface interval and the overall length are Lb1/TT=0.278, Lb2/TT=0.204, Lb3/TT=0.224, Lb0/TT=0.562, Lb4/TT=0.702, Lb5/TT=0.306 and Lb6/TT=0.339.

The radius Rsto of the aperture stop is 39.5 mm and Rsto/NA is 123.4. The shielding of the light from the object surface to the first reflective surface M1 and the shielding of the light from the second reflective surface M2 to the third reflective surface M3 are prevented by being the radius of the aperture stop to small. Thereby, the higher NA of 0.32 can be realized.

A spread radius SCA2 of light on the second reflective surface M2 is 61.34 mm, a spread radius SCA3 of light on the third reflective surface M3 is 47.94 mm and a spread radius SCA4 of light on the fourth reflective surface M4 is 50.19 mm. Values divided each spread radiuses by the NA at the image side of 0.32 are distributed over a range of 70 to 105, and the optical system that has proper small effective areas of the second to the fourth reflective surface, facilitates the arrangement of components, decreases the maximum effective diameter and reduces the deteriorations of the imaging performance by dust transfers etc., can be realized.

In a principal ray from a center object point, a distance La1 between the object point and an intersecting point on the first reflective surface M1 in a direction perpendicular to the optical axis is 70.47 mm, a distance La2 between the intersecting point on the first reflective surface M1 and an intersecting point on the second reflective surface M2 in the direction perpendicular to the optical axis is 93.56 mm, a distance La3 between the intersecting point on the second reflective surface M2 and an intersecting point on the third reflective surface M3 in the direction perpendicular to the optical axis is 84.53 mm, a distance La4 between the intersecting point on the third reflective surface M3 and an intersecting point on the fourth reflective surface M4 in the direction perpendicular to the optical axis is 145.84 mm, and maximum value/minimum value among values divided them by the overall length is 2.07. Maximum value/minimum value among the surface apex interval between the first reflective surface M1 and the second reflective surface M2, the surface apex interval between the second reflective surface M2 and the third reflective surface M3 and the surface apex interval between the third reflective surface M3 and the fourth reflective surface M4 is 2.0 or less.

Thirteenth Embodiment

Figure 17:
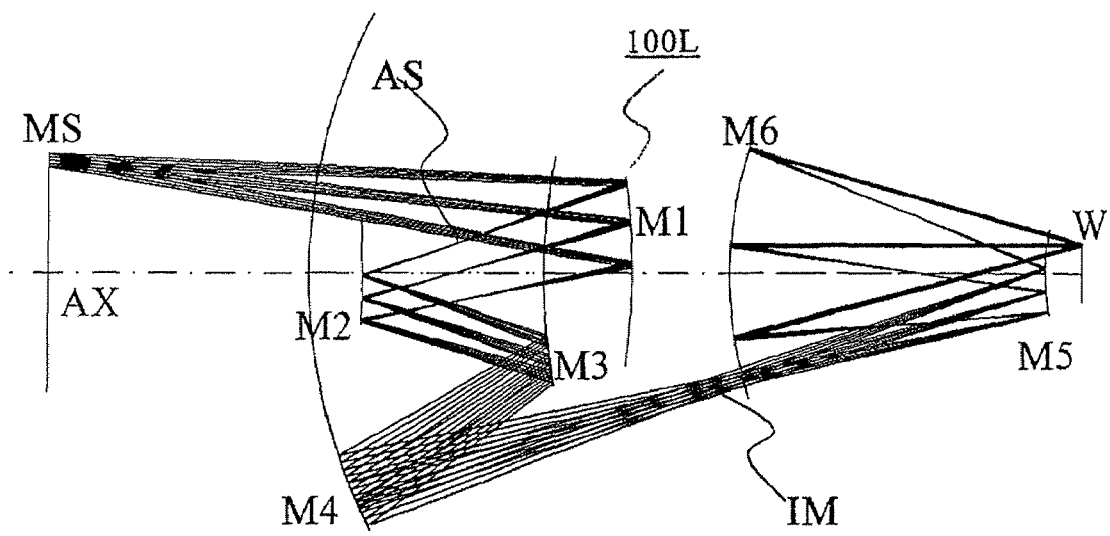
FIG. 17 is a view according to a thirteenth embodiment of the present invention.

A description will be given of a thirteenth embodiment of the present invention with reference to FIG. 17 and Table 13. Unless otherwise specified, this embodiment is similar to the seventh to twelfth embodiments. The overall length of the thirteenth embodiment is about 1231.8 mm. A numerical aperture NA at the image side is 0.26, a magnification is ¼, and an object point is 121 to 137 mm (while the image side has an arc field with a width of 4 mm). The wave front aberration has a RMS of 15.6 mλ, and a static distortion range of 4.0 nm.

An arrangement of the aperture stop between M1 and M2 prevents shielding of the light from the object surface to M1, although the object-side telecentricity is as small as 103 mrad. Since M2 and M3 introduce the light from the aperture stop to M4 apart from the optical axis, a distance between M3 and M4 can be relatively short although the maximum incident angle is maintained to be 27°. This distance and second reflective surface M2 having a convex shape provide an appropriate divergence of the light on the fourth reflective surface M4.

More specifically, the divergence of the light on the fourth reflective surface introduced from the object point of 129 mm is 49.7 mm. This configuration reduces influences of the mirror surface's ripples, air bubbles in the mirror material, mirror's deformations, dust transfers, etc., and prevent deteriorations of the imaging performance. Moreover, the maximum effective diameter is maintained to be 582 mm.

Preferably, the aperture stop is located apart from the first reflective surface M1 and second reflective surface M2 by a proper distance. In the instant embodiment, the aperture stop is located apart from the first reflective surface M1 by 0.657 Lst, and apart from the second reflective surface M2 by 0.343 Lst, where Lst is the optical axis length between the first reflective surface M1 and second reflective surface M2.

The third reflective surface M3 is a surface that has the largest light incident angle among the six reflective surfaces, which is 27°. The incident angle distribution width is 3.50°. The small incident angle distribution prevents reductions of the reflectance due to the multilayer coating.

A distance is 309.8 mm between the object surface and the fourth reflective surface M4 as a reflective surface closest to

TABLE 12

| MIRROR NO. | RADIUS OF CURVATURE | SURFACE INTERVAL |
|---|---|---|
| M(MASK) | 0 | 661.818 |
| M1 | −679.127 | −211.073 |
| APERTURE STOP | 0 | −116.028 |
| M2 | −1462.34 | 240.694 |
| M3 | 802.546 | −263.48 |
| M4 | 600.293 | 826.391 |
| M5 | 285.822 | −360.504 |
| M6 | 431.98 | 399.309 |
| W(WAFER) | 0 | 0 |

| ASPHERIC COEFFICIENT | K | A | B | C | D | E | F | G |
|---|---|---|---|---|---|---|---|---|
| M1 | −2.09435 | 1.13471E−09 | −3.50912E−14 | 9.98832E−19 | −3.73070E−23 | 1.59418E−27 | −5.20263E−32 | 8.46553E−37 |
| M2 | −90.7449 | −4.76165E−09 | 1.44614E−13 | −1.24484E−17 | 5.27782E−21 | −1.33171E−24 | 1.78795E−28 | −9.93668E−33 |
| M3 | 2.81481 | −1.35562E−09 | −1.39699E−13 | 1.45038E−17 | −9.13239E−22 | 3.49577E−26 | −7.45019E−31 | 6.79290E−36 |
| M4 | 0.0074938 | 6.81806E−11 | −2.19603E−15 | 2.21401E−20 | −1.05492E−27 | −2.24637E−30 | 1.98167E−35 | −5.36173E−41 |
| M5 | 1.34634 | −8.23739E−09 | 1.91735E−12 | −1.17376E−16 | 2.13264E−20 | −4.69506E−24 | 8.47833E−28 | −7.51998E−32 |
| M6 | 0.014386 | −6.58163E−11 | 4.41337E−16 | 2.44618E−26 | 2.21444E−26 | −3.62807E−31 | 1.31309E−35 | −1.41058E−40 | the object surface, providing a sufficient front focus. An interval is 64.0 mm between the surface apex of the second reflective surface M2 and the surface apex of the fourth reflective surface M4, and an interval is 116 mm between the surface apex of the sixth reflective surface M6 and the surface apex of the first reflective surface M1 as a reflective surface that is closest to the sixth reflective surface M6. This configuration secures a sufficient thickness of the mirror and maintains the space, and facilitates arrangements of various mechanisms, such as a driving mechanism and a cooling mechanism. L1/L2 is 0.794, which is sufficient to provide a reduced incident angle, and a sufficient front focus, where L1 is an interval between the object surface and the surface apex of the fourth reflective surface M4 that is the reflective surface closest to the object surface, and L2 is an interval between the surface apex of the fourth reflective surface M4 that is the reflective surface closest to the object surface and the surface apex of the first reflective surface M1.

The convex surfaces of the second reflective surface M2 and the third reflective surface M3 enable the intermediate image IM to form at a position apart from the mirror, and provide an appropriate divergence of the light on the mirror surface. Thereby, this configuration reduces influences of the mirror surface's ripples, air bubbles in the mirror material, mirror's deformations, dust transfers, etc., and prevent deteriorations of the imaging performance. This intermediate image IM is formed between 0.4×Lim and 0.6×Lim where Lim is an optical path length between the fourth reflective surface M4 and fifth reflective surface M5.

An incident angle on each surface of a principal ray from an object point in a center of an arc illuminated area on the object surface is as follows. The incident angle to a surface normal is the maximum in the third reflective surface M3 and the value is as small as 25.4°. Therefore, the aberration decreases and the reductions of the reflectance due to the multilayer coating is prevented. Moreover, since the incident angle gradually increases in order of the first reflective surface M1, the second reflective surface M2 and the third reflective surface M3, the light from the object surface can be introduced to the fourth reflective surface M4 without shielding of the light. The incident angles of other surfaces are similarly defined. The incident angles on each surface to the surface normal are θ11=10.5°, θ21=16.3°, θ31=25.4°, θ41=8.7°, θ51=12.0° and θ61=4.1°. The incident angles on each surface to the optical axis are θ12=5.9°, θ22=15.1°, θ32=17.5°, θ42=33.3°, θ52=15.9° and θ62=8.1°.

A ratio between absolute values of each surface apex intervals Lb1 to Lb6 and an overall length TT is as follows. The absolute value Lb1 of the surface apex interval between the first reflective surface M1 and the second reflective surface M2 is the maximum of Lb1 and Lb2 and Lb3, and the absolute value Lb2 of the surface apex interval between the second reflective surface M2 and the third reflective surface M3 and the absolute value Lb3 of the surface apex interval between the third reflective surface M3 and the fourth reflective surface M4 are almost same. Thereby, the space for arranging the components can be maintained, the light can be easily reflected without shielding of the light, and the aberration and the property of multilayer coating become advantageous. The ratio between the surface interval and the overall length are Lb1/TT=0.265, Lb2/TT=0.179, Lb3/TT=0.230, Lb0/TT=0.568, Lb4/TT=0.713, Lb5/TT=0.302 and Lb6/TT=0.338.

The radius Rsto of the aperture stop is 33.65 mm and Rsto/NA is 129. The shielding of the light from the object surface to the first reflective surface M1 and the shielding of the light from the second reflective surface M2 to the third reflective surface M3 are prevented by being the radius of the aperture stop to small. Thereby, the large slit width of 4 mm can be realized while maintaining the higher NA of 0.26.

A spread radius SCA2 of light on the second reflective surface M2 is 52.11 mm, a spread radius SCA3 of light on the third reflective surface M3 is 41.35 mm and a spread radius SCA4 of light on the fourth reflective surface M4 is 47.49 mm. Values divided each spread radiuses by the NA at the image side of 0.26 are distributed over a range of 70 to 105, and the optical system that has proper small effective areas of the second to the fourth reflective surface, facilitates the arrangement of components, decreases the maximum effective diameter and reduces the deteriorations of the imaging performance by dust transfers etc., can be realized.

In a principal ray from a center object point, a distance La1 between the object point and an intersecting point on the first reflective surface M1 in a direction perpendicular to the optical axis is 72.49 mm, a distance La2 between the intersecting point on the first reflective surface M1 and an intersecting point on the second reflective surface M2 in the direction perpendicular to the optical axis is 87.13 mm, a distance La3 between the intersecting point on the second reflective surface M2 and an intersecting point on the third reflective surface M3 in the direction perpendicular to the optical axis is 73.12 mm, a distance La4 between the intersecting point on the third reflective surface M3 and an intersecting point on the fourth reflective surface M4 in the direction perpendicular to the optical axis is 155.32 mm, and maximum value/minimum value among values divided them by the overall length is 2.14. Maximum value/minimum value among the surface apex interval between the first reflective surface M1 and the second reflective surface M2, the surface apex interval between the second reflective surface M2 and the third reflective surface M3 and the surface apex interval between the third reflective surface M3 and the fourth reflective surface M4 is 2.0 or less.

TABLE 13

| MIRROR NO. | RADIUS OF CURVATURE | SURFACE INTERVAL |
|---|---|---|
| M(MASK) | 0 | 699.837 |
| M1 | −702.313 | −214.261 |
| APERTURE STOP | 0 | −111.81 |
| M2 | −1439.7 | 220.059 |
| M3 | 697.033 | −284.029 |
| M4 | 614.085 | 878.59 |
| M5 | 317.899 | −372.549 |
| M6 | 450.292 | 415.949 |
| W(WAFER) | 0 | 0 |

TABLE 13-continued

| ASPHERIC COEFFICIENT | K | A | B | C | D | E | F | G |
|---|---|---|---|---|---|---|---|---|
| M1 | −1.68182 | 9.55118E−10 | −2.11338E−14 | 5.23131E−19 | −2.80887E−23 | 2.18057E−27 | −1.10436E−31 | 2.38501E−36 |
| M2 | 10.2595 | −2.23025E−09 | 7.71679E−14 | −9.73737E−18 | 2.12343E−21 | 1.07361E−25 | −1.30184E−28 | 1.62084E−32 |
| M3 | 0.945906 | −2.28816E−09 | −8.97921E−14 | 1.22418E−17 | −9.43003E−22 | 4.40866E−26 | −1.15116E−30 | 1.28818E−35 |
| M4 | −0.01009 | 7.43259E−11 | −2.23280E−15 | 2.05738E−20 | 2.01255E−26 | −2.37660E−30 | 2.03987E−35 | −5.83160E−41 |
| M5 | 0.248075 | −4.75145E−10 | 1.23412E−12 | −5.43969E−17 | 1.55145E−20 | −6.34084E−24 | 1.52607E−27 | −1.37322E−31 |
| M6 | 0.036824 | 3.42326E−11 | 2.29726E−16 | 2.03349E−21 | −7.23005E−26 | 5.58887E−30 | −1.95238E−34 | 2.71649E−39 |

Here, the condition's values of the projection optical elements of each embodiment are briefly shown in Table 14 about the projection optical systems 100F to 100L of the seventh to thirteenth embodiments. Referring Table 14, the above condition is met. The unit of Rsto, Rsto/NA, TT, SCA2 to SCA4 or SCA2 to SCA4/NA is [mm]. Of course, the unit may be [cm], [inch], [m] and [μm].

In addition, a value divided the above SCA2 to SCA4/NA by the overall length TT is defined. SCA2 to SCA4/NA/TT is preferably a value that is larger than 0.0600 and smaller than 0.0825 and is more preferably a value that is larger than 0.062 and smaller than 0.082. SCA2/NA/TT is preferably a value that is larger than 0.078 and smaller than 0.0825 and is more preferably a value that is larger than 0.080 and smaller than 0.0820. SCA3/NA/TT is preferably a value that is larger than 0.0600 and smaller than 0.0660 and is more preferably a value that is larger than 0.0630 and smaller than 0.0650. SCA4/NA/TT is preferably a value that is larger than 0.0630 and smaller than 0.0780 and is more preferably a value that is larger than 0.0720 and smaller than 0.0775.

quarter micron, and the present embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

Figure 7:
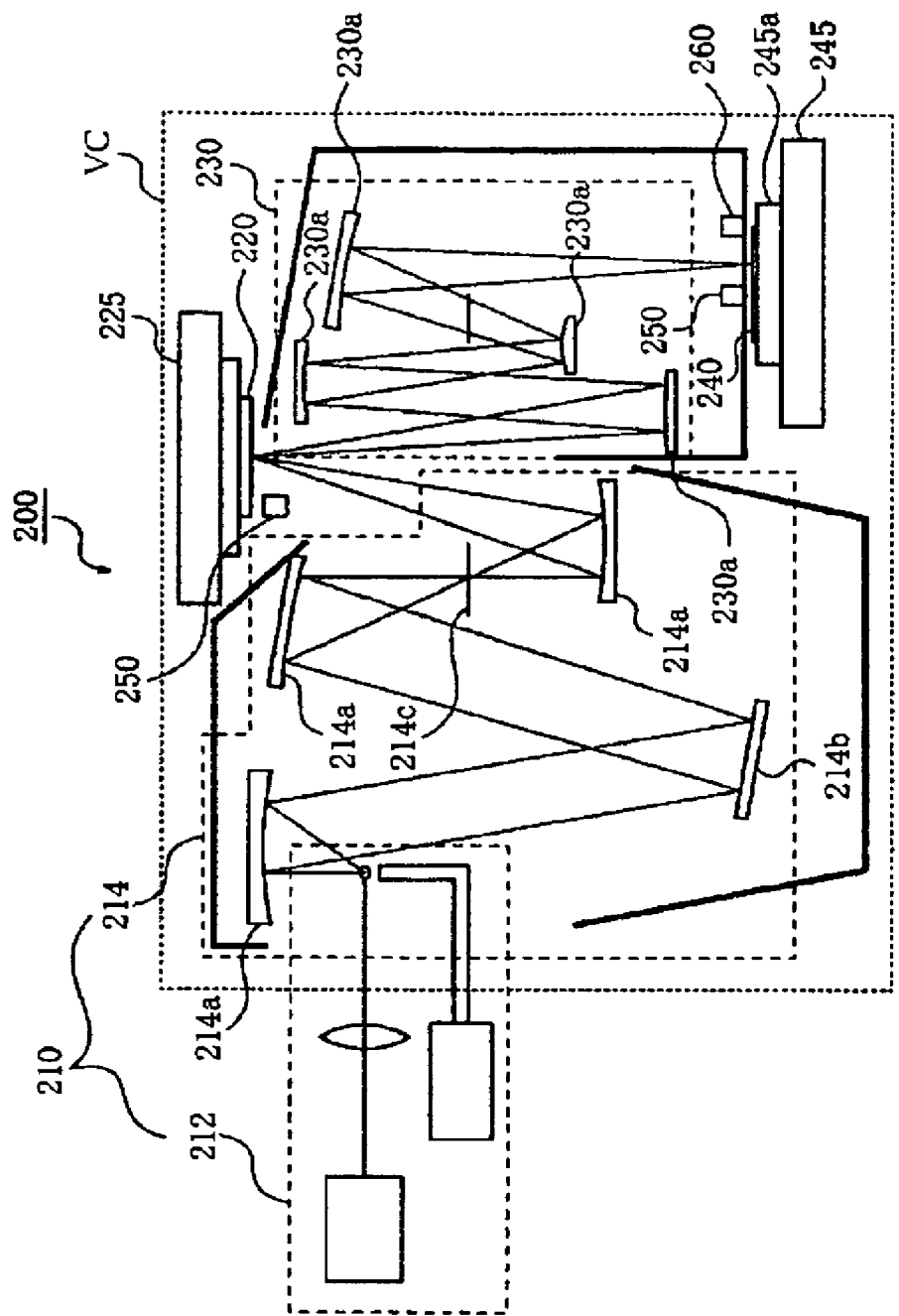
FIG. 7 is a schematic structure of an exposure apparatus according to one embodiment of the present invention.

Referring to FIG. 7, the exposure apparatus 200 includes an illumination apparatus 210 for illuminating the mask 220 using the light from a light source, a mask stage 225 that supports the mask 220, a projection optical system 230 (100, or the like) for introducing the light from the mask 220 into an object 240 to be exposed, a wafer stage 245 that supports the object 240, an alignment detection mechanism 250, and a focus position detection mechanism 260. Although FIG. 7 shows a four-mirror catoptric projection optical system from the mask to the object (wafer) for simplicity purposes, the

TABLE 14

| | SEVENTH EMBODIMENT | EIGHTH EMBODIMENT | NINTH EMBODIMENT | TENTH EMBODIMENT | ELEVENTH EMBODIMENT | TWELFTH EMBODIMENT | THIRTEENTH EMBODIMENT |
|---|---|---|---|---|---|---|---|
| Rsto(mm) | 32.5000 | 31.2300 | 30.4000 | 34.1600 | 37.5300 | 39.5000 | 33.6500 |
| NA | 0.2500 | 0.2370 | 0.2300 | 0.2800 | 0.3000 | 0.3200 | 0.2600 |
| TT(mm) | 1252.3840 | 1267.0460 | 1268.5130 | 1197.8000 | 1217.0300 | 1177.1300 | 1231.8000 |
| Rsto/NA(mm) | 130.0000 | 131.7722 | 132.1739 | 122.0000 | 125.1000 | 123.4375 | 129.4231 |
| Rsto/NA/TT | 0.1038 | 0.1040 | 0.1042 | 0.1019 | 0.1028 | 0.1049 | 0.1051 |
| SCA2(mm) | 25.2300 | 24.4550 | 23.9300 | 26.4450 | 28.8450 | 30.6700 | 26.0550 |
| SCA2/NA(mm) | 100.9200 | 103.1857 | 104.0435 | 94.4464 | 96.1500 | 95.8438 | 100.2115 |
| SCA2/NA/TT | 0.0806 | 0.0814 | 0.0820 | 0.0788 | 0.0790 | 0.0814 | 0.0814 |
| SCA3(mm) | 19.8000 | 19.4900 | 19.1350 | 20.2800 | 22.9900 | 23.9700 | 20.6750 |
| SCA3/NA(mm) | 79.2000 | 82.2363 | 83.1957 | 72.4286 | 76.6333 | 74.9083 | 79.5192 |
| SCA3/NA/TT | 0.0632 | 0.0649 | 0.0656 | 0.0605 | 0.0630 | 0.0636 | 0.0646 |
| SCA4(mm) | 22.5700 | 22.7550 | 22.5000 | 21.2150 | 24.5200 | 25.0950 | 23.7450 |
| SCA4/NA(mm) | 90.2800 | 96.0127 | 97.8261 | 75.7679 | 81.7333 | 78.4219 | 91.3269 |
| SCA4/NA/TT | 0.0721 | 0.0758 | 0.0771 | 0.0633 | 0.0672 | 0.0666 | 0.0741 |

Fourteenth Embodiment

A description will now be given of an exposure apparatus 200 that includes the projection optical system 100, 100A, 100B, 100C, 100D, 100E, 100F, 100G, 100H, 100I, 100J, 100K or 100L of the first to thirteenth embodiments, with reference to FIG. 7. Here, FIG. 7 is a schematic structure of the exposure apparatus 200 according to one aspect of the present invention.

The exposure apparatus 200 uses EUV light (with a wavelength, for example, of 13.5 nm) as illumination light for exposure, and exposes onto the plate 240 a circuit pattern created on a mask 220, for example, in a step-and-scan manner or step-and-repeat manner. This exposure apparatus is suitable for a lithography process less than submicron or number of reflective surfaces in the catoptric projection optical system is preferably six as in the above first to thirteenth embodiments. Of course, the number of mirrors is variable within a scope of the present invention.

At least the optical path through which the EUV light travels is preferably be maintained in a vacuum atmosphere VC, although not shown in FIG. 7, since the EUV light has low transmittance for air and the residue gas (such as polymer organic gas) causes contaminations.

The illumination apparatus 210 uses the EUV light (with a wavelength, for example, of 13.4 nm) of an arc shape corresponding to an arc field of the projection optical system 230 to illuminate the mask 220, and includes an EUV light source 212 and an illumination optical system 214.

The EUV light source 210 uses, for example, a laser plasma light source. The laser plasma light source irradiates a highly intensified pulse laser beam to a target material put in vacuum, thus generating high-temperature plasma for use as EUV light with a wavelength of about 13 nm emitted from this. The target material may use a metallic thin film, inert gas, and droplets, etc. The pulse laser preferably has high repetitive frequency, e.g., usually several kHz, for increased average intensity of the emitted EUV light.

The illumination optical system 214 includes a condenser mirror 214a, and an optical integrator 214b. The condenser mirror 214a serves to collect the EUV light that is isotropically irradiated from the laser plasma. The optical integrator 214b serves to uniformly illuminate the mask 220 with a predetermined NA. The illumination optical system 214 further includes an aperture 214c to limit an illumination area to an arc shape at a position conjugate with the mask 220. The illumination optical system 214 may further include a cooling apparatus for cooling the optical elements, such as the condenser mirror 214a and the optical integrator 214b. The cooling apparatus cools the condenser mirror 214a and optical integrator 214b, and prevents deformation due to the thermal expansion for excellent imaging performance.

The mask 220 is a reflection mask that forms a circuit pattern or image to be transferred, and supported and driven by the mask stage 225. The diffracted light from the mask 220 is reflected by the projection optical system 230 (100 etc.) discussed in the first to sixth embodiments and projected onto the object 240. The mask 220 and the object 240 are arranged optically conjugate with each other. The exposure apparatus 200 is a step-and-scan exposure apparatus, and projects a reduced size of the pattern on the mask 220 on the object 240 by scanning the mask 220 and the object 240.

The mask stage 225 supports the mask 220 and is connected to a moving mechanism (not shown). The mask stage 225 may use any structure known in the art. A moving mechanism (not shown) may include a linear motor etc., and drives the mask stage 225 at least in an X direction and moves the mask 220. The exposure apparatus 200 synchronously scans the mask 220 or the object 240.

The projection optical system 230 uses plural multilayer mirrors 230a to project a reduced size of a pattern formed on the mask 220 onto the object 240. The number of mirrors 230a is six or more. For wide exposure area with the small number of mirrors, the mask 220 and object 240 are simultaneously scanned to transfer a wide area that is an arc-shaped area or ring field apart from the optical axis by a predetermined distance. The projection optical system 230 has a NA of about 0.2 to 0.3. A cooling apparatus can cool an optical element in the projection optical system 230 such as the mirror 230a. The cooling apparatus cools the mirror 230a, and prevents deformation due to the thermal expansion for excellent imaging performance.

The instant embodiment uses a wafer as the object 240 to be exposed, but it may include a liquid crystal plate and a wide range of other objects to be exposed. A photoresist is applied onto the object 240.

The wafer stage 245 holds the object 240 by a wafer chuck 245a. The wafer stage 245 moves the object 240, for example, using a linear stage in XYZ directions. The mask 220 and the object 240 are synchronously scanned. The positions of the mask stage 225 and wafer stage 245 are monitored, for example, by a laser interferometer, and driven at a constant speed ratio.

The alignment detection mechanism 250 measures a positional relationship between the position of the mask 220 and the optical axis of the projection optical system 230, and a positional relationship between the position of the object 240 and the optical axis of the projection optical system 230, and sets positions and angles of the mask stage 225 and the wafer stage 245 so that a projected image of the mask 220 may be positioned in place on the object 240.

A focus position detection mechanism 260 measures a focus position on the object 240 surface, and its control over positions and angles of the wafer stage 245 always maintain the object 240 surface at an imaging position of the projection optical system 230 during exposure.

In exposure, the EUV light emitted from the illumination apparatus 210 illuminates the mask 220, and images a pattern formed on the mask 220 onto the object 240 surface. The instant embodiment uses an arc or ring shaped image surface, scans the mask 220 and object 240 at a speed ratio corresponding to a reduction ratio to expose the entire surface of the mask 220.

As the optical performance is sensitive to a surface shape of the optical element in the projection optical system in the exposure apparatus, the cooling apparatus is often used to cool an optical element in the projection optical system, in particular, an optical element at a mask side that receives much light intensity. Of course, it may be used for the illumination optical system. In particular, the reflective optical element closest to a light source receives a large amount of light among the optical elements, generates the large absorbed heat value inevitably, and the absorbed heat value deforms the shape of the optical element. In order to prevent these problems, the above cooling apparatus prevents the temperature rise due to absorption of a large amount of light, and reduces a temperature difference in an a shape change of the optical element.

Figure 8:
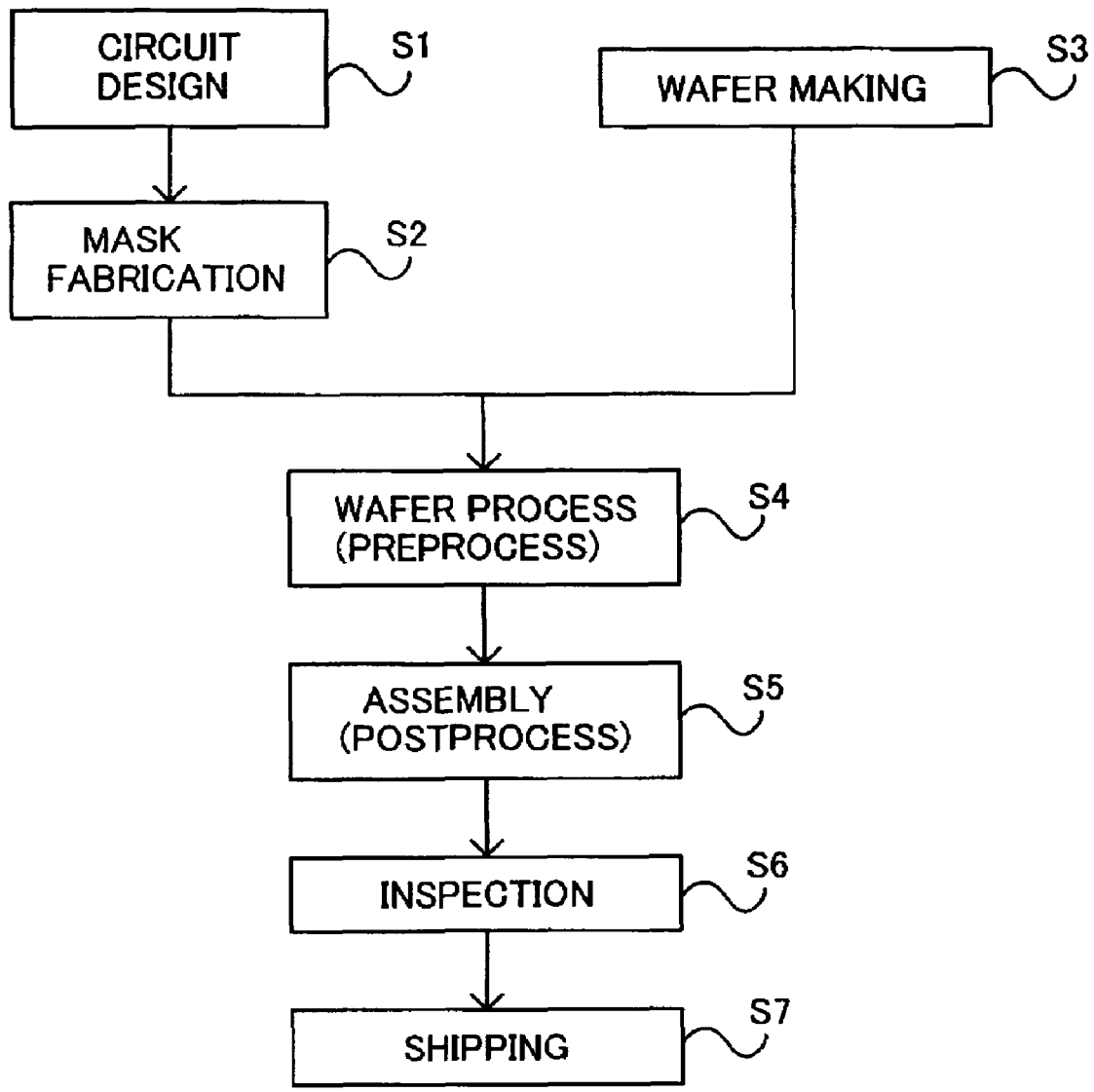
FIG. 8 is a flowchart for explaining a method for fabricating devices (semiconductor chips such as ICs, LSIs, and the like, LCDs, CCDS, etc.).
Figure 9:
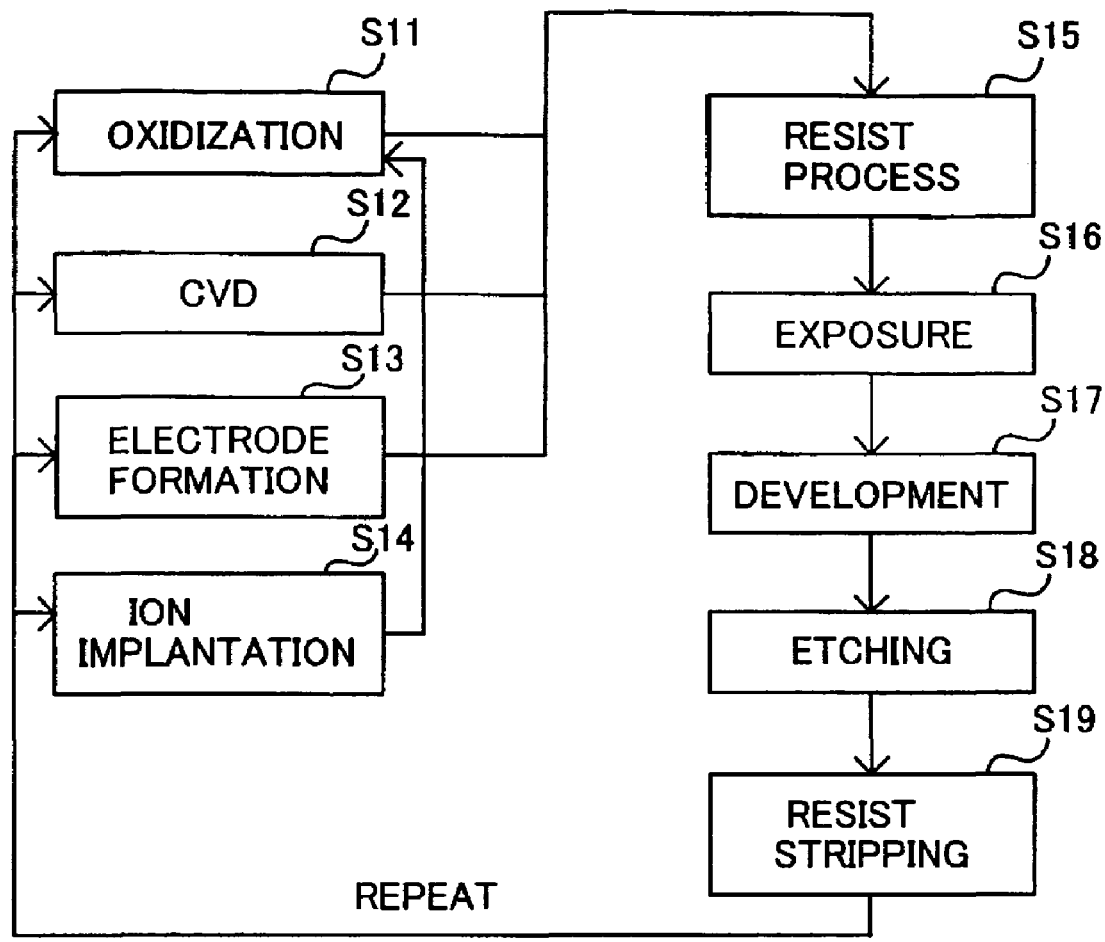
FIG. 9 is a detailed flowchart for Step 4 of wafer process shown in FIG. 8.

Referring to FIGS. 8 and 9, a description will now be given of an embodiment of a device fabricating method using the above exposure apparatus 200. FIG. 8 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 9 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus 200, and the devices as finished goods also constitute one aspect of the present invention.

Further, the present invention is not limited to these preferred embodiments, and various variations and modifications may be made without departing from the scope of the present invention. For example, the cooling apparatus is applicable to an optical element including a mask and a wafer for non-EUV, ultraviolet light with a wavelength of 200 nm or smaller, such as ArF excimer laser and $F_2$ excimer laser.

Thus, the instant embodiments can provide a projection optical system that has a reduced incident angle and a reduced mirror's maximum effective diameter, and maintains an appropriate divergence of the light on the mirror, an exposure apparatus having the projection optical system, and a device fabrication method using the exposure apparatus.

This application claims a foreign priority based on Japanese Patent Applications Nos. 2003-310118, filed on Sep. 2, 2003, 2005-056702, filed on Mar. 1, 2005 and 2005-056703, filed on Mar. 1, 2006, each of which is hereby incorporated by reference herein in its entirety as if fully set forth herein.

What is claimed is:

1. A projection optical system for projecting a pattern on an object surface onto an image surface in a reduced size, said projection optical system comprising six reflective surfaces that include, in order of reflecting light from the object surface, a first reflective surface, a second convex reflective surface, a third convex reflective surface, a fourth reflective surface, a fifth reflective surface and a sixth reflective surface, and an aperture stop along an optical path between the first and second reflective surfaces, wherein an intermediate image is formed along the optical path from the fourth reflective surface to the fifth reflective surface, and wherein the third reflective surface is arranged in a position closer to the object surface than the first reflective surface.

2. A projection optical system according to claim 1, wherein the first reflective surface has a concave shape.

3. A projection optical system according to claim 1, wherein the fourth reflective surface has a concave shape.

4. A projection optical system according to claim 1, wherein $25° < \theta_{max} + \Delta\theta < 35°$ is met, where $\theta_{max}$ is a maximum incident angle on one of the six reflective surfaces, and $\Delta\theta$ is an incident angle distribution width on the one of the six reflective surfaces, said one having the largest maximum value of a light incident angle.

5. A projection optical system according to claim 4, wherein $\theta_{max} + \Delta\theta < 32°$ is met.

6. A projection optical system according to claim 1, wherein a maximum incident angle at each point on a nodal line has an extreme in a region between Lmin+0.3×(Lmax−Lmin) and Lmax on the nodal line, the nodal line being formed between a light incident area upon which the light from an arc illuminated area on the object surface is incident, and a plane that includes a center point of a chord of the arc illuminated area shape on the object surface and an optical axis, the light incident area being located on one of the six reflective surfaces, which one has the largest maximum value of a light incident angle, where Lmin is a minimum value of a distance from the optical axis to each point on the nodal line, and Lmax is a maximum value of the distance from the optical axis to each point on the nodal line.

7. A projection optical system according to claim 1, wherein one of the six reflective surfaces, which one has the largest maximum value of a light incident angle, has a convex shape for receiving convergent light and reflects divergent light.

8. A projection optical system according to claim 1, wherein a difference is 30 mm or longer between a maximum distance and a minimum distance between an optical axis and a light incident area on the fourth reflective surface, upon which light emitted from a center of a nodal line is incident, the nodal line being formed between a plane that includes a center of an arc illuminated area on the object surface and the optical axis, and the illuminated area.

9. A projection optical system according to claim 1, wherein a surface apex is defined, with respect to each of the six reflective surfaces, as one of intersecting points between an optical axis and an approximately spherical surface, which one is closest to a reflection point of the light on each of the six reflective surfaces, the approximately spherical surface having a center that is defined as a center of curvature of each of the six reflective surfaces, and a radius that is defined as a radius of curvature of each of the six reflective surfaces, and wherein the surface apexes of the six reflective surfaces are arranged in order of the fourth reflective surface, the second reflective surface, the third reflective surface, the first reflective surface, the sixth reflective surface and the fifth reflective surface in order from the object surface to the image surface along an optical axis.

10. A projection optical system according to claim 1, wherein a surface apex is defined, with respect to each of the six reflective surfaces, as one of intersecting points between an optical axis and an approximately spherical surface, which one is closest to a reflection point of the light on each of the six reflective surfaces, the approximately spherical surface having a center that is defined as a center of curvature of each of the six reflective surfaces, and a radius that is defined as a radius of curvature of each of the six reflective surfaces, and wherein a distance is 250 mm or longer between the object surface and one of the surface apexes of the six reflective surfaces, which one is the closest to the object surface among the six reflective surfaces.

11. A projection optical system according to claim 1, wherein a surface apex is defined, with respect to each of the six reflective surfaces, as one of intersecting points between an optical axis and an approximately spherical surface, which one is closest to a reflection point of the light on each of the six reflective surfaces, the approximately spherical surface having a center that is defined as a center of curvature of each of the six reflective surfaces, and a radius that is defined as a radius of curvature of each of the six reflective surfaces, and wherein $La11/200 < L24 < La11/10$ is met, where L24 is an interval between the surface apex of the second reflective surface and the surface apex of the fourth reflective surface, and La11 is a distance between the object surface and the image surface along the optical axis.

12. A projection optical system according to claim 1, wherein a surface apex is defined, with respect to each of the six reflective surfaces, as one of intersecting points between an optical axis and an approximately spherical surface, which one is closest to a reflection point of the light on each of the six reflective surfaces, the approximately spherical surface having a center that is defined as a center of curvature of each of the six reflective surfaces, and a radius that is defined as a radius of curvature of each of the six reflective surfaces, and wherein $La11/20 < L6 < La11/6$ is met, where L6 is an interval between the surface apex of the sixth reflective surface and the surface apex of the reflective surface that is closest to the sixth reflective surface, and La11 is a distance between the object surface and the image surface along the optical axis.

13. A projection optical system according to claim 1, wherein an absolute value of a radius of curvature of the second reflective surface is 1800 mm or smaller.

14. A projection optical system according to claim 1, wherein an intermediate image of the pattern on the object surface is formed between two adjacent reflective surfaces along the optical path of the light among the six reflective surfaces, and located apart from each of the two adjacent reflective surfaces by Lim×0.35 or greater, where Lim is an optical path length between the two adjacent reflective surfaces.

15. A projection optical system according to claim 1, wherein the aperture stop is located between the first and second reflective surfaces, and located apart from each of the first and second reflective surfaces by Lst/10 or greater, where Lst is an optical path length between the first and second reflective surfaces.

16. A projection optical system according to claim 1, wherein the aperture stop is located on the optical path between the first and second reflective surfaces.

17. A projection optical system according to claim 1, wherein the six reflective surfaces are located between the object surface and the image surface.

18. An exposure apparatus comprising:
an illumination optical system for illuminating a pattern on an object surface using light from a light source; and
a projection optical system according to claim 1 for projecting the pattern on the object surface onto an image surface in a reduced size.

19. A device fabricating method comprising the steps of:
exposing an object using an exposure apparatus; and
developing the object that has been exposed,
wherein said exposure apparatus includes:
an illumination optical system for illuminating a pattern on an object surface using light from a light source; and
a projection optical system according to claim 1 for projecting the pattern on the object surface onto an image surface in a reduced size.

* * * * *